(12) United States Patent
Ooishi

(10) Patent No.: US 6,608,772 B2
(45) Date of Patent: Aug. 19, 2003

(54) LOW-POWER SEMICONDUCTOR MEMORY DEVICE

(75) Inventor: Tsukasa Ooishi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/230,213

(22) Filed: Aug. 29, 2002

(65) Prior Publication Data

US 2003/0002315 A1 Jan. 2, 2003

Related U.S. Application Data

(63) Continuation of application No. 09/976,049, filed on Oct. 15, 2001, now Pat. No. 6,449,182.

(30) Foreign Application Priority Data

Jan. 17, 2001 (JP) ........................................ 2001-008609

(51) Int. Cl.$^7$ ................................................. G11C 5/06
(52) U.S. Cl. ........................ 365/63; 365/149; 365/190; 365/208
(58) Field of Search .......................... 365/63, 149, 207, 365/208, 222, 230.03, 190

(56) References Cited

U.S. PATENT DOCUMENTS

| | | | |
|---|---|---|---|
| 5,243,558 A | 9/1993 | Saeki | 365/182 |
| 5,761,109 A | 6/1998 | Takashima et al. | 365/63 |
| 5,953,275 A | 9/1999 | Sugibayashi et al. | 365/207 |
| 5,970,010 A | 10/1999 | Hira et al. | 365/226 |
| 6,243,308 B1 * | 6/2001 | Lin | 365/63 |
| 6,304,479 B1 * | 10/2001 | Vollrath et al. | 365/63 |

FOREIGN PATENT DOCUMENTS

JP    3-50866    3/1991

* cited by examiner

Primary Examiner—Son Mai
(74) Attorney, Agent, or Firm—McDermott, Will & Emery

(57) ABSTRACT

Sense amplifiers are alternately disposed on both sides of bit line pairs, switch circuits are provided so as to selectively connect two bit lines to a sense amplifier, and connection between a sense amplifier and a bit line is switched in accordance with an operation mode. Memory cells are disposed in rows and columns to satisfy the condition that the memory cells are arranged every other row in the same column. A low-power semiconductor memory device with improved access efficiency is provided due to selective activation of the sense amplifiers for reducing the number of the sense amplifiers activated at a time.

2 Claims, 25 Drawing Sheets

F I G. 9
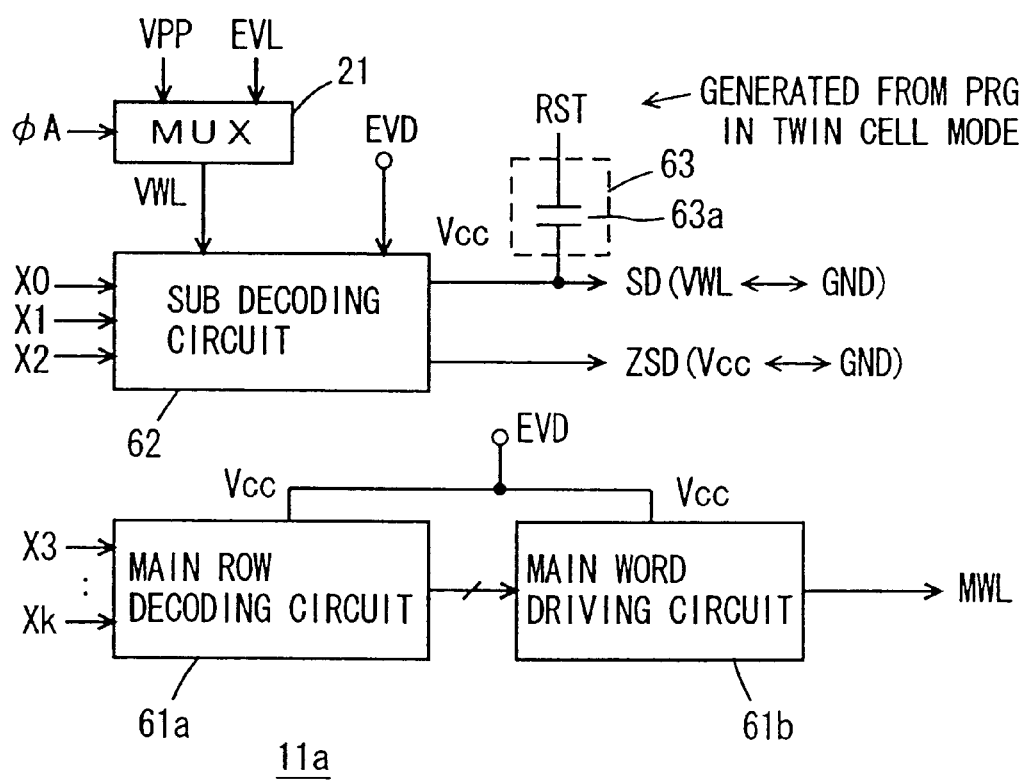

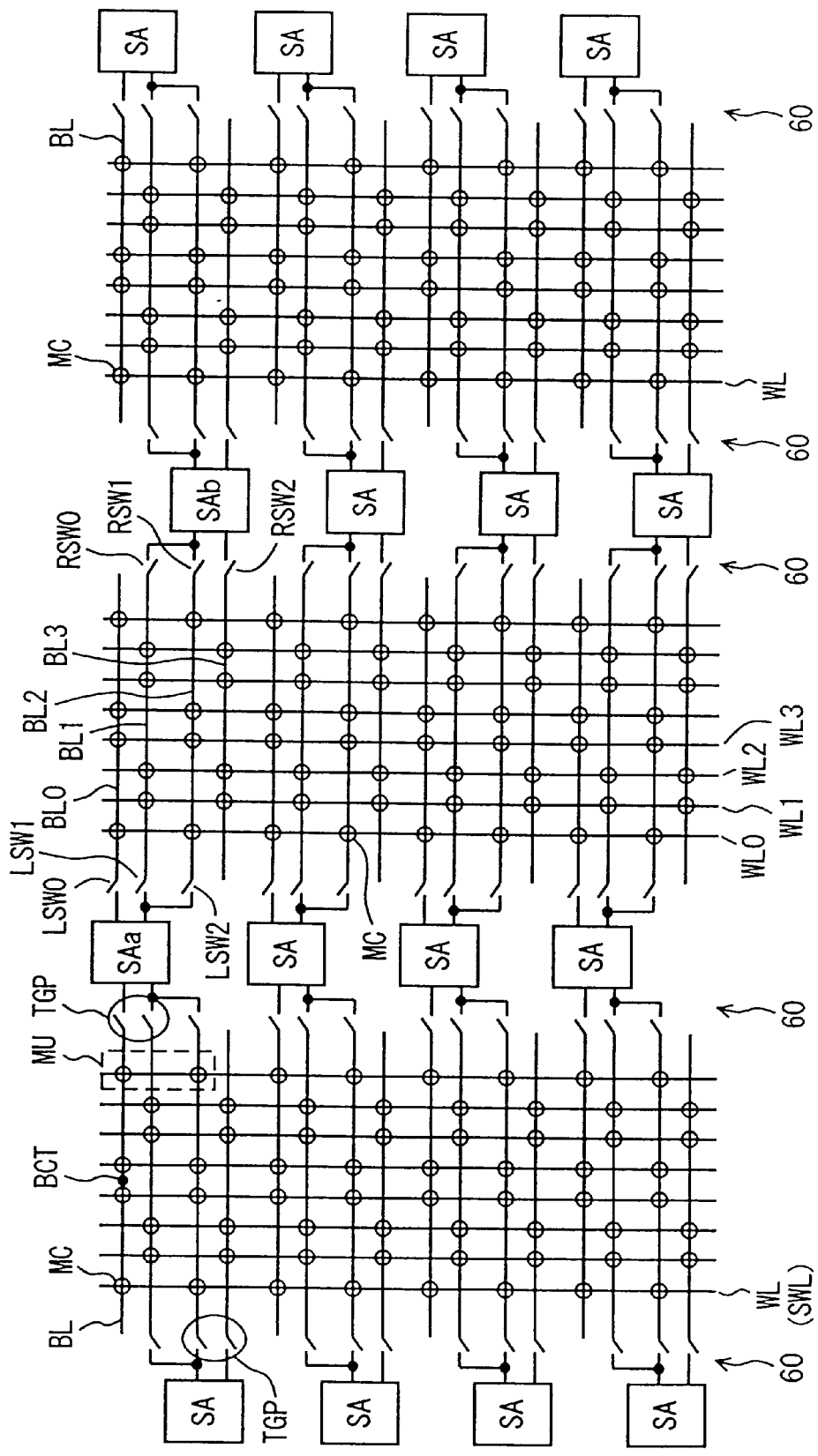
F I G. 1 1

DATA ACCESS
: IDENTIFY POSITION
ALTERNATE BY RFGON

US 6,608,772 B2

LOW-POWER SEMICONDUCTOR MEMORY DEVICE

RELATED APPLICATION

This application is a continuation of U.S. patent application Ser. No. 09/976,049, filed Oct. 15, 2001 now U.S. Pat. No. 6,449,182.

BACKGROUND OF THE INVENTION

1. Field of the Invention

The present invention relates to a semiconductor memory device and, more particularly, to a dynamic semiconductor memory device having information stored in the form of charges in a capacitor.

2. Description of the Background Art

A system LSI (Large-Scale Integrated circuit) is an integrated circuit device in which a logic and a memory are integrated on a single die (chip) to form a system. In the system LSI, memories such as an SRAM (Static Random Access Memory), a DRAM (Dynamic Random Access Memory), and a flash EEPROM (Electrically Erasable Programmable ROM) are used according to application purposes.

Since an SRAM statically operates and therefore operates at high speed, it is generally used for high speed processing.

In a DRAM, a memory cell is constructed by one transistor and one capacitor, so that the layout area of a memory cell is small. The DRAM is therefore generally used for a large storage capacity application.

A flash EEPROM can store information in a nonvolatile manner and is generally used in an application requiring to store information even when the power is shut down.

In an SRAM, a memory cell is constructed by a flip flop. When a power voltage is lowered for lower power consumption and higher processing speed, the threshold voltage of an MOS transistor (insulated gate field effect transistor) used for a memory cell has to be lowered in absolute value, so that a sub-threshold leak current increases. Consequently, a leak current in a standby mode becomes large, and the specification condition of a small current consumption in the standby mode, which is required for a portable equipment or the like cannot be satisfied.

In a DRAM, operating conditions required for a memory array section and those for a peripheral circuit section are different from each other. Usually, the level of a power source voltage in the memory array section and that in the peripheral circuit section are different from each other. The memory array section requires voltages of different levels, such as a power source voltage (sense power source voltage) supplied to a sense amplifier for sensing and amplifying memory cell data, a negative substrate bias voltage for biasing the substrate region of a memory array, a high voltage transmitted onto a selected word line to prevent a loss by a threshold voltage of an access transistor, and an intermediate voltage for precharging a bit line. The voltages of different levels have to be internally generated, so that the current is additionally consumed to generate those internal voltages. A problem of large current consumption arises. For example, in the case of generating a high voltage through a charge pumping operation, the pump efficiency is lower than 1. In order to generate a high voltage of a necessary level, a current larger than a current consumed by a circuit using the high voltage has to be consumed to generate the high voltage.

Besides, the DRAM has to perform a refreshing operation of periodically restoring stored data. In the standby mode in a portable equipment or the like requiring ultra-low current consumption, therefore, a refresh current is consumed, and the specification of the ultra-low current consumption cannot be satisfied.

There is a problem such that current consumption in the DRAM is large, and a specification value of a low current consumption required for a portable equipment or the like cannot be sufficiently achieved.

SUMMARY OF THE INVENTION

An object of the present invention is to provide a semiconductor memory device achieving low current consumption in a standby mode without exerting an adverse influence on access operation.

Another object of the present invention is to provide a semiconductor memory device consuming a small current in the standby mode, suited for a system LSI.

A semiconductor memory device according to the invention includes: a plurality of memory cells arranged in a matrix of rows and columns; a plurality of bit lines, arranged in correspondence to the columns of the memory cells, each having the memory cells in a corresponding column connected; a plurality of word lines, arranged in correspondence to rows of the memory cells, each having the memory cells in a corresponding row connected; a plurality of first sense amplifiers each disposed in correspondence to a set of a predetermined number of bit lines, for sensing and amplifying data of the memory cells in the corresponding column when activated; a plurality of first transfer gates each disposed in correspondence to each of the bit lines, for connecting a corresponding bit line and the first sense amplifier when made conductive; and connection control circuitry for selectively making the plurality of first transfer gates conductive in response to an operation mode instruction signal.

By switching connection between a bit line and a sense amplifier according to an operation mode, the data storing form can be switch between a one-bit-per-cell (1 bit/cell) mode and a one-bit-per-two-cells (1 bit/2 cells) mode. In the case of storing data in the one-bit-per-cell mode, the device can operate in a manner similar to a normal DRAM. In the case of the one-bit-per-two-cells mode, complementary data is read onto a pair of bit lines. Consequently, a read voltage sensed and amplified by a sense amplifier is made large. Even when charges flow out from a memory cell capacitor due to a leak current, data can be satisfactory sensed and amplified, and a refresh interval can be made longer. Therefore, by using the one-bit-per-two-cells mode in the standby mode, the current amount consumed for the refreshing operation in the standby mode can be reduced. Thus, the current in the standby mode can be reduced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 9 is a diagram schematically showing the configuration of a portion related to selection of a row in the semiconductor memory device according to the present invention;

FIG. 11 is a diagram schematically showing the connection between a bit line and a sense amplifier in the semiconductor memory device according to the present invention;

DESCRIPTION OF THE PREFERRED EMBODIMENTS

First Embodiment

Figure 1:
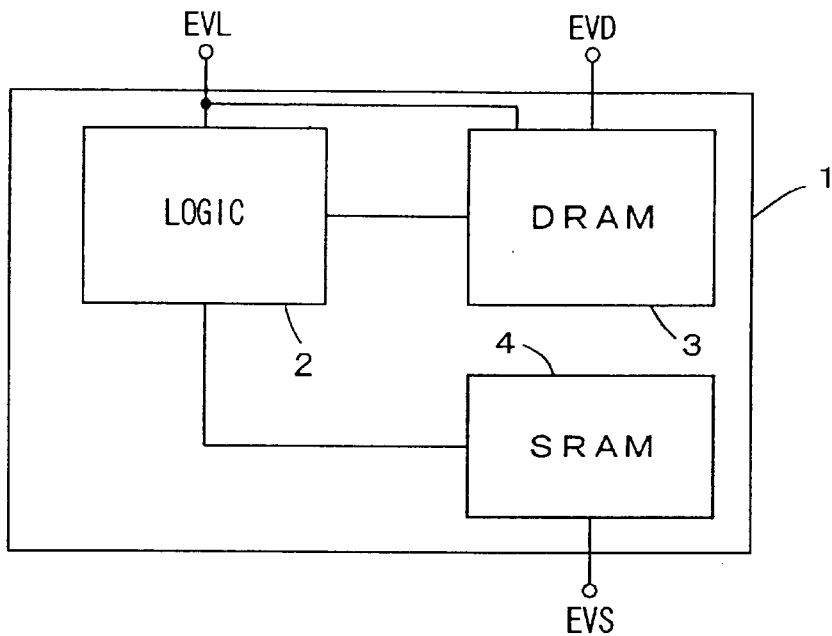
FIG. 1 is a diagram schematically showing the configuration of a whole semiconductor integrated circuit device to which the invention is applied.

FIG. 1 is a diagram schematically showing the configuration of a whole semiconductor integrated circuit device containing a semiconductor memory device according to a first embodiment of the present invention. In FIG. 1, a semiconductor integrated circuit device 1 includes a logic 2 for processing data, a DRAM 3 serving as a main storage for the logic 2, and an SRAM 4 for storing program instructions and/or data for the logic 2.

A logic power source voltage EVL is applied to the logic 2, the logic power source voltage EVL and a DRAM power source voltage EVD are applied to the DRAM 3, and an SRAM power source voltage EVS is applied to the SRAM 4.

The semiconductor integrated circuit device 1 is a system LSI, the DRAM 3 includes a plurality of memory devices, and the SRAM 4 includes a high-speed memory device of a small storage capacity and a low power consumption memory device of a small storage capacity depending on its application.

The logic power source voltage EVL is a voltage lower than the DRAM power source voltage EVD. The logic 2 includes a MOS transistor of a low threshold voltage as a component and operates at high speed. In the SRAM 4, the low power consumption memory device has a high threshold voltage MOS transistor used for a memory cell of the memory device and has a small leak current in the standby mode. In the SRAM 4, a high speed memory unit has a low threshold voltage MOS transistor used for a memory cell for high speed operation and has a large leak current in the standby mode.

The DRAM 3 receives the logic power source voltage EVL and the DRAM power source voltage EVD as operation power source voltages, and adjusts the level of a voltage generated internally in accordance with an operation mode, thereby reducing the current consumption and achieving high speed operation.

Figure 2:
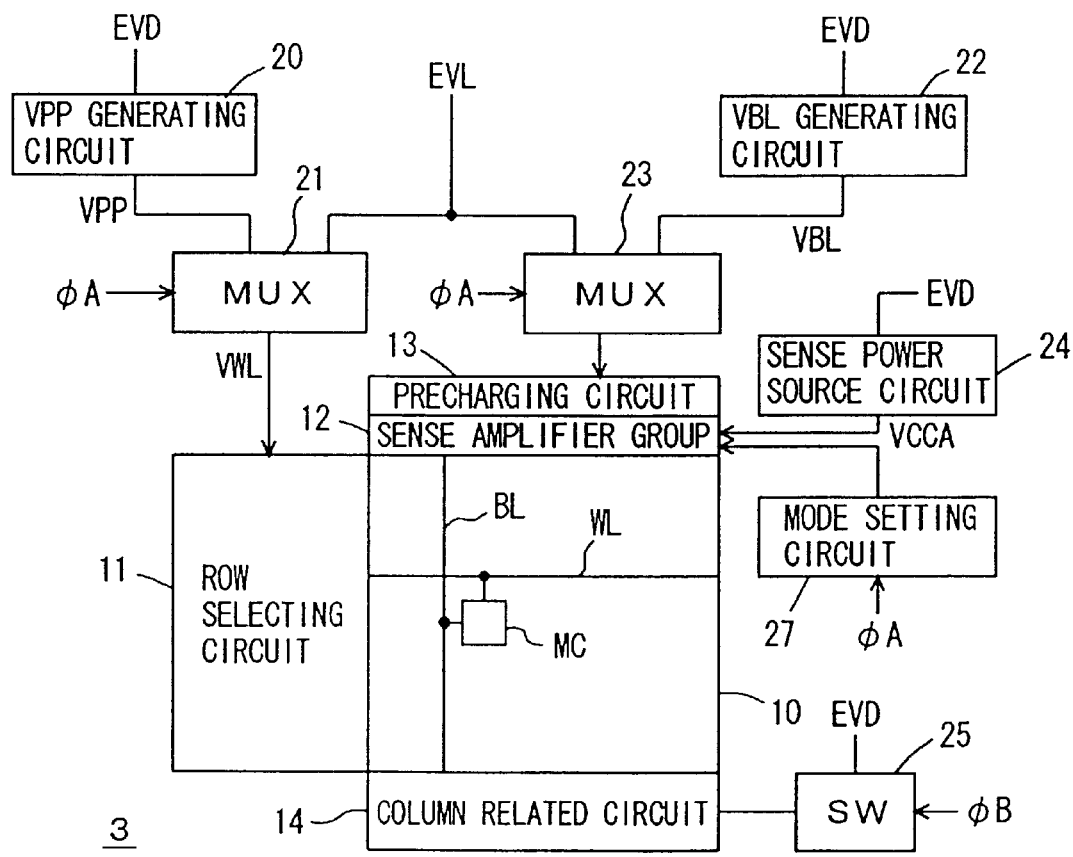
FIG. 2 is a diagram schematically showing the configuration of a whole semiconductor memory device according to the invention.

FIG. 2 is a diagram schematically showing the configuration of the whole DRAM 3 shown in FIG. 1. In FIG. 2, the DRAM 3 includes a memory cell array 10 having a plurality of memory cells MC arranged in a matrix of rows and columns. The memory cell array 10 is provided with word lines WL disposed in correspondence to rows of the memory cells MC and bit lines BL arranged in correspondence to columns of the memory cells MC.

The DRAM 3 further includes: a row selecting circuit 11 for driving a word line corresponding to an addressed row in the memory cell array 10 into a selected state; a sense amplifier group 12 having a plurality of sense amplifiers for sensing and amplifying data in memory cells read out onto the bit lines BL; a precharging circuit 13 for precharging a bit line BL to a predetermined voltage level in the standby mode; and a column related circuit 14 for selecting an addressed column in the memory array 10 and accessing data (writing/reading data) in a data access.

In the memory cell array 10, a predetermined layout pattern satisfying, at the minimum, the condition that the memory cells MC are disposed every other column in the row direction is repeated in the row and column directions. The memory cell MC includes one transistor and one capacitor.

The DRAM 3 further includes: a VPP generating circuit 20 for generating a high voltage VPP from the DRAM power source voltage EVD through, for example, a charge pumping operation; a switching circuit (MUX) 21 for selecting one of the logic power source voltage EVL and the high voltage VPP in accordance with a control signal φA and applying the selected one as a word line driving voltage to the row selecting circuit 11; a VBL generating circuit 22 for generating an intermediate voltage VBL from the DRAM power source voltage EVD; a switching circuit (MUX) 23 for selecting one of the logic power source voltage EVL and the intermediate voltage VBL in accordance with the control signal φA and applying the selected one to the precharging circuit 13; a sense power source circuit 24 for generating a sense power source voltage VCCA by down converting the DRAM power source voltage EVD for application to the sense amplifier group 12; a switch circuit (SW) 25 for interrupting transmission of the DRAM power source voltage EVD to the column related circuit 14 in accordance with a control signal φB; and a mode setting circuit 27 for setting a connection manner between a sense amplifier included in the sense amplifier group 12 and a bit line BL in accordance with the control signal φA.

The high voltage VPP is at a voltage level higher than that of the sense power source voltage VCCA, and a voltage VWL selected by the switching circuit 21 is transmitted to a selected word line in the memory cell array 10. The intermediate voltage VBL is, generally, at a voltage level of half the sense power source voltage VCCA, and is transmitted to the bit line BL via the precharging circuit 13 in the standby mode. The intermediate voltage VBL may also be applied to a cell plate of a memory cell capacitor.

The mode setting circuit 27 switches the connection between a sense amplifier included in the sense amplifier group 12 and a corresponding bit line BL as follows. The DRAM 3 operates in a one-bit-per-cell mode (single cell mode) of storing information of one bit by one memory cell MC and a one-bit-per-two-cells mode (twin cell mode) of storing information of one bit by two memory cells (memory unit). In the single cell mode, the bit lines are selected to be connected to a corresponding sense amplifier such that in a pair of bit lines BL connected to a sense amplifier, memory cell data is read out to one of the bit lines, and the other bit line is maintained at the precharged voltage level.

In the twin cell mode, the pairs of bit lines are selected to corresponding sense amplifiers such that memory cells are connected to both the bit lines of a bit line pair connected to the corresponding sense amplifier. Specifically, complementary data are stored in the memory unit and are transmitted to the pair of bit lines connected to the sense amplifier. In the twin cell mode, only the sense amplifier corresponding to the bit lines to which the memory cells are connected is activated. Since the memory cells MC are arranged every other column in the row direction, the number of sense amplifiers which are made active in the twin cell mode is halved, thereby reducing a bit line charging/discharging current and reducing the current consumption.

In the twin cell mode, since complementary data are stored in the memory unit, the complementary data are transmitted to a pair of bit lines. A read voltage transmitted to the sense amplifier therefore increases, a refresh interval can be made longer, and the current consumption in the standby mode can be reduced. In the case of performing sense operation with the read voltage similar to conventional one, the sense start timing can be advanced. Thus, high speed access is achieved.

When the control signal φB is made active, the switch circuit (SW) 25 interrupts the DRAM power source voltage EVD to be supplied to the column related circuit 14, to stop the operation of the column related circuit 14, for reducing the leak current in the column related circuit 14 and the consumption current. The operations of the circuits in accordance with the operation modes will be briefly described below.

1. Normal Operation Mode:

In the normal operation mode, as described above, the logic power source voltage EVL is externally applied to the logic 2, the external DRAM power source voltage EVD is applied to the DRAM 3, and the external SRAM power source voltage EVS is applied to the SRAM 4. In this state, the logic 2, DRAM 3, and SRAM 4 operate according to inherent intended purpose.

In the DRAM 3 in the normal operation, the VPP generating circuit 20 and VBL generating circuit 22 generate the high voltage VPP and the intermediate voltage VBL, respectively, from the DRAM power source voltage EVD. The switching circuits 21 and 23 select the high voltage VPP and the intermediate voltage VBL, respectively. In the memory cell array 10, therefore, the high voltage VPP is transmitted onto a selected word line.

The mode setting circuit 27 establishes the connection between a sense amplifier included in the sense amplifier group 12 and a bit line BL so as to operate in the single cell mode. The bit line BL is precharged and equalized to the intermediate voltage VBL level. The column related circuit 14 operates using the DRAM source voltage EVD as an operation power source voltage received via the switch circuit (SW) 25. The sense power source circuit 24 generates the sense power source voltage VCCA from the DRAM power source voltage EVD through a voltage down converting operation. An H level of data stored in the memory cell MC is therefore equal to the voltage level of the sense power source voltage VCCA.

2. DRAM Low Current Consumption Mode:

In the case of reducing the current consumption in an operation of the DRAM 3, for example, in the standby mode, a data retaining mode, or the like, the mode setting circuit 27 shown in FIG. 2 sets the connection between a sense amplifier included in the sense amplifier group 12 and a bit line BL so as to implement the twin cell mode. In this case, the number of memory cells to be connected to a word line WL selected by the row selecting circuit 11 is the same as that in the normal operation mode, that is, in the single cell mode. It is, however, unnecessary to charge/discharge a reference bit line in a precharged state, so that only the sense amplifier to which the memory unit is connected is made active. Consequently, the number of sense amplifiers to be activated is reduced to the half of that in the normal operation mode, thereby reducing the bit line charging/discharging current.

According to the control signal $\phi A$, the logic power source voltage EVL is selected by the switching circuits 21 and 23 and applied to the row selecting circuit 11 and the precharging circuit 13. The logic power source voltage EVL is therefore transmitted to a selected word line, and the bit lines BL in the standby mode are precharged and equalized to the level of the logic power source voltage EVL. The voltage level of the logic power source voltage EVL is lower than that of the sense power source voltage VCCA. The sense power source voltage VCCA from the sense power source circuit 24 is supplied to the sense amplifier group 12.

Since the logic power source voltage EVL is used in place of the high voltage VPP and the intermediate voltage VBL, an extra current consumption required to compensate for the current when the high voltage VBP and the intermediate voltage VBL are consumed can be reduced, and the current consumption can be reduced. The voltage generating operation of the VPP generating circuit 20 and the VBL generating circuit 22 is stopped in the DRAM low current consumption mode in response to the control signal $\phi A$, thereby reducing unnecessary current consumption.

3. Ultra-Low Standby Current Mode:

In the case of continuing a standby mode for a long time, as in a sleep mode, in order to reduce the leak current in the SRAM 4 while retaining data in the high speed memory device in the SRAM 4, the data to be retained in the SRAM 4 is transferred to the DRAM 3 and the SRAM 4 is powered off. Supply of the SRAM power source voltage EVS is interrupted, which is easily achieved by a switch.

In the DRAM 3, the switch circuit 25 is made non-conductive by the control signal $\phi B$ and the supply of the DRAM power source voltage EVD to the column related circuit 14 is stopped. In the ultra low standby current mode, the DRAM 3 is set in the self refresh mode, and the power source voltage is supplied only to circuits necessary for the refreshing operation. The state similar to that in the DRAM low current consumption mode is established in the DRAM 3. By using the logic power source voltage EVL as a peripheral power source voltage, the DRAM 3 operates in the twin cell mode and refreshes memory cell data.

The control signals $\phi A$ and $\phi B$ may be supplied from the logic 2 or generated in the DRAM 3 under the control of the logic 2. Specific configurations of parts in the DRAM 3 will now be described.

Figure 3:
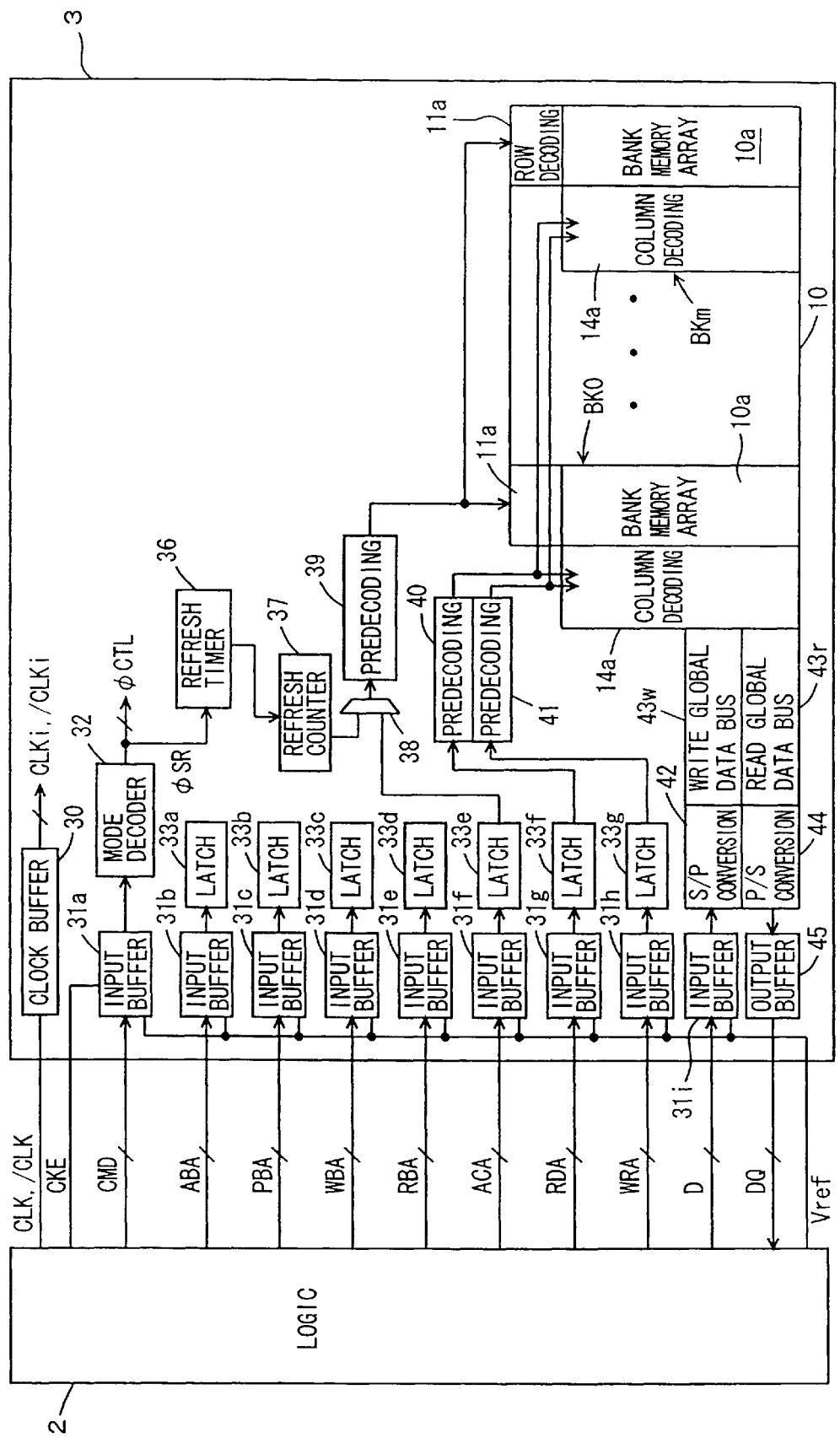
FIG. 3 is a diagram schematically showing the configuration of a memory array and peripheral circuitry of the semiconductor memory device according to the present invention.

FIG. 3 is a diagram more specifically showing the configurations of the memory cell array 10 and peripheral circuitry of the DRAM 3. In FIG. 3, the memory cell array 10 in the DRAM 3 is divided into a plurality of bank memory arrays 10a. The bank memory array 10a is provided for each of banks BK0 to BKm. Each of the banks BK0 to BKm includes a row decoding circuit 11a for selecting a row and a column decoding circuit 14a for selecting a column. Each of the banks BK0 to BKm can, independently of others, make memory cell row selection active or inactive. The row decoding circuit 11a is included in the row selecting circuit 11 shown in FIG. 2, and the column decoding circuit 14a is included in the column related circuit 14 shown in FIG. 2.

The DRAM 3 further includes: a clock buffer 30 for receiving complementary clock signals CLK and /CLK supplied from the logic 2 and generating complementary internal clock signals CLKi and /CLKi; and input buffers 31a to 31h for receiving a command CMD, an active bank address signal ABA, a precharge bank address signal PBA, a write bank address signal WBA, a read bank address signal RBA, an activate address signal ACA, a read address signal RDA, and a write address signal WRA, respectively, which are supplied from the logic 2.

The clock buffer 30 detects an edge (intersection point) of the complementary clock signals CLK and /CLK from the logic 2 and generates the complementary internal clock signals CLKi and /CLKi each having rising and falling edges synchronized with the detected edges.

Each of the input buffers 31a to 31h determines the level (H or L) of a supplied signal on the basis of a reference voltage Vref received from the logic 2. The command CMD is a signal for designating an operation mode. When a clock enable signal CKE is active, the input buffer 31a determines the command CMD being a valid command, takes in the command CMD, and generates an internal command. The active bank address signal ABA specifies a bank to be activated out of the banks BK0 to BKm. The precharge bank address signal PBA specifies a bank to be precharged out of the banks BK0 to BKm. The bank specified by the precharge bank address signal PBA sent together with a precharge command returns back to a precharged state under the control of control circuitry (not shown).

The write bank address signal WBA specifies a bank to which data is written. The read bank address signal RBA specifies a bank from which data is read. The write bank address signal WBA and the read bank address signal RBA are provided for the reason that, as will be described later, a data write path and a data read path are provided separately from each other. These bank address signals are supplied together with corresponding commands.

The active address signal ACA specifies an address of a word line to be selected in the bank memory array 10a. The read address signal RDA specifies a column from which data is read in a bank specified by the read bank address signal RBA. The write address signal WRA specifies a column to which data is written in a bank specified by the write bank address signal WBA.

The DRAM 3 further includes: a mode decoder 32 for generating an internal operation mode instruction signal φCTL in accordance with an internal command from the input buffer 31a; latches 33a to 33g provided in correspondence to the input buffers 31b to 31h, for latching signals applied from the input buffers 31b to 31h, respectively, synchronously with an internal clock signal; a refresh timer 36 for issuing a refresh request at predetermined intervals in response to a self refresh mode instruction signal φSR from the mode decoder 32; a refresh counter 37 for performing counting operation in response to the output signal of the refresh timer 36 and generating a refresh address signal for specifying a row to be refreshed; a selecting circuit 38 for selecting either an output count value of the refresh counter 37 or an active address signal from the latch 33e; a predecoding circuit 39 for predecoding an output signal from the selecting circuit 38 and supplying a resultant signal to the row decoding circuit 11a of the banks BK0 to BKm; a predecoding circuit 40 for predecoding the read address signal RDA from the latch 33f and supplying a resultant signal to the column decoding circuit 14a of the banks BK0 to BKm; and a predecoding circuit 41 for predecoding the write address signal WRA from the latch 33g and supplying a resultant signal to the column decoding circuit 14a of the banks BK0 to BKm.

The row decoding circuit 11a is made active when the activate bank address signal ABA designates a corresponding bank, decodes the predecoded signal from the predecoding circuit 39a, and drives a word line corresponding to the addressed row in the corresponding bank memory array 10a into a selected state.

The column decoding circuit 14a includes a column decoder for writing and a column decoder for reading. In a data reading mode, the column decoder for reading in the column decoding circuit 14a of a bank specified by the read bank address signal RBA is activated to decode a read predecoded signal from the predecoding circuit 40. In a data writing mode, the column decoder for writing in the column decoding circuit 14a of a bank specified by the write bank address signal WBA is activated to decode a write predecoded signal from the predecoding circuit 41, and selects a write column.

In a self refresh mode, refresh is performed according to a count value from the refresh counter 37. In the self refresh mode, refresh may be performed simultaneously in the banks BA0 to BKm or on a bank basis. When the refresh is executed on the bank basis, a count value of the refresh counter 37 is decoded to generate a refresh bank address signal. The bank address signal is decoded and then sent by the logic 2. The bank address signal is equivalent to a bank designation signal for designating a corresponding bank at the time of activation thereof.

The DRAM 3 further includes: a write global data bus 43w provided commonly for the banks BK0 to BKm for transmitting write data; a read global data bus 43r provided commonly for the banks BK0 to BKm for transmitting read data; an input buffer 31i for buffering write data D from the logic 2; a serial-to-parallel (S/P) converting circuit 42 for converting serial write data supplied from the input buffer 31i into parallel data and transferring the parallel data to the write global data bus 43w; a parallel-to-serial (P/S) converting circuit 44 for converting parallel data transmitted from the read global data bus 43r into serial data; and an output buffer 45 for buffering the serial data from the P/S converting circuit 44, generating read data DQ, and sending the read data DQ to the logic 2.

Data transfer between the logic 2 and the DRAM 3 is performed synchronously with the clock signals CLK (CLKi) and /CLK (/CLKi). When the operating frequency of the clock signals CLK and /CLK is higher than the internal operation speed of the DRAM 3 and therefore is higher than internal data transfer speed of the DRAM 3, by using the S/P converting circuit 42 and the P/S converting circuit 44, internal data access (data writing/reading) speed of the DRAM 3 is matched with transfer speed of the external data D and Q. For example, the S/P converting circuit 42 transfers data which is transferred synchronously with the rising and falling edges of the clock signal CLK to the write global data bus 43w synchronously with either the rising or falling edge of the clock signal CLK. The P/S converting circuit 44 transfers parallel data which is transferred synchronously with either the rising or falling edge of the internal clock signal CLK from the read global data bus 43r, synchronously with the rising and falling edges of the clock signal CLK.

Figure 4:
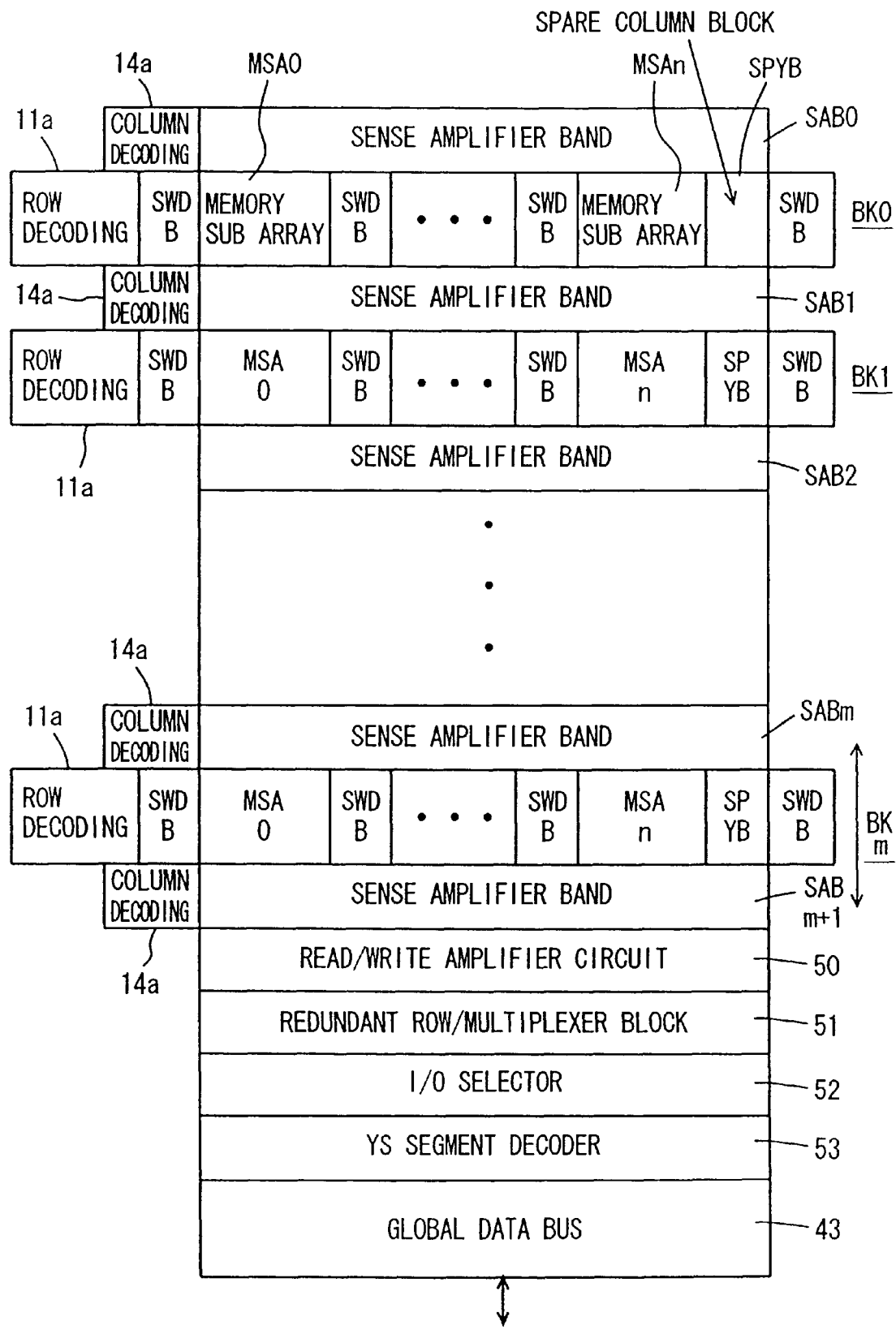
FIG. 4 is a diagram schematically showing the configuration of a memory array in the semiconductor memory device according to the invention.

FIG. 4 is a diagram more specifically showing the configuration of the memory array 10 in FIG. 3. In FIG. 4, the memory array 10 is divided into the banks BK0 to BKm.

The bank memory array 10a in the banks BK0 to BKm is divided into a plurality of memory sub arrays MSA0 to MSAn by sub word driver bands SWDB. In each of the banks BK0 to BKm, a spare column block SPYB for repairing a defective column is provided adjacent to the memory sub array MSAn. In the sub word driver band SWDB, sub word drivers for driving sub word lines to a selected state are alternately disposed on both sides of the sub word lines666.

Sense amplifier bands SAB1 to SABm are disposed between the bank memory arrays of the banks BK0 to BKm, a sense amplifier band SAB0 is disposed on the outside of the bank memory array of the bank BK0, and a sense amplifier band SABm+1 is disposed on the outside of the bank memory array of the bank BKm. The sense amplifier bands SAB1 to SABm are shared by adjacent bank memory arrays. In the memory sub arrays MSA0 to MSAn of the bank memory arrays, sub word lines are disposed in correspondence to memory cell rows, and bit lines are disposed in correspondence to memory cell columns. In the sense amplifier bands, sense amplifiers are alternately disposed on both sides of the memory cell columns of the corresponding memory sub arrays.

The layout of the sense amplifiers will be described in detail later. Briefly, one sense amplifier is disposed for three bit lines, and two sense amplifiers are disposed for four bit lines (on both sides of the bit lines).

Adjacent to each of the sense amplifier bands SAB0 to SABm+1, the column decoding circuit 14a is provided. The column decoding circuit 14a transfers a column selection signal along the row direction.

Since the sense amplifier bands SAB1 to SABm are shared by adjacent banks, the column decoding circuit disposed in correspondence to each of the sense amplifier bands is also shared by adjacent banks, since the column selecting circuit is disposed in the sense amplifier bands.

In each of the banks BK0 to BKm, the row decoding circuit 11a is disposed in correspondence to the bank memory array. When the corresponding bank is designated by the active bank address signal, the row decoding circuit 11a is activated to perform a row address decoding operation.

The DRAM 3 further includes: a read/write amplifier circuit 50 for writing/reading internal data; a redundant row/multiplexer block 51 for repairing a defective row; an I/O selector 52 for selecting a main data line pair which will be described later and connecting the selected pair to the global data bus 43 (43r, 43w); and a YS segment decoder 53 provided commonly to the banks BK0 to BKm, for selecting one of a predetermined number of columns selected by the column decoding circuit 14.

The global data bus 43 includes, as shown in FIG. 3, a write global data bus 43w for transferring write data, and a read global data bus 43r for transferring read data. The column decoding circuit 14a also includes a write column decoder for writing data and a read column decoder for reading data. Accordingly, the YS segment decoder 53 includes a read segment decoder for reading data and a write segment decoder for writing data.

Over the memory cell array, a main data bus is arranged extending in the column direction. By the I/O selector 52, the global data bus 43 and the main data bus are electrically connected to each other. The I/O selector 52 has also the function of selecting a spare main data line commonly provided for the spare column blocks SPYB in the banks BK0 to BKm to repair a defective column. In repairing a defective column, a so-called shift redundancy scheme of shifting the connection paths of the buses is used.

The redundancy row/multiplexer block 51 has a spare (redundancy) row common to the banks BK0 to BKm. When a defective row is designated, the redundancy row/multiplexer block 51 replaces the defective row with the redundancy row, and transfers the replaced memory cell data to the I/O selector 52. The read/write amplifier circuit 50 includes a write amplifier connected to the main data bus for writing data, and a read amplifier connected to the read main data bus for reading data.

According to a segment decode signal from the YS segment decoder 53 and a main column select signal from the column decoding circuit, one of the plurality of (for example, eight) sense amplifiers is selected and connected to the write main data bus for transferring write data or the read main data bus for transferring read data.

As shown in FIG. 4, adjacent banks share a sense amplifier band. In the single cell mode, it is inhibited to simultaneously activate banks sharing the sense amplifier band. However, in a structure where each of the bank memory arrays is divided into a plurality of memory row blocks, the banks do not share the sense amplifier band, and the sense amplifier band is shared between adjacent row blocks only in a bank, it is unnecessary to prevent such access confliction between banks.

Figure 5:
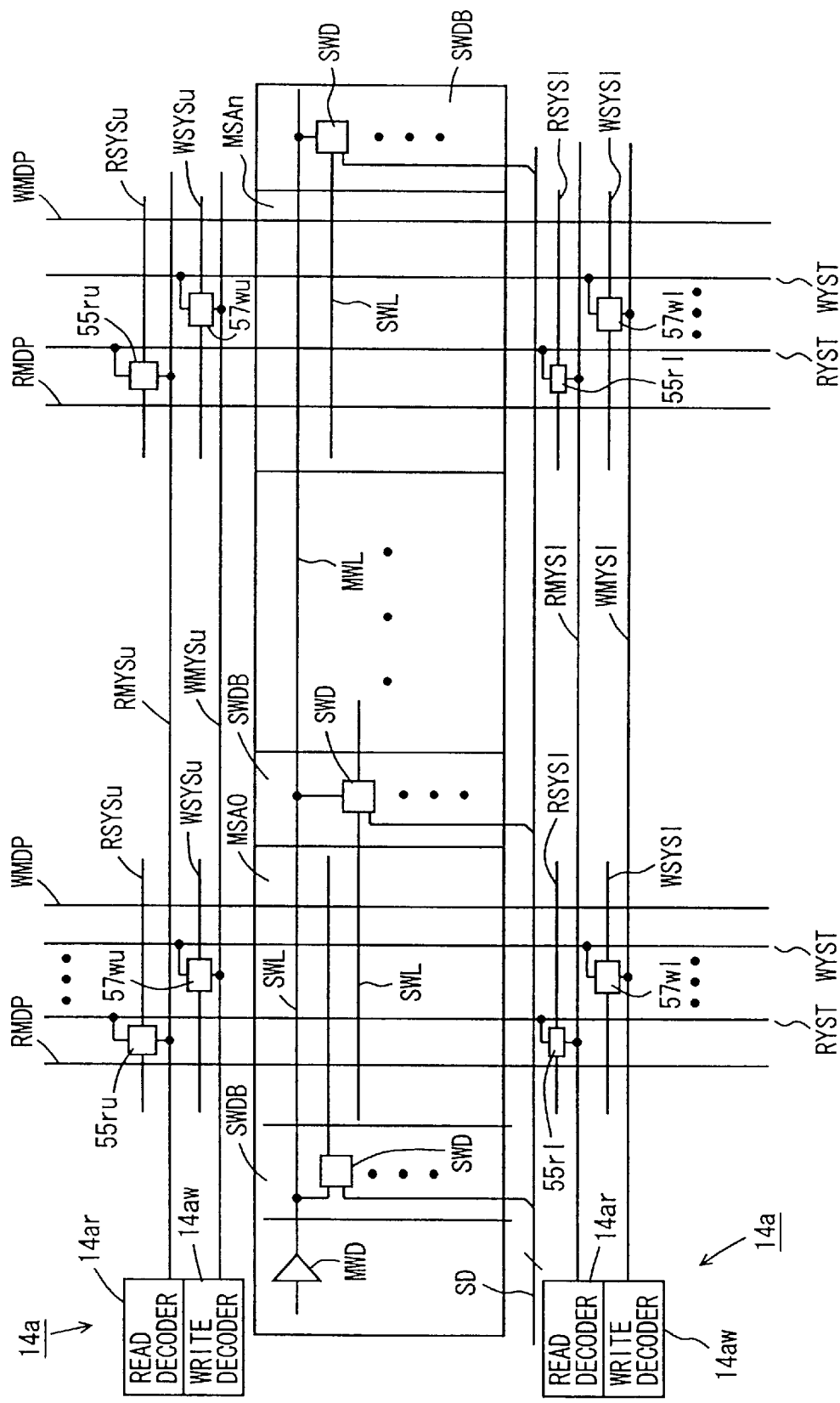
FIG. 5 is a diagram schematically showing the configuration of a portion related to one memory block (bank) in the semiconductor memory device according to the present invention.

FIG. 5 is a diagram schematically showing the configuration of a portion related to the selection of a row and a column in one bank memory array. In FIG. 5, the bank memory array includes a plurality of memory sub arrays MSA0 to MSAn. For each predetermined number of rows in each of the memory sub arrays MSA0 to MSAn, a main word line MWL is disposed. The main word line MWL is driven by a main word driver MWD. The main word driver MWD transmits a word line driving voltage VWL to a selected main word line in accordance with a row selection signal from the row decoding circuit 11a shown in FIG. 4 and other. The row decoding circuit (11a) generates a sub decode signal SD for specifying one of sub word lines provided for one main word line and transmits the sub decode signal SD to the memory sub arrays MSA0 to MSAn along the sense amplifier band.

In each of the memory sub arrays MSA0 to MSAn, the sub word line SWL is disposed for each of the memory cell row. Memory cells in a row in the corresponding memory sub array are connected to the sub word line SWL.

In the sub word driver band SWDB, the sub word drivers SWD are disposed corresponding to the sub word lines SWL. The sub word driver SWD drives the corresponding sub word lines SWL in the memory sub arrays adjacent in the row direction simultaneously into a selected state. By using this configuration, the sub word drivers SWD can be alternately disposed along the column direction on both sides of each memory sub array MSA, so that the pitch condition of the sub word drivers is mitigated. The sub word driver SWD drives a corresponding sub word line SWL into a selected state in accordance with the sub decode signal SD and a signal on the corresponding main word line MWL.

The column decoding circuit 14a includes a read decoder (read column decoder) 14ar for selecting a column for reading data and a write decoder (write column decoder) 14aw for selecting a column for writing data. When the read decoder 14ar is designated by the read bank address signal RBA shown in FIG. 3, it is activated to decode the read address signal RDA and drive a read main column select line RMYS into a selected state. When the write decoder 14aw is designated by the write bank address signal WBA, it is activated to decode the write address signal WRA and drive a write main column select line WMYS into a selected state. The main column select lines RMYS and WMYS are disposed on each of the upper and lower sides of the memory sub arrays MSA0 to MSAn. Upper or lower main column select line out of an upper read main column select line RMYSu, an upper write main column select line WMYSu, a lower read main column select line RMYSl, and a lower write main column select line WMYSl is driven to a selected state.

The main column select lines RMYSu, WMYSu, RMYSl, and WMYSl are provided commonly to the memory sub arrays MSA0 to MSAn and arranged extending in the row direction in the sense amplifier bands.

The YS segment decoder 53 shown in FIG. 4 includes a segment decoder for writing data and a segment decoder for reading data. A segment signal line for transmitting a read segment decode signal RYST for reading and a write segment decode signal WYST for writing are arranged extending from the segment decoder 53 in the column direction so as to be shared by a plurality of banks. In parallel with the signal lines for transmitting the segment decode signals RYST and WYST, a read main data line pair RMDP for reading data and a write main data line pair WMDP for writing data are arranged extending in the column direction so as to be shared by the plurality of banks. The read main data line pair RMDP is included in the read main data bus, and the write main data line pair WMDP is included in the write main data bus.

For the memory sub arrays MSA0 to MSAn, an upper read sub column select line RSYSu, an upper write sub column select line WSYSu, a lower read sub column select line RSYSl, and a lower write sub column select line WSYSl are disposed. For the sub column select lines, an upper read sub column driver 55ru, an upper write sub column driver 57wu, a lower read sub column driver 55rl, and a lower write sub column driver 57wl are disposed.

The upper read sub column driver 55ru drives the upper read sub column select line RSYSu in accordance with the read column segment signal RYST and a signal on the upper main column select line RMYSu. The upper write sub column driver 57wu drives the upper write sub column select line WSYSu into a selected state in accordance with the write column segment signal WYST and a signal on the write main column select line RMYSu.

The lower read sub column driver 55rl drives the lower read sub column select line RSYSl into a selected state in accordance with the read column segment signal RYST and a signal on the read main column select line RMYSl. The lower write sub column driver 57wl drives the lower write sub column select line WSYSl into a selected state in accordance with the write column segment signal WYST and the lower write main column select line WMYSl.

Each of the sub column drivers 55ru, 55rl, 57wu, and 57wl has a configuration similar to that of the sub word driver SWD and drives, when the main column select line is in a selected state, one of the plurality of columns is driven to a selected state in accordance with the column segment decode signals WYST and RYST. The column select lines have a hierarchical structure of the main column select lines RMYS and WMYS and the sub column select lines RSYS and WSYS. Consequently, even in the structure of disposing a main column select line in the row direction, a column is selected at high speed in each of the memory sub arrays.

In the hierarchical structure of the column select lines, it is sufficient to properly determine the number of main column select lines and the number of bits of each column segment decode signal in accordance with the unit number of columns in column selection. The sub column drivers 55ru, 57wu, 57ru, 55wu, 55rl, and 57wl may be disposed in the sub word driver band SWDB.

Figure 6:
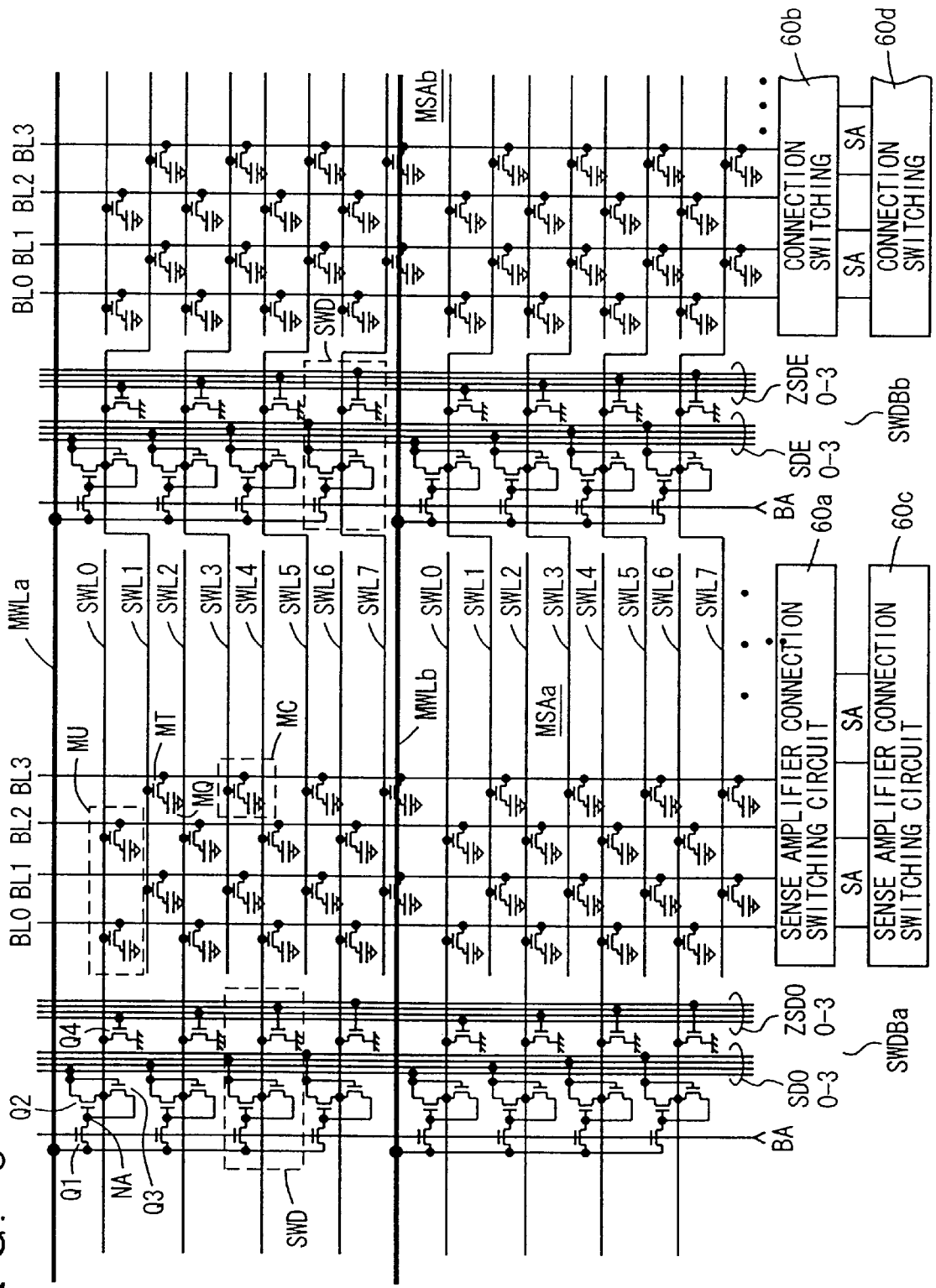
FIG. 6 is a diagram showing the configuration of a memory sub array in the semiconductor memory device according to the invention.

FIG. 6 is a diagram specifically showing the configuration of a memory sub array and a sub word driver band. In FIG. 6, the configuration of a portion related to two main word lines MWLa and MWLb is shown. In each of memory sub arrays MSAa and MSAb, memory cells MC are arranged in rows and columns. The memory cells MC are disposed implementing a so-called folded bit line configuration. In FIG. 6, the memory cells MC are disposed every other column in the row direction and every other row in the column direction. In the arrangement of the memory cells MC, however, it is sufficient to satisfy the condition that the memory cells MC are disposed every other row in the column direction.

The bit lines BL (representatively shown by BL0 to BL3) are disposed in correspondence to the columns of the memory cells MC. The sub word lines SWL (representatively shown by SWL0 to SWL7) are disposed in correspondence to the rows of the memory cells MC. For each of the main word lines MWLa and MWLb, eight sub word lines are disposed in a memory sub array. In the single cell mode, information of one bit is stored by one memory cell MC. In the twin cell mode, information of one bit is stored by two memory cells MC. In this case of twin cell mode, a memory unit MU is constructed by two memory cells MC disposed with one column interposed in between in the same row, and complementary data are stored in the memory unit MU.

For each of the sub word lines SWL (SWL0 to SWL7), the sub word driver SWD is disposed. When a bank selection signal BA is active, the sub word driver SWD disposed in a sub word driver band SWDBa drives a corresponding sub word line SWL into a selected state in accordance with a signal on the main word line MWL (MWLa, MWLb), a sub decode signal SDO (representatively shown by SDO0 to SDO3), and a complementary sub decode signal ZSDO (representatively shown by ZSDO0 to ZSDO3). The bank selection signal BA is made active in response to the active bank address signal ABA and is made inactive in response to the precharge bank address signal PBA.

The sub word driver SWD in the sub word driver band SWDBb is activated when the bank selection signal BA is active, and drives the corresponding sub word line SWL into a selected state in accordance with a sub decode signal SDE (representatively shown by SDE0 to SDE3), a complementary sub decode signal ZSDE (representatively shown by ZSDE0 to ZSDE3), and a signal on the main word lines MWL (representatively sown by MWLa and MWLb) when made active.

The sub word driver SWD included in the sub word driver band SWDBa drives even-number sub word lines in the memory sub array MSAa into a selected state. On the other hand, the sub word driver SWD in the sub word driver band SWDBb drives odd-number sub word lines in the memory sub arrays MSAa and MSAb into a selected state. The sub word drivers SWD are disposed alternately on both sides in the row direction of the memory sub array MSA to mitigate the pitch condition of the sub word drivers SWD.

The sub word driver SWD includes: an n-channel MOS transistor Q1 for connecting a node NA to a corresponding main word line MWL in accordance with the bank selection signal BA; an n-channel MOS transistor Q2 selectively made conductive in response to a signal on the main word line MWL transmitted through the MOS transistor Q1 to transmit the corresponding sub decode signal SD (SDO or SDE) to the sub word line SWL; an n-channel MOS transistor Q3 selectively made conductive in response to the sub decode signal SD (SDO or SDE) to connect the node NA to the sub word line SWL; and an N-channel MOS transistor Q4 for driving the corresponding sub word line SWL to a ground potential level in response to a complementary sub decode signal ZSD (ZSDO or ZSDE).

In the memory sub array MSAa, the bit lines BL0 to BL3 are connected to a sense amplifier SA via a sense amplifier connection switching circuit 60a. The sense amplifier SA is connected to bit lines in a memory sub array (not shown) via a sense amplifier connection switching circuit 60c.

In the memory sub array MSAb as well, the bit lines BL0 to BL3 are connected to the sense amplifier SA via a sense amplifier connection switching circuit 60b. The sense amplifier SA is connected to bit lines in a memory sub array (not shown) via a sense amplifier connection switching circuit 60d. As will be described later, the sense amplifier SA is disposed every other column in a sense amplifier band. The sense amplifier connection switching circuit 60a switches the connection between the sense amplifier SA and the bit lines BL in accordance with the single cell mode or the twin cell mode. The number of bit lines provided for each sense amplifier SA is three. The operations in the layout of the memory sub array shown in FIG. 6 will now be briefly described.

(1) Single Cell Mode

Figure 7:
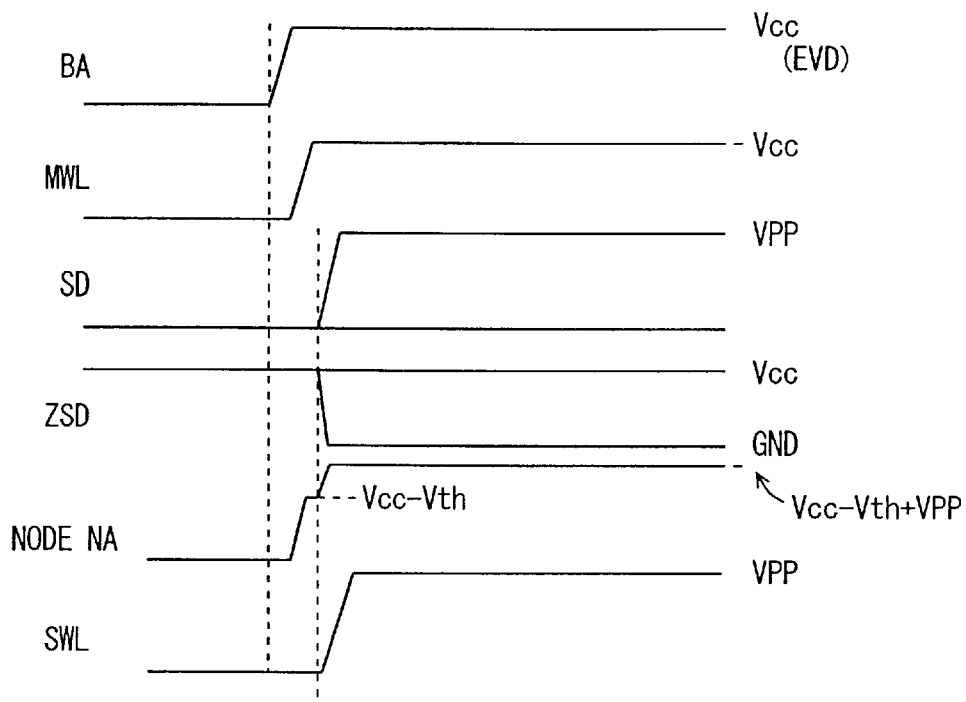
FIG. 7 is a signal waveform diagram representing operations of a single cell mode of the semiconductor memory device according to the present invention.

First, the operation in the single cell mode will be described with reference to FIG. 7. As shown in FIG. 7, in the standby mode, all of the complementary sub decode signals ZSDO0 to ZSDO3 and ZSDE0 to ZSDE3 are at the H level, and all of the sub decode signals SDO0 to SDO3 and SDE0 to SDE3 are at the L level. Therefore, the resetting MOS transistor Q4 is ON in the sub word driver SWD, and the sub word lines SWL (SWL0 to SWL7) are maintained at the ground voltage level.

When an active cycle for selecting a memory cell row starts, first, the bank selection signal BA is driven to a selected state in response to the active bank address signal ABA. The bank selection signal BA is at a power source voltage (periphery power source voltage) Vcc level.

Subsequently, the active address signal is decoded in the selected bank, and a selected main word line MWL is driven to the power source voltage Vcc level. In the sub word driver SWD, the MOS transistor Q1 is turned on in response to the bank selection signal BA, and the internal node NA is connected to the corresponding main word line MWL. In the sub word driver SWD connected to the selected main word line MWL, the internal node NA increases in voltage level to the level of a voltage of Vcc−Vth, where Vth denotes a threshold voltage of the MOS transistor Q1. In the sub word driver SWD provided corresponding to a non-selected main word line, the internal node NA is maintained at the ground voltage level.

Then, the selected sub decode signal SD (SDO or SDE) is driven at the high voltage VPP level, and the level of the selected sub decode signal ZSD (SD) is lowered from the H level to the L level. In the sub word driver SWD, the voltage level of the internal node NA increases to a voltage level Vcc−Vth+VPP through a self boost operation. Accordingly, the sub decode signal SD at the high voltage VPP level is transmitted to the selected sub word line SWL. In the self boost operation, even if the bank selection signal BA is at the H level, or in the selected state, the MOS transistor Q1 is in the OFF state and functions as a decoupling transistor, when the high voltage VPP is transmitted to the selected sub word line from the MOS transistor Q2, the voltage on the gate and that on the drain in the MOS transistor Q3 become the same and are lower than the power source potential, so that MOS transistor Q3 maintains the OFF state. In the sub word driver SWD arranged corresponding to the selected sub word line, the node NA maintains the potential level of the voltage Vcc−Vth+VPP. According to the sub decode signal, the selected sub word line SWL is maintained at the high voltage VPP level.

For the non-selected sub word driver SWD connected to the selected main word line, even if the node NA is at the H level, the corresponding sub decode signal SD is at the L level, the MOS transistor Q3 is in the OFF state, the ground voltage is transmitted via the MOS transistor Q2 to the corresponding sub word line SWL, the corresponding resetting transistor Q4 maintains the ON state, and the non-selected sub word line maintains the ground potential level.

In the sub word driver connected to a non-selected main word line, even when the corresponding sub decode signal SD is driven to the high voltage VPP level, the node NA is kept at the ground voltage level, and the MOS transistor Q3 is turned on, and the self boost operation of the node NA is inhibited. Consequently, the non-selected sub word line is fixed at the ground voltage level by the resetting MOS transistor Q4.

For the sub word driver SWD connected to the non-selected main word line, when the corresponding sub decode signal SD is at the L level of the ground voltage level, both of the MOS transistors Q2 and Q3 are turned off. In this state, the corresponding resetting MOS transistor Q4 is in the ON state, so that the corresponding sub word line does not enter an electrically floating state, but is held at the ground voltage level by the resetting MOS transistor Q4 with reliability.

In the self boost operation, the decoupling function of the MOS transistor Q1 in the sub word driver SWD is utilized. The bank selection signal BA may be activated in the form of a one-shot pulse. In this case, it is unnecessary to hold the main word line MWL to the H level during the active period.

In return to the precharge state, the resetting MOS transistor Q4 is turned on, and the sub decode signal SD in the selected state is lowered to the L level, thereby resetting the node NA at the high voltage level to the ground voltage level via the MOS transistor Q3 with reliability.

(2) Twin Cell Mode Operation

Figure 8:
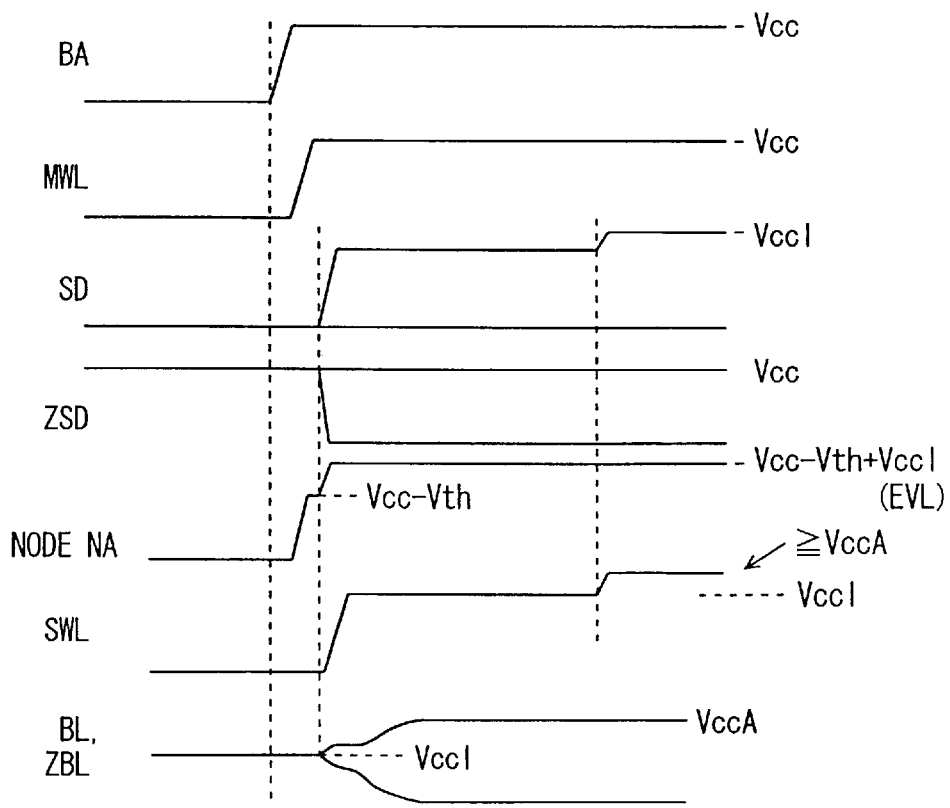
FIG. 8 is a signal waveform diagram representing operations in a twin cell mode of the semiconductor memory device according to the present invention.

The operation in the twin cell mode will be described with reference to FIG. 8. As shown in FIG. 8, in an operation in the twin cell mode, in place of the high voltage VPP, the logic power source voltage EVL (Vccl) is used. As the precharging voltage for the bit line, similarly, the logic power source voltage EVL is used.

As shown in FIG. 8, in the twin cell mode as well, at the time of selection, the bank selection signal BA is driven to power source voltage Vcc (DRAM power source voltage (EVD level)). Subsequently, a selected main word line MWL is also driven to the power source voltage Vcc level. In the selected sub word driver SWD, the voltage level of the node NA increases to the voltage level Vcc−Vth.

The sub decode signal SD is driven to a selected state and rises to the logic power source voltage Vccl (=EVL) level. Accordingly, the voltage level of the node NA increases to the voltage level Vcc−Vth+Vccl level through the self boost operation. The voltage at the logic power source voltage Vccl (=EVL) level is transmitted to the selected sub word line SWL, and data in the memory cell is read out. In the twin cell mode, complementary data are read out and transferred to a corresponding pair of bit lines BL and ZBL. The H-level data in the memory cell is at the level of an array power source voltage VCCA. Even when the voltage level of the selected sub word line SWL is at the logic power source voltage Vccl (EVL) level, a voltage difference large enough to be sensed by a sense amplifier can be generated between the bit lines BL and ZBL.

Before returning to the precharge state, in order to perform restoring operation on the memory cell data, the voltage level of the selected sub decode signal SD is increased to raise the voltage level of the sub word line SWL. Thus, the voltage at the array power source voltage VCC level can be rewritten, with reliability, to an original memory cell storing data of the H level.

In the restoring operation, the sub decode signal SD does not have to be increased in voltage level to the high voltage VPP, but is required to be at the voltage level of the array power source voltage VCCA or higher. By utilizing the self boost operation of a self boost circuit, sufficiently, the voltage level of the selected sub word line can be driven from the level of the logic power source voltage Vccl (=EVL) to the level of the array power source voltage VCCA or higher.

FIG. 9 is a diagram schematically showing the configuration of the power of the row decoding circuit 11a in FIG. 4. In FIG. 9, the row decoding circuit 11a includes a main row decoding circuit 61a for decoding predecoded signals X3 to Xk, and a main word line driving circuit 61b for driving a main word line in accordance with a decoded signal outputted from the main row decoding circuit 61a. The DRAM power source voltage EVD is applied, as an operation power source voltage Vcc, to the main row decoding circuit 61a and the main word driving circuit 61b.

The row decoding circuit 11a further includes a sub decoding circuit 62 for decoding the predecoded signals X0 to X2 to generate the sub decode signals SD and ZSD. To the sub decoding circuit 62, the word line driving voltage VWL from the switching circuit (MUX) 21 shown in FIG. 4 is supplied as a power source voltage for generating the sub decode signal SD. The complementary sub decode signal ZSD has the amplitude of the voltage Vcc (DRAM source voltage EVD) in both of the twin cell mode and the single cell mode. To generate the complementary sub decode signal ZSD, the DRAM power source voltage EVD is applied. The amplitude of the sub decode signal SD is the word line driving voltage VWL.

A self boost circuit 63 is provided to boost the voltage of the sub decode signal SD in the twin cell mode. The self boost circuit 63 includes a capacitor 63a and boosts the voltage level of the sub decode signal (any of SDO0 to SDO3 and SDE0 to SDE3) in the selected state in response to a reset signal RST generated according to a precharge command PRG in the twin cell mode.

As the configuration of the self boost circuit 63, such a configuration may be used that the DRAM power source voltage EVD is supplied in the form of a one-shot pulse to the source node via a transistor having a gate in a floating state, or the gate connected to an off-state MOS transistor.

Figure 10:
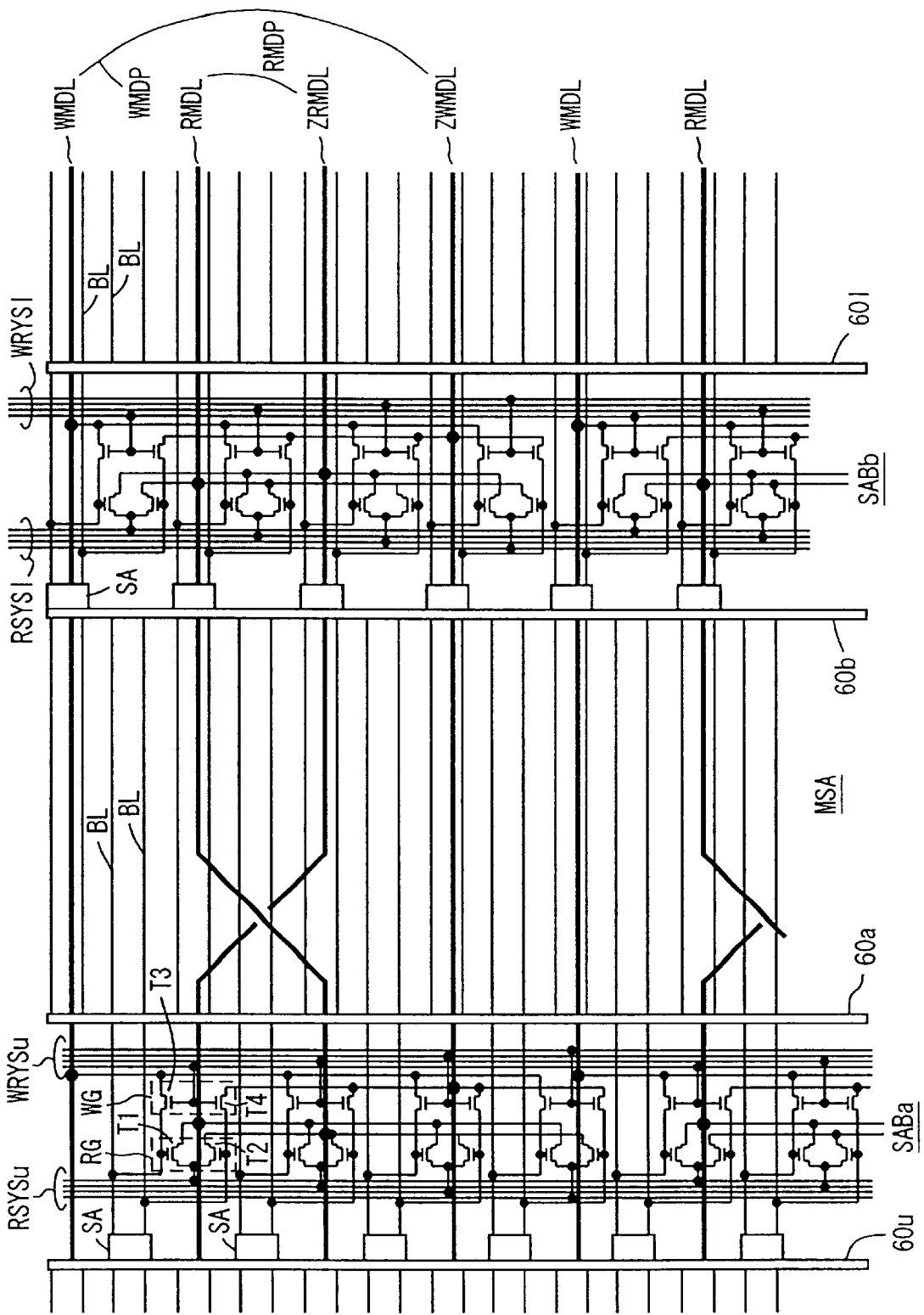
FIG. 10 is a diagram showing the configuration of a portion related to selection of a column in the semiconductor memory device according to the present invention.

FIG. 10 is a diagram showing the configuration of a sense amplifier band, and specifically shows the configuration of sense amplifier bands SABa and SABb provided for the memory sub array MSA. In the sense amplifier bands SABa and SABb, the sense amplifiers SA are alternately provided every other pair of bit lines BL in the memory sub array MSA. The arrangement of the sense amplifiers SA is the same as that of sense amplifiers of a conventional DRAM that operates in a single cell mode.

The sense amplifiers SA are coupled to the bit lines in the memory sub array MSA via the sense amplifier connection switching circuits 60*a* and 60*b*. The connection of the sense amplifier connection switching circuits 60*a* and 60*b* will be specifically described later. Briefly, two sense amplifiers are disposed on both sides of four bit lines and two bit lines out of the three bit lines are connected to the sense amplifiers.

The sense amplifier SA in the sense amplifier band SABa is coupled to bit lines in a memory sub array (not shown) via a sense amplifier connection switching circuit 60*u*. The sense amplifier SA included in the sense amplifier band SABb is coupled to the bit lines BL of another memory sub array via a sense amplifier connection switching circuit 60*l*.

In correspondence to the sense amplifier SA, a read amplifier gate RG that is selectively made conductive in response to the signals on the sub column select lines RSYSu and RSYSl in reading data, and a write column select gate WG that is made conductive in response to the signals on the write sub column select lines WRYSu and WRYSl are provided. In one sense amplifier band, one main read data line pair RMDP is provided for each four read amplifier gates RG, and one write main data line pair WMDP is disposed for each four write column select gates WG. The read main data line pair RMDP consists of the main read data lines RMDL and ZRMDL. The write main data line pair WMDP consists of the main write data lines WMDL and ZWMDL. The main read data lines RMDL and ZRMDL have an intersection point to cancel off the influence of noises occurring when a signal having a small amplitude is transmitted.

In the sense amplifier band SABa, four read amplifier gates RG are selectively made conductive in response to the sub column select signal on the upper read sub column select line RSYSu, and data latched by the sense amplifier is transferred to the corresponding main read data lines RMDL and ZRMDL. The read amplifier gate RG includes differential MOS transistors T1 and T2 that are activated in response to the corresponding sub column select signal bit on the upper read sub column select line, to drive one of the read data lines RMDL and ZRMDL to the ground voltage level in accordance with the potential latched by the corresponding sense amplifier SA. A signal transmitted on the upper read sub column select line RSYSu is a signal of four bits driven to the L level when selected and driven to the H level when not selected.

Similarly, in the sense amplifier band SABa, the write column select gate WG includes a pair of MOS transistors (transfer gates) T3 and T4 that are made conductive in response to a corresponding sub column select signal bit on the upper write sub column select line WRYSu to connect the sense node of the corresponding sense amplifier SA to the corresponding write main data lines WMDL and ZWMDL.

Through the upper write sub column select line WRYSu as well, a four-bit sub column select signal is transmitted, and one of the four sense amplifiers is selected.

In the sense amplifier band SABb as well, the read amplifier gate RG is selectively made active in response to the signals on the lower read sub column select line RSYSl. In response to the write column select signal on the lower write sub column select line WRYSl, the write column select gate WG is selectively made conductive. In the sense amplifier bands SABa and SABb, the gates on either of one of the upper and lower sides are made active or conductive. In the single cell mode, therefore, in the memory sub array MSA, one of eight sense amplifiers SA is selected and data is written or read.

In this case, however, in each of the sense amplifier bands SABa and SABb, column selecting operation may be performed in a unit of eight sense amplifiers SA. In this case, a configuration of driving a one-bit sub column select signal into the selected state in each of the upper read sub column select line RSYSu and the lower read sub column select line RSYSl, thereby realizing, in total, a ⅛ selecting operation (8 to 1 selection) may be used.

A configuration of disposing a main data line pair separately for the gates of each of upper and lower sides and selecting a gate in both of the upper and lower sides of the memory sub array may be employed. In the twin cell mode, column selection is executed further by an IO selector, and connection between the global data line and the main data line is controlled so as to access data.

In the single cell mode, a bit line connected to a memory cell and a bit line (reference bit line) held in the precharged state are selected to be paired for connection to the sense amplifier SA.

In the twin cell mode, bit lines each connected to a memory cell are connected to the sense amplifier SA. In this case, the number of bit lines held in the precharged state is the half of the number of all bit lines in a selected bank. The number of sense amplifiers requested to perform sensing operation becomes accordingly half times. By activating only the sense amplifiers connected to selected memory cells, the sense current is decreased and the current consumption is accordingly reduced. In the twin cell mode, a control of connecting the bit line BL to a sense amplifier in the sense amplifier band SABa or SABb in one memory sub array MSA is carried out by the sense amplifier switching circuits 60*a*, 60*b*, 60*u*, 60*l*, and other.

FIG. 11 is a diagram schematically showing a configuration of the sense amplifier connection switching circuit 60. In FIG. 11, the memory cells MC are disposed every other row in each column. In the column direction, a pair of two memory cells MC to share a bit line contact BCT is disposed every two rows. The layout of the memory cells MC shown in FIG. 11 is slightly different from that shown in FIG. 6. However, only by changing the positions of the word lines WL (sub word lines SWL), the layout of the memory cells shown in FIG. 6 is easily achieved. The memory cells MC are therefore arranged by repeating the same pattern of four word lines WL0 to WL3 as a unit in the column direction. Although the word lines have a hierarchical structure, in the following description, the sub word line will be simply described as a word line.

In the four word lines WL0 to WL3, the position of the memory cell MC is shifted by one column at the maximum. With a set of four bit lines BL0 to BL3 being a unit, the connection between a bit line BL and a sense amplifier SA is controlled. The word lines WL0 and WL2 have the same connection pattern of memory cells. The word lines WL1 and WL3 have the same connection pattern of memory cells. The word lines having the same connection patterns are classified into even-number word lines and odd-number word lines.

The bit line BL0 is connected to the corresponding sense amplifier SA via a switch circuit LSW0 provided on its one side. The bit line BL1 is coupled to sense amplifiers SAa and SAb on both sides via switch circuits LSW1 and RSW0 provided on both sides of the bit line BL1. The bit line BL2 is connected to the sense amplifiers SAa and SAb via switch circuits LSW2 and RSW1 on both sides thereof. The bit line BL3 is connected to the sense amplifier SAb via a switch circuit RSW2 provided on its right side. Sets each having the switch circuits LSW0 to LSW3 arranged in the same pattern are disposed in the column direction with one column interposed between adjacent sets. Similarly, sets each having the switch circuits RSW0 to RSW2 are disposed in the column direction with one column interposed between adjacent sets.

In the configuration of the sense amplifier connection switching circuit 60 shown in FIG. 11, two sense amplifiers SA (SAa and SAb) are provided for four bit lines BL0 to BL3. The sense amplifiers SAa and SAb share the bit lines BL1 and BL2, the bit line BL0 can be connected only to the sense amplifier SAa, and the bit line BL3 can be connected only to the sense amplifier SAb.

Since the memory cells are arranged every other column, by selecting two bit lines out of the three bit lines, the single cell mode and the twin cell mode can be achieved selectively. Since the positions of the memory cells MC are different from each other in the row direction, according to the position of the selected word line, a sense amplifier to be connected is switched.

In the single cell mode, in FIG. 11, as shown by a pair TGP of switch circuits, with adjacent bit lines being a pair, the bit lines are connected to the sense amplifiers SA and SAa. In this case, in the sense amplifiers SA (SAa and SAb), when the word line WL is selected, the memory cells are connected to only one of the bit lines of a pair. In a manner similar to an ordinary memory of an alternately arranged, shared sense amplifier configuration, sense operation can be performed. By utilizing the conventional shared sense amplifier configuration of an alternate arrangement type, bit lines are selectively connected to sense amplifiers by the switch circuits LSW0 to LSW3 and RSW0 to RSW2, thereby implementing the DRAM operating in the twin cell mode without changing the conventional configuration. The memory cell unit MU is constructed by two memory cells MC arranged with one column interposed in between.

Figure 12:
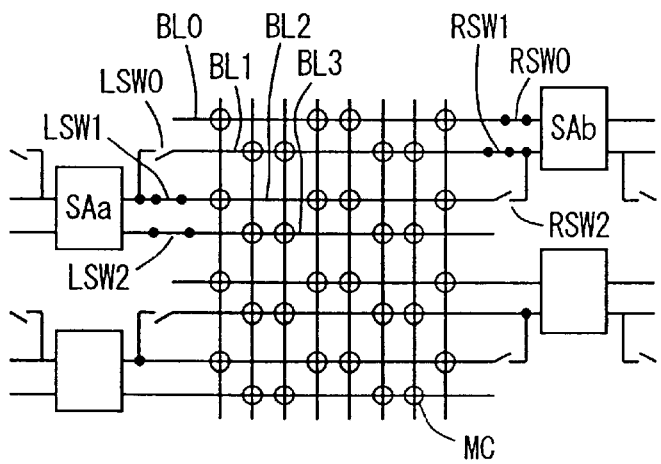
FIG. 12 is a diagram schematically showing the connection between a bit line and a sense amplifier in a single cell mode according to the invention.

As shown in FIG. 12, in the single cell mode, the sense amplifier SAa is connected to the bit lines BL2 and BL3 via the switch circuits LSW1 and LSW2, and the sense amplifier SAb is connected to the bit lines BL0 and BL1 via the switch circuits RSW0 and RSW1. In this state, a precharge state is maintained.

Figure 13:
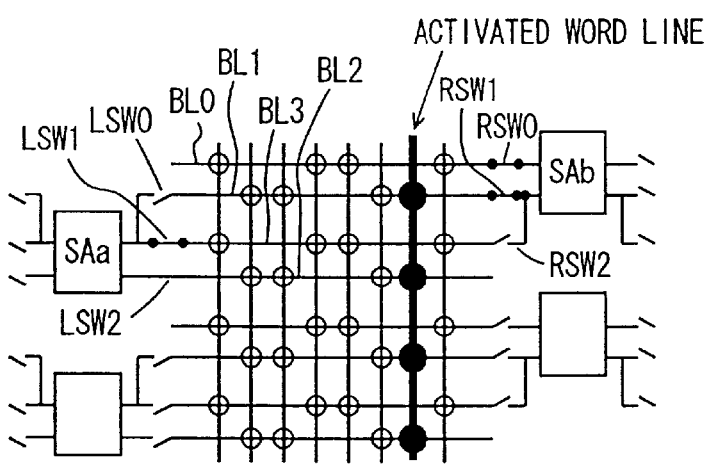
FIG. 13 is a diagram showing an example of an activated word line in the single cell mode.

As shown in FIG. 13, when a word line is selected, data of the selected memory cell is transmitted to the sense amplifier SAa via the switch circuit LSW2. Simultaneously, the sense amplifier SAa is connected to the precharged bit line via the switch circuit LSW1. Since the switch circuit RSW2 is in an OFF state, the bit line BL3 is isolated from the sense amplifier SAb. On the other hand, data of another memory cell read out onto the bit line BL1 is transmitted to the sense amplifier SAb via the switch circuit RSW1. The precharged bit line BL0 is connected to the sense amplifier SAb. In a manner similar to a general DRAM of the one-bit-per-cell type, the sense operation can be performed, and collision of data does not occur.

Figure 14:
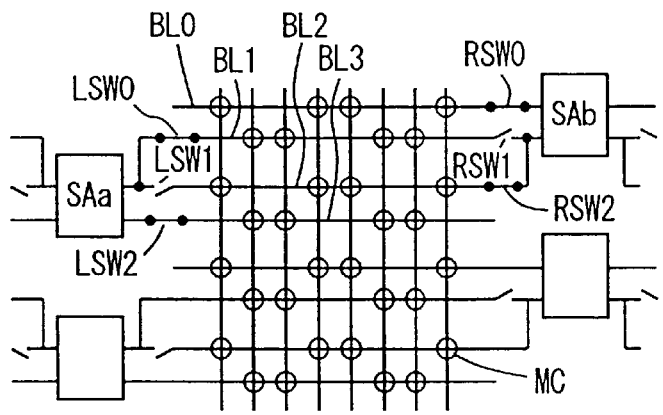
FIG. 14 is a diagram schematically showing the connection between a bit line and a sense amplifier in a twin cell mode according to the invention.

In the twin cell mode, as shown in FIG. 14, the switch circuit RSW1 is made non-conductive, the switch circuit RSW2 is turned on, and the bit lines BL0 and BL3 are connected to the sense amplifier SAb. By making the switch circuits LSW0 and LSW2 conductive and the switch circuit LSW1 non-conductive, the bit lines BL1 and BL3 are connected to the sense amplifier SAa. In such a state, therefore, different pairs of bit lines are connected to the sense amplifiers SAa and SAb while sandwiching the bit line of the other pair. Since the bit lines connected to one sense amplifier are arranged with one column interposed in between, the pair of bit lines receive memory cell data or are maintained at the precharge voltage level.

Figure 15:
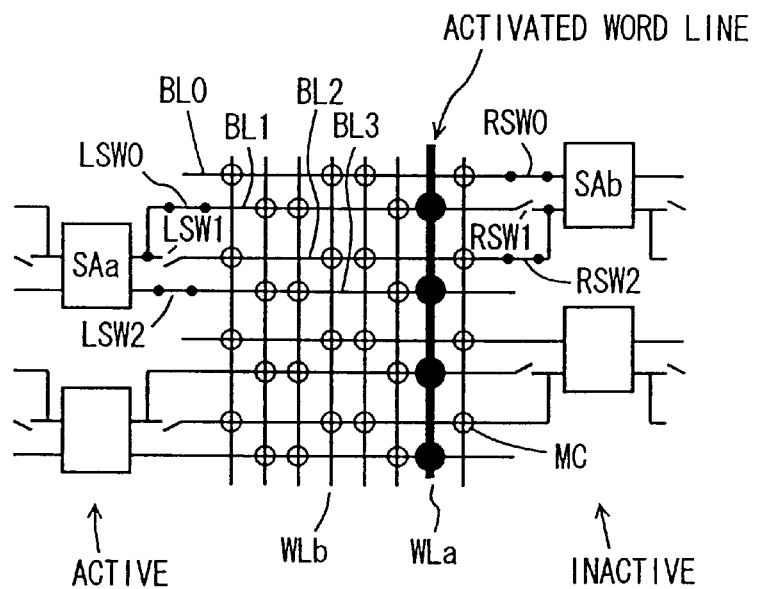
FIG. 15 is a diagram showing an example of correspondence between the position of a selected word line and an activated sense amplifier in the twin cell mode.

It is now assumed that a word line WLa is selected in such a state as shown in FIG. 15. In this state, the data of the selected memory cells are read onto the bit lines BL1 and BL3. The memory cell data are therefore transmitted via the switch circuits LSW0 and LSW2 to the sense amplifier SAa. On the other hand, the bit lines BL0 and BL3 maintain the precharge state voltage level, The sense amplifier SAb is maintained in an inactive state. In the twin cell mode, only the sense amplifier receiving the data of the memory cell and provided in the sense amplifier band on one side is made active, and the sense amplifier on the other side is maintained inactive, thereby decreasing the number of sense amplifiers in operation to the half times to reduce the current consumption.

In the case where a word line WLb is selected, data in the memory cells are read out on the bit lines BL0 and BL2 and then are transmitted to the sense amplifier SAb. The sense node in the sense amplifier SAa is connected to the bit lines BL1 and BL3 and maintains at the precharge voltage level. In this case, therefore, the sense amplifier SAa is maintained in an inactive state, and the sense amplifier SAb is made active.

By determining the position of the sense amplifier to be activated according to the position of a selected word line, in the twin cell mode, the number of sense amplifiers to be activated can be easily reduced to the half times. Specifically, by determining whether the selected word line is an even-number word line or odd-number word line, the sense amplifier to be activated is determined.

Figure 16:
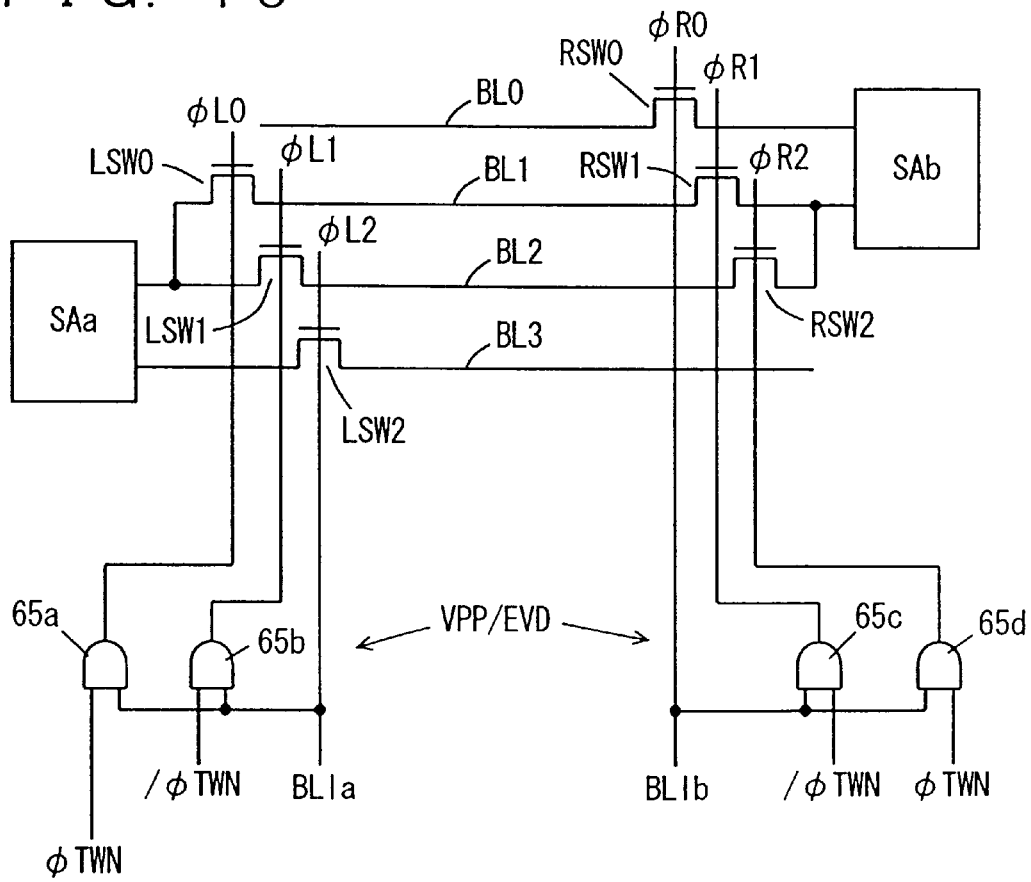
FIG. 16 is a diagram schematically showing the configuration of a portion related to bit line isolating control in a first embodiment of the present invention.

FIG. 16 is a diagram showing an example of the configuration of a portion of generating a control signal for the sense amplifier connection switching circuit. In FIG. 16, the sense amplifier SAa is connected to the bit lines BL1, BL2, and BL3 via the switch circuits SW0, SW1, and SW2, respectively. The sense amplifier SAb is connected to the bit lines BL0, BL1, and BL2 via the switch circuits RSW0, RSW1, and RSW2, respectively. One node of each of the switch circuits LSW0 and LSW1 is connected to a first sense node of the sense amplifier SAa. One node of the switch circuit LSW2 is connected to a second sense node of the sense amplifier SAa. On the other hand, a first sense node of the sense amplifier SAb is connected to the bit line BL0 via the switch circuit RSW0, and a second sense node is connected to the bit lines BL1 and BL2 via the switch circuits RSW1 and RSW2.

An output signal φL0 of an AND circuit 65a receiving a bit line isolation instruction signal BILa and a twin cell mode instruction signal φTWN is supplied to the switch circuit LSW0. An output signal φL1 of an AND circuit 65b receiving the bit line isolation instruction signal BILa and a complementary twin cell mode instruction signal /φTWN is supplied to the switch circuit LSW1. The bit line isolation instruction signal BILa is supplied as a connection control signal φL2 to the switch circuit LSW2.

When a not-shown memory sub array (bank) sharing the sense amplifier SAa is selected, the bit line isolation instruction signal BILa is set to the L level. When the memory sub array MSA is selected or both memory sub arrays sharing the sense amplifier SAa are not selected, the bit line isolation instruction signal BILa is maintained at the H level.

A bit line isolation instruction signal BILb is supplied as a connection control signal φR0 to the switch circuit RSW0. To the switch circuit RSW1, an output signal φR1 of an AND circuit 65c receiving the complementary twin cell mode instruction signal /φTWN and the bit line isolation instruction signal BILb is supplied. To the switch circuit RSW2, an output signal φR2 of an AND circuit 65d receiving the bit line isolation instruction signal BILb and the twin cell mode instruction signal φTWN is supplied.

When a not-shown memory sub array (bank) sharing the sense amplifier SAb is selected, the bit line isolation instruction signal BILb goes low. When both of the memory sub arrays sharing the sense amplifier SAb are not selected or when the sub array including the bit lines BL0 to BL3 is selected, the bit line isolation instruction signal BILb is maintained at H level.

In the single cell mode, the complementary twin cell mode instruction signal /φTWN is at the H level and the twin cell mode instruction signal φTWN is at the L level. The output signals φL0 and φR2 of the AND circuits 65a and 65d are at the L level, the switch circuits LSW0 and RSW2 are in the OFF state, and the bit lines BL1 and BL2 are normally isolated from the sense amplifiers SAa and SAb, respectively.

On the other hand, the complementary twin cell mode instruction signal /φTWN is at the H level. The AND circuits 65b and 65c generate the signals φL2 and φR0 in accordance with the bit line isolation instruction signals BILa and BILb, respectively. According to the bit line isolation instruction signal BILb, the bit lines BL2 and BL3 are connected to the sense amplifier SAa, and the bit lines BL0 and BL1 are connected to the sense amplifier SAb.

In the twin cell mode, the twin cell mode instruction signal φTWN is at the H level, and the complementary twin cell mode instruction signal /φTWN is at the L level. The output signals φL1 and φR1 of the AND circuits 65b and 65c are kept low, the switch circuits LSW1 and RSW1 are turned off, and the bit lines BL1 and BL2 are isolated from the sense amplifiers SAb and SAa, respectively.

The output signals φL0 and φR2 of the AND circuits 65a and 65d are selectively activated according to the bit line isolation instruction signals BILa and BILb to selectively make the switch circuits LSW0 and RSW2 conductive. In this case, therefore, according to the bit line isolation instruction signals BILa and BILb, the bit lines BL0 and BL2 are connected to the sense amplifier SAb, and the bit lines BL1 and BL3 are connected to the sense amplifier SAa.

In such a manner, by switching the connection between a bit line and a sense amplifier in accordance with the mode (the twin cell mode or the single cell mode), data in a memory cell can be read.

Figure 17A:
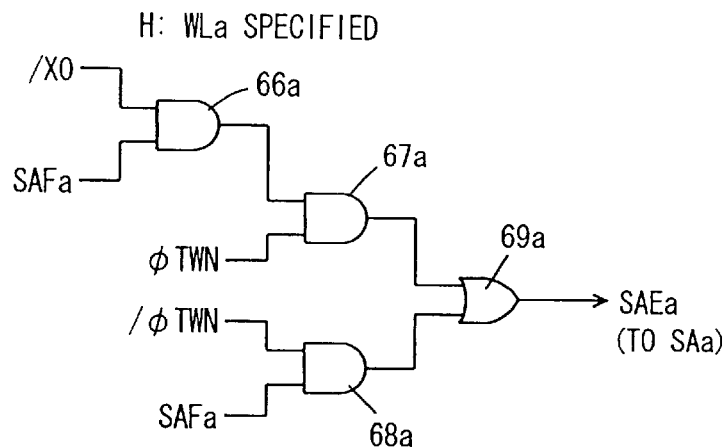
FIGS. 17A and 17B are diagrams each showing an example of the configuration of a sense amplifier control circuit in a second embodiment of the invention.

FIG. 17A is a diagram showing an example of the configuration of a portion for generating a sense amplifier activation signal SAEa to the sense amplifier SAa shown in FIG. 16. Such a logical condition that when the predecoded signal X0 is at the H level, the even-number word line WLb (refer to FIG. 15) or the word lines WL0 and WL2 shown in FIG. 11 are specified is assumed.

In FIG. 17A, a sense amplifier activation signal generating unit includes: an AND circuit 66a for receiving a complementary predecoded signal /X0 and a sense amplifier enable fast signal SAFa; an AND circuit 67a for receiving the twin cell mode instruction signal φTWN and an output signal of the AND circuit 66a; an AND circuit 68a for receiving the complementary twin cell mode instruction signal /φTWN and the sense amplifier enable fast signal SAFa; and an OR circuit 69a for receiving output signals of the AND circuits 67a and 68a and generating the sense amplifier activation signal SAEa.

In the single cell mode, the twin cell mode instruction signal φTWN is at the L level, and the complementary twin cell mode instruction signal /φTWN is at the H level. According to the sense amplifier enable fast signal SAFa, the sense amplifier activation signal SAEa is generated from the OR circuit 69a. Irrespective of the position of a selected word line, the sense amplifier circuit SAa is activated in response to the sense amplifier enable fast signal SAFa.

In the twin cell mode, the twin cell mode instruction signal φTWN is at the H level, the complementary twin cell mode instruction signal /φTWN is at the L level, and the output signal of the AND circuit 68a is at the L level. In this state, according to the logic level of the complementary predecoded signal /X0, the sense amplifier activate signal SAEa is made active or inactive. In the case where the predecoded signal /X0 is at the H level to designate an odd-number word line WLa (WL1 or WL2), an output signal of the AND circuit 66a is set to the H level in accordance with the sense amplifier enable fast signal SAFa, and the sense amplifier activation signal SAEa is activated through the AND circuit 67a and the OR circuit 69a. That is, when the odd-number word line WLa is selected in the twin cell mode, the sense amplifier SAa is made active. On the other hand, when the complementary predecoded signal /X0 is at the L level and the even-number word line WLb (WL0 or WL2) is designated, an output signal of the AND circuit 66a is at the L level, and the sense amplifier activation signal SAEa maintains the inactive state. In this state, therefore, the sense amplifier SAa maintains the inactive state. Consequently, according to the position of the selected word line, the sense amplifier SAa can be made active or inactive selectively.

Figure 17B:
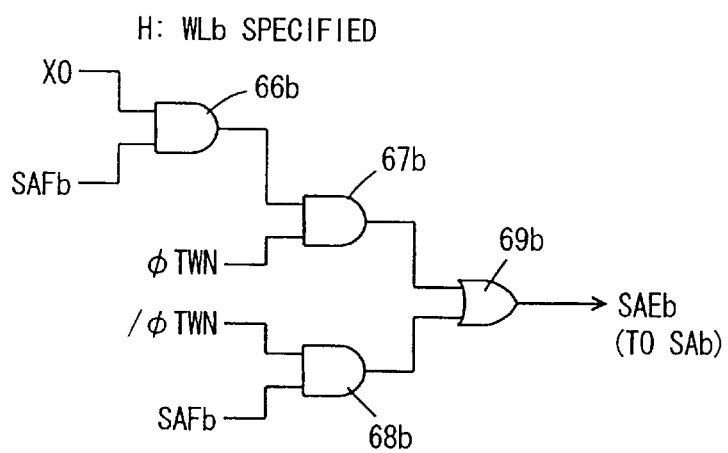

FIG. 17B is a diagram showing an example of the configuration of a portion for generating the sense amplifier activation signal SAEb for the sense amplifier SAb shown in FIG. 16. In FIG. 17B, the portion for generating the sense amplifier activate signal SAEb includes: an AND circuit 66b for receiving the sense amplifier enable fast signal SAFb; an AND circuit 67b for receiving the twin cell mode instruction signal φTWN and an output signal of the AND circuit 66b; an AND circuit 68b for receiving the complementary twin cell mode instruction signal /φTWN and the sense amplifier enable fast signal SAFb; and an OR circuit 69b for receiving output signals of the AND circuits 67b and 68b and generating the sense amplifier activation signal SAEb.

In the configuration of the portion for generating the sense amplifier activation signal shown in FIG. 17B, in the single cell mode, the sense amplifier activation signal SAEb is generated according to the sense amplifier enable fast signal SAFb. In the twin cell mode, in response to the predecoded signal X0, the sense amplifier activation signal SAEb is selectively activated according to the sense amplifier enable fast signal SAFb. In this case, the logic level of the sense amplifier activation signal generating portion shown in FIG. 17A and that of the predecoded signal X0 are different from each other. When the predecoded signal X0 is at the H level and the even-number word line WLb is designated, according to the sense amplifier enable fast signal SAFb, the sense amplifier activation signal SAEb is made active. On the other hand, when the predecoded signal X0 is at the L level and an odd-number word line WL is designated, the sense amplifier activation signal SAEb maintains the L level.

By using the configuration of the sense amplifier activation signal generating portion as shown in FIGS. 17A and 17B, the sense amplifiers SAa and SAb can be made selectively active or inactive according to the position of a selected sense amplifier.

The sense amplifier SA includes a P sense amplifier constructed by cross-coupled p-channel MOS transistors, and an N sense amplifier constructed by cross-coupled n-channel MOS transistors. A state where the sense amplifier is activated when the sense amplifier activation signals SAEa and SAEb are at the H level is assumed. The sense amplifier activation signal for activating the P sense amplifier is at the L level when made active (the configuration that sense amplifier activating transistors are disposed for each predetermined number of sense amplifiers is assumed) and is provided by inversion signals of the sense amplifier activation signals SAEa and SAEb shown in FIGS. 17A and 17B.

As the arranging condition of memory cells, it is sufficient that memory cells are arranged every other column in the row direction. In the twin cell mode, when one word line is selected, two bit lines receiving memory cell data are paired, and the sense amplifier connected to the bit line maintained in the precharge state is maintained in an inactive state.

As described above, according to the first embodiment of the present invention, the connection between a bit line and a sense amplifier is switched according to the operation mode. Without changing the conventional layout of memory cells, a semiconductor memory device that operates in the twin cell mode can be achieved. In the twin cell mode, complementary data appear on paired bit lines, so that a read voltage becomes larger, and the sense timing can be advanced. In the case of setting the sense timing similar to that in the single cell mode, the refresh interval can be made longer, and the average refresh current can be reduced.

Since the operation of generating a voltage in the DRAM is stopped in the standby mode, the current consumption can be reduced.

Second Embodiment

Figure 18:
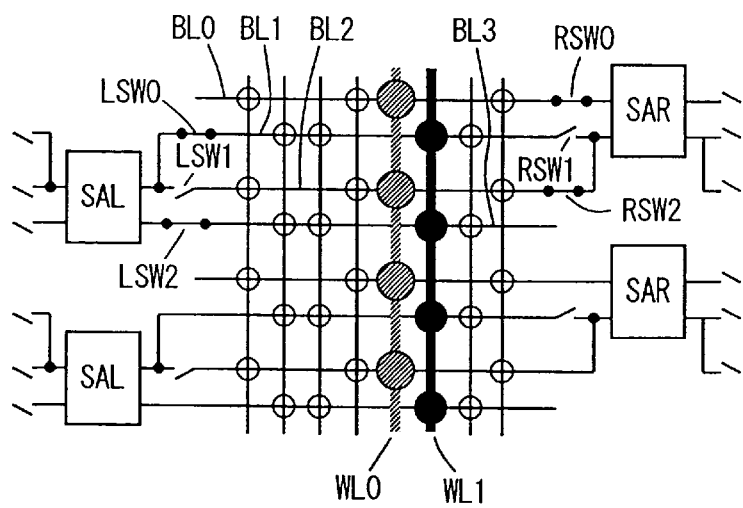
FIG. 18 is a diagram showing an example of a selected word line in the second embodiment of the invention.

FIG. 18 is a diagram schematically showing the configuration of a portion of a memory sub array in a semiconductor memory device according to a second embodiment of the present invention. In the configuration shown in FIG. 18, in a manner similar to the first embodiment, sense amplifiers SAL and SAR are arranged on both sides of a set of four bit lines BL0 to BL3. Two bit lines out of the three bit lines BL0 to BL2 are selectively coupled to the sense amplifier SAR via the switch circuits RSW0 to RSW2. Two bit lines out of the bit lines BL1 to BL3 are coupled to the sense amplifier SAL via the switch circuits LSW0 to LSW2.

The conduction of the switch circuits RSW0 to RSW2 and LSW0 to LSW2 is controlled in a manner similar to the configuration of FIG. 16.

In the second embodiment, two word lines WL0 and WL1 are simultaneously driven to the selected state. Data of selected memory cell connected to the even-number word line WL0 is sensed and amplified by the right sense amplifier SAR via the switch circuits RSW0 and RSW2. On the other hand, data of selected memory cell connected to the odd-number word line WL1 is sensed and amplified by the left sense amplifier SAL via the switch circuits LSW0 and LSW2. In the twin cell mode, therefore, by simultaneously driving two word lines to a selected state, the same page size as that in the single cell mode can be achieved. An overhead of page switching is reduced, and high speed access is realized.

Figure 19:
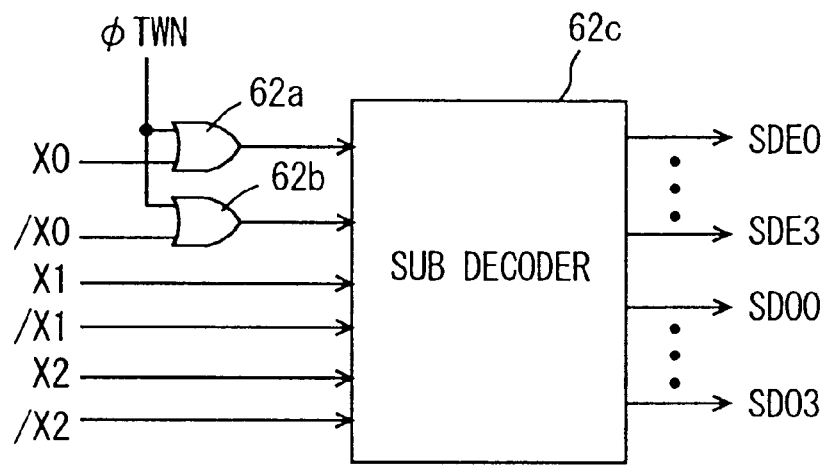
FIG. 19 is a diagram schematically showing the configuration of a portion related to selection of a word line in the second embodiment of the invention.

FIG. 19 is a diagram schematically showing the configuration of the sub decode circuit 62 in the second embodiment. The configuration of a memory sub array shown in FIG. 6 is assumed here for the layout of the memory cells. Eight sub word lines are arranged per main word line.

The sub decode circuit 62 includes: an OR circuit 62a for receiving the twin cell mode instruction signal φTWN and the predecoded signal X0; an OR circuit 62b for receiving the complementary predecoded signal /X0 and the twin cell mode instruction signal φTWN; and a sub decoder 62c for receiving output signals from the OR circuits 62a and 62b and complementary predecoded signals X1, /X1, X2, and /X3 and generating sub decode signals SDE0 to SDE3 and SDO0 to SDO3.

In the single cell mode, the twin cell mode instruction signal φTWN is at the L level, and one of the subdecode signals SDE0 to SDE3 and SDO0 to SDO3 is driven to a selected state in accordance with the predecoded signals X0, /X0 to /X2 of three bits.

In the twin cell mode, the twin cell mode instruction signal φTWN is at the H level, and the output signals of the OR circuits 62a and 62b are at the H level. In the sub decoder 62c, therefore, the predecoded signal X0 is supplied in a degenerated state, one of the even-number sub decode signals SDE0 to SDE3 is driven to a selected state, and one of the odd-number sub decode signals SDO0 to SDO3 is driven to a selected state as well. By simultaneously selecting adjacent sub word lines by the predecoded signal X0, the word lines WL0 and WL1 (sub word lines) shown in FIG. 18 can be simultaneously driven to a selected state. That is, by designating adjacent even-number word lines and odd-number word lines (sub word lines) by the predecoded signals X1, /X1, X2, and /X2, the odd-number and even-number word lines (sub word lines) can be simultaneously driven to a selected state.

The same control to make the sense amplifier active or inactive is performed in the single cell mode and the twin cell mode. The control circuit for the sense amplifier connection switching circuit can use the configurations shown in FIGS. 17A and 17B.

The configuration of simultaneously selecting two word lines can be used similarly in the configuration where four sub word lines are arranged per main word line. By constructing the subdecoder so as to always designate a pair of word lines (sub word lines) having different memory cell positions by degenerating the predecoded signal of one bit, the configuration of driving two word lines (sub word lines) simultaneously to a selected state can be easily realized. Although a sense peak current increases, the refresh interval twice as long as the conventional one can be set. The average current consumption in the standby mode as much as that in the first embodiment can be accordingly achieved.

As described above, according to the second embodiment of the invention, in the twin cell mode, two adjacent word lines (sub word lines) are simultaneously driven to a selected state. Without changing the page size between the single cell mode and the twin cell mode, a high speed access is achieved. In the twin cell mode, complementary memory cell data are transmitted onto bit lines in a pair. Consequently, the long refresh internal can be achieved and accordingly, the average refresh current can be reduced.

Third Embodiment

Figure 20:
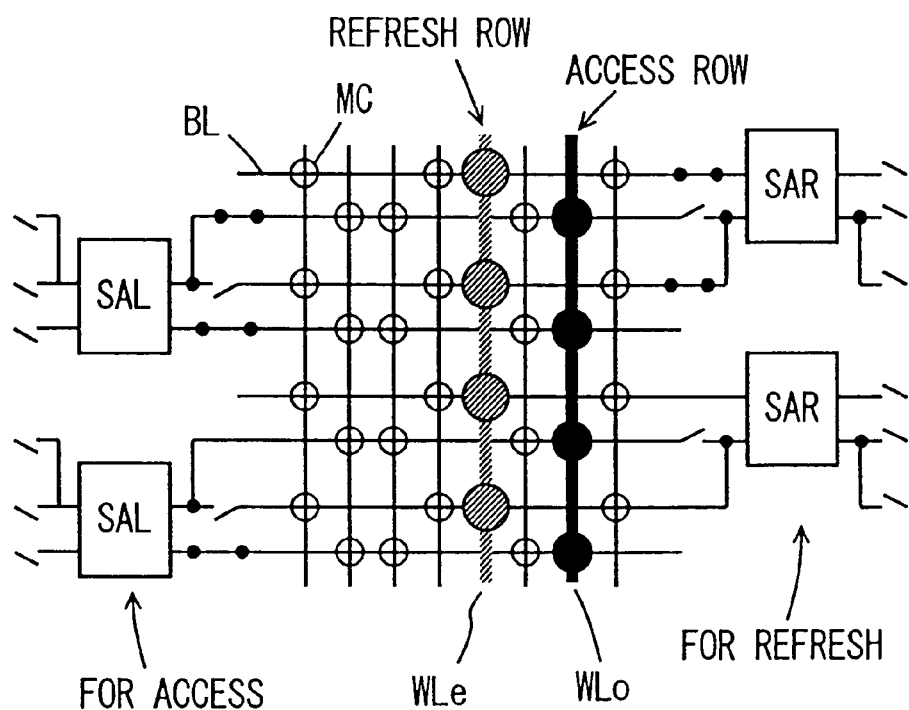
FIG. 20 is a diagram schematically showing the correspondence between a selected word line and an active sense amplifier in a third embodiment of the present invention.

FIG. 20 is a diagram schematically showing a state of a selected word line (sub word line) in a third embodiment of the invention. A case where an odd-number word line (sub word line) WLo is in a selected state, data of the odd-number word line WLo is latched by the left sense amplifier SAL, and data access to the sense amplifier SAL is made will be discussed. When an auto refresh command is applied from outside the memory and an even-number word line WLe is designated as a refresh row, data of memory cells of the even-number word line WLe on the refresh row is refreshed by the right sense amplifier SAR. Specifically, in a state where the data of the odd-number word line WLo is saved and latched in the left sense amplifier SAL, the odd-number word line WLo is made inactive, the even-number word line WLe as a new subject to be refreshed is driven to a selected state, and memory cell data is refreshed by the right sense amplifier SAR. This saving operation is performed for a reason that a plurality of word lines cannot be driven into a selected state at different timings in the same memory block (bank memory array), and row selection operation can be made active or inactive independently only on a bank basis.

Figure 21:
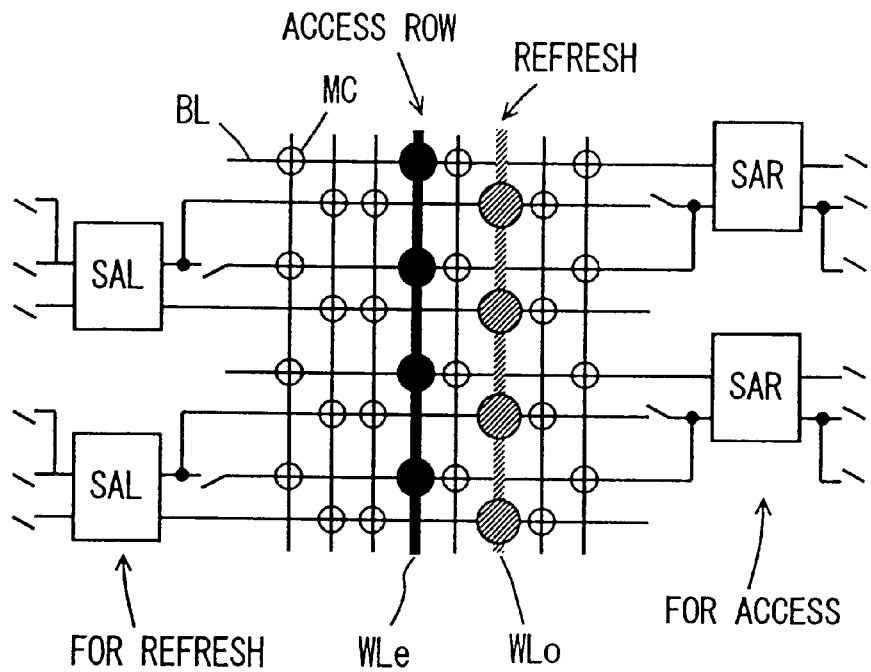
FIG. 21 is a diagram schematically showing another example of the correspondence between a refresh row and an access row in the third embodiment of the invention.

FIG. 21 is a diagram showing another state of a selected word line in the third embodiment of the invention. In FIG. 21, the case of designating auto refresh to an odd-number word line WLo in the state where the even-number word line WLe is selected, and data access is performed on the even-number word line WLe in the twin cell mode will be considered. In this case, data in the even-number word line WLe is transferred to the sense amplifier SAR and latched therein. FIG. 21 shows a state where the data is latched and all of the switch circuits RSW0 to RSW2 are set to a non-conductive state.

Subsequently, the odd-number word line WLo to be refreshed is selected, and data in memory cells selected by the odd-number word line WLo is refreshed by the left sense amplifier SAL.

When the activated word line to be accessed and the word line to be refreshed have the same memory cell connection pattern, data conflict occurs in the sense amplifier. Consequently, in this case, refresh is not performed until the next cycle or a wait signal is sent to the logic to stop the data access and then auto refresh is executed.

Figure 22:
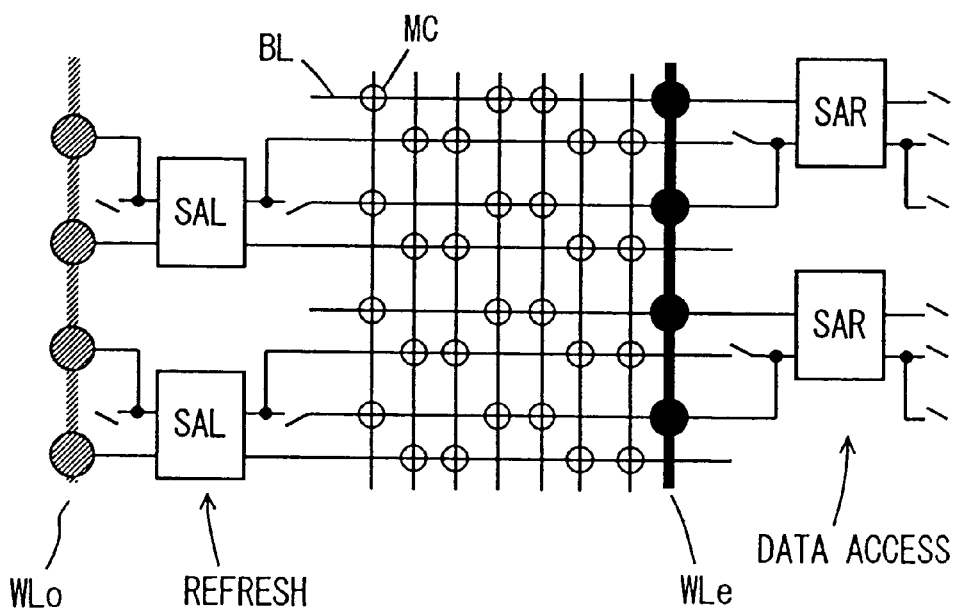
FIG. 22 is a diagram showing another position of the access row and the refresh row in the third embodiment of the present invention.

FIG. 22 is a diagram schematically showing the state of a selected word line in adjacent memory blocks (bank memory arrays). In FIG. 22, a case where refresh to an odd-number word line WLo is designated in an adjacent memory block (bank memory array) in a state where the even-number word line WLe is active and data is latched by the sense amplifier SAR will be considered. In this case, the sense amplifier SAL is made active, and data of memory cells connected to the odd-number word line WLo in the row to be refreshed is refreshed. In memory blocks (bank memory arrays) sharing a sense amplifier band, when the connection pattern of memory cells (layout pattern of memory cells) in an accessed row and that in a row to be refreshed are different from each other, data access and refresh are executed in parallel.

Figure 23:
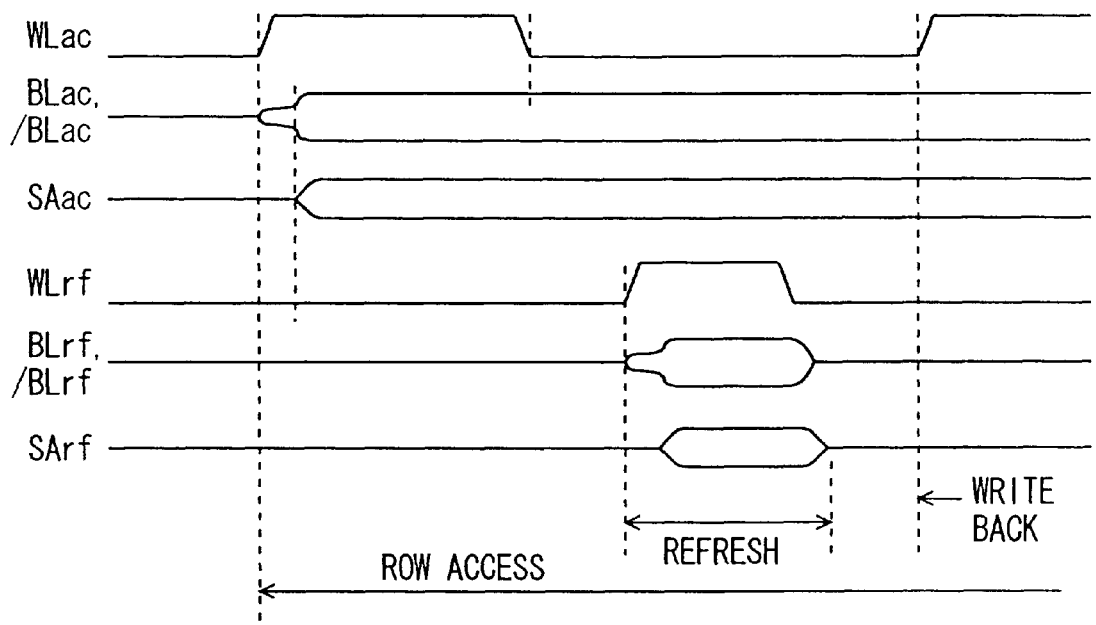
FIG. 23 is a signal waveform diagram representing refreshing and data accessing operations in the third embodiment of the present invention.

FIG. 23 is a diagram schematically showing a potential change in signal lines in the third embodiment of the invention. In FIG. 23, in response to a row access command, the word line WLac is driven to a selected state, and complementary data are read out onto a corresponding pair of bit lines BLac and /BLac. Subsequently, the sense amplifier SAac is activated and a voltage of the corresponding bit line pair is differentially amplified and latched. Accordingly, a write command instructing writing of data and a read command instructing reading of data are applied and data access is performed.

When an auto refresh command is applied in such a state, first, the word line WLac being accessed is once set to a non-selected state. In the non-selected state, when the auto refresh is performed, the word line having the same memory cell connection pattern does not become a refresh target to be refreshed. Consequently, it is unnecessary to particularly isolate the sense amplifier SAac from the bit lines BLac and /BLac.

By the auto refresh command, a word line WLrf to be refreshed is driven to a selected state, and complementary data are read out to the corresponding pair of bit lines BLrf and /BLrf. Subsequently, a sense amplifier SArf in the non-selected state is activated to amplify and latch data of the pair of bit lines BLrf and /BLrf. In such a manner, data of memory cells (memory unit) connected to the word line WLrf is refreshed. After elapse of a predetermined refresh period, the refresh word line WLrf enters a non-selected state, the sense amplifier SArf enters a non-selected state, and the bit lines BLrf and /BLrf return a precharged state.

During the refresh period, data is written or read. In order to write back data, the original word line WLac is driven again to a selected state, and data stored in the sense amplifier SAac is rewritten to the original memory cell connected to the word line WLac.

In the case of accessing and refreshing data in the word lines having different memory connection patterns, therefore, two word lines can be equivalently, simultaneously selected, and refresh can be executed without interrupting data access. A column select gate for writing and reading data is provided adjacent to the sense amplifier. A column access is performed on the upper sense amplifier or lower sense amplifier. Therefore, the column access can be continuously executed to the same sense amplifier band without being interrupted.

In the case where the bit line precharging/equalizing circuit is provided adjacent to a sense amplifier in a sense amplifier band and is shared by adjacent bit lines, it is not particularly necessary to make an activated sense amplifier latch memory cell data for isolation from the memory sub array. However, in the arrangement in which the bit line precharging/equalizing circuit is provided for each bit line pair, and is not shared between adjacent bit lines, the sense amplifier SAac in an active state has to be isolated from the corresponding bit lines BLac and /BLac during the refresh period.

Figure 24:
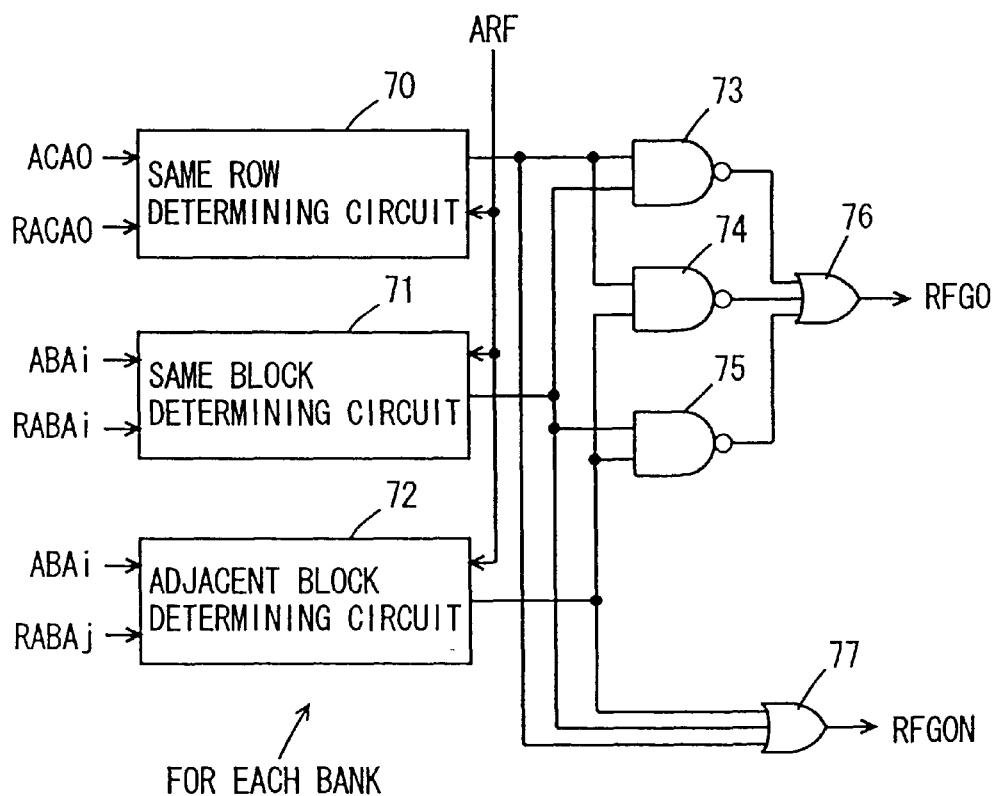
FIG. 24 is a diagram schematically showing the configuration of a portion related to determination on refresh execution in the third embodiment of the present invention.

FIG. 24 is a diagram schematically showing the configuration of a refresh determining circuit. As shown in FIG. 3, a semiconductor memory device has a multi-bank configuration, and a sense amplifier band is shared between different banks. The refresh determining circuit shown in FIG. 24 is therefore provided for each bank. In the case of the single bank configuration, the refresh determining circuit shown in FIG. 24 is so provided as to be shared by a plurality of memory blocks.

In FIG. 24, the refresh determining circuit includes: a same row determining circuit 70 for determining whether or not a least significant active address signal bit ACA0 from the memory outside coincides with a least significant refresh address count bit RACA0; a same block determining circuit 71 for determining whether or not a corresponding bank address signal ABAi coincides with a bank specifying count bit RABAi from the refresh address counter; and a neighboring block determining circuit 72 for determining whether or not the bank address signal ABAi supplied to an adjacent block (bank) coincides with a refresh bank designating count bit RABAj from the refresh address counter. The determining circuits 70 to 72 are activated when an auto refresh instruction signal (auto refresh command) ARF is supplied, and the coincidence determining operation is executed. Since the auto refresh command is supplied in a bank basis, the auto refresh command ARF has also the bank specifying function.

Whether a word line being accessed is an even-number word line or odd-number word line is determined by the least significant active address signal bit ACA0. The predecoded signal X0 is generated on the basis of the active address signal ACA0. The predecoded signal X0 may be therefore used for the determination. When the refresh address count bit RACA0 and the active address signal bit ACA0 coincide with each other, a word line having the same memory connection pattern as that of a word line of which data is being accessed is specified as a row to be refreshed.

As for determination by the same block determination circuit 71, when the bank address signal ABAi for designating its own block (bank) itself is active and the bank address signal RABAi supplied from the refresh address counter specifies its own block (bank), that is, the refresh bank address signal RABAi obtained by decoding the most significant count bit of the refresh address counter also becomes active, the same block determining circuit 71 determines that the data access and refresh are made to the same block (bank).

The neighboring block determining circuit 72 determines that refresh to an adjacent block is designated when the active bank address signal ABAi is in an active state and a refresh bank address signal (refresh block address signal) RABAj obtained by decoding, for example, most significant three bits (in the case of an eight bank configuration) of the refresh address counter becomes active.

The neighboring block determining circuit 72 therefore determines whether refresh is designated to the upper memory block (bank) or the lower block (bank) with respect to one bank. In the determining operation, permission/inhibition of the refresh for each bank is determined according to a bank address signal assigned to each bank.

The refresh determining circuit further includes: an NAND circuit 73 for receiving a determination result signal of the same row determining circuit 70 and a determination result signal of the same block determining circuit 71; an NAND circuit 74 for receiving a determination result signal of the same row determining circuit 70 and a determination result signal of the neighboring block determining circuit 72; an NAND circuit 75 for receiving determination result signals from the same block determining circuit 71 and the neighboring block determining circuit 72; an OR circuit 76 for receiving output signals of the NAND circuits 73 to 75 and outputting a refresh execution permission signal RFGO; and an OR circuit 77 for receiving determination result signals of the determining circuits 70 to 72 and outputting a refresh inhibition signal RFGON.

Upon detection of coincidence, each of the determining circuits 70 to 72 outputs a signal of the H level. The NAND circuit 73 outputs a signal of the L level when a word line being accessed and a word line requested for refreshing have the same connection pattern in the same block (memory bank array). The NAND circuit 74 outputs a signal of the L level when a refresh request is applied to the word line having the same memory cell connection pattern in the adjacent block (bank). The NAND circuit 75 outputs a signal of the L level when the block (bank) to be refreshed is the same or adjacent block. When those conditions are not satisfied, the refresh permission signal RFGO from the OR circuit 76 goes high and refresh is executed.

Consequently, when the following condition is satisfied, the refresh execution inhibition signal RFGON goes high, refresh is not performed until the next cycle or a wait signal is sent to the logic and then refresh is executed.

The condition is that word lines having the same memory cell connection pattern in the same block (bank) or adjacent blocks (banks) are to be accessed and refreshed.

Specifically, refresh is internally executed without stopping the data access in the following three cases:

(1) a case where an even-number word line and an odd-number word line are accessed and refreshed in the same block (bank);

(2) a case where an even-number word line and an odd-number word line are accessed and refreshed in adjacent blocks (banks); and (3) a case where refresh and data access is performed in memory blocks in places other than the same block (bank) or adjacent blocks (banks).

In the case of a so-called block division (partial activation) configuration, not the bank configuration, it is sufficient to use a block selection signal BASi in place of the bank address signal ABAi. In the block division configuration as well, it is unnecessary to actually activate word lines at different timings so as to bring two word lines simultaneously in a selected state, refresh can be executed without interrupting data access. By selecting a row to be refreshed under a state where data to be accessed is latched by the sense amplifier, equivalently, a row to be accessed and a row to be refreshed are simultaneously driven to a selected state by the sense amplifiers, and data access and refresh are executed.

Figure 25:
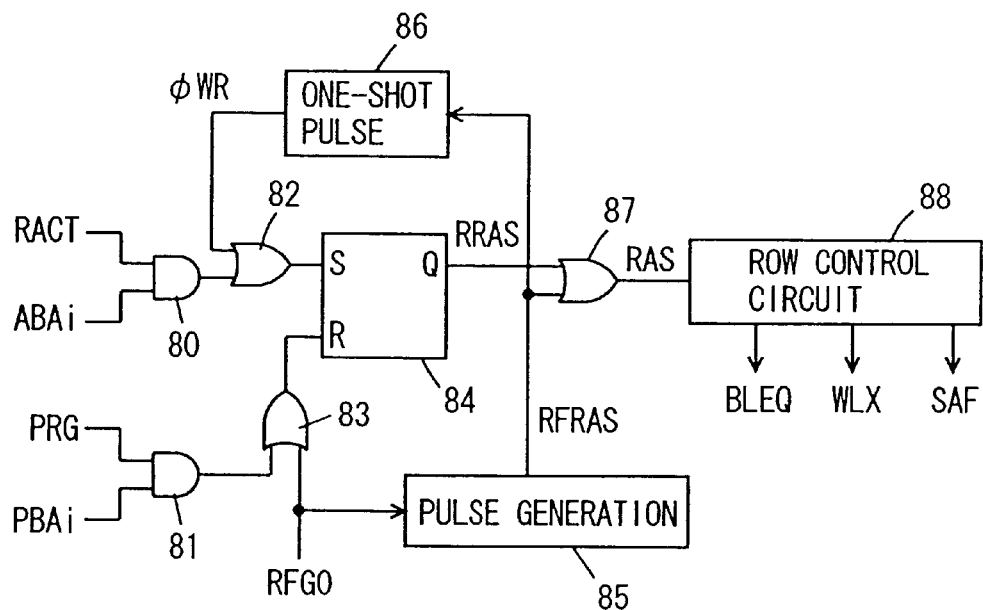
FIG. 25 is a diagram schematically showing the configuration of a portion related to selection of a row in the third embodiment of the present invention.

FIG. 25 is a diagram schematically showing the configuration of a bank control circuitry. FIG. 25 shows the configuration related to a bank specified by one active bank address signal ABAi. In FIG. 25, the bank control circuitry includes: an AND circuit 80 for receiving a row active command RACT for instructing row selection and the active bank address signal ABAi; an AND circuit 81 for receiving the precharge command PRG for instructing precharge of an array and a precharge bank address PBAi; an OR circuit 83 for receiving an output signal of the AND circuit 81 and the refresh execution permission signal RFGO; an OR circuit 82 for receiving a write back instruction signal φWR and an output signal of the AND circuit 80; a set/reset flip flop 84 set in response to the rising edge of an output signal of the OR circuit 82 and reset in response to the falling edge of an output signal of the OR circuit 83; a pulse generating circuit 85 for generating a pulse signal RFRAS having a predetermined time width in accordance with the refresh execution permission signal RFGO; an OR circuit 87 for receiving an output signal RRAS of the set/reset flip flop 84 and a pulse signal RFRAS outputted from the pulse generating circuit 85 and generating an internal array activating signal RAS; a row control circuit 88 for sequentially activating a bit line precharging/equalizing instruction signal BLEQ, a word line driving timing signal WLX, and a sense amplifier enable fast signal SAF in accordance with the array activating signal RAS from the OR circuit 87; and a one-shot pulse generating circuit 86 for generating the write back instruction signal φWR of one shot after elapse of predetermined time in response to inactivation of the pulse signal RFRAS from the pulse generating circuit 85 for application to the OR circuit 82.

Figure 26:
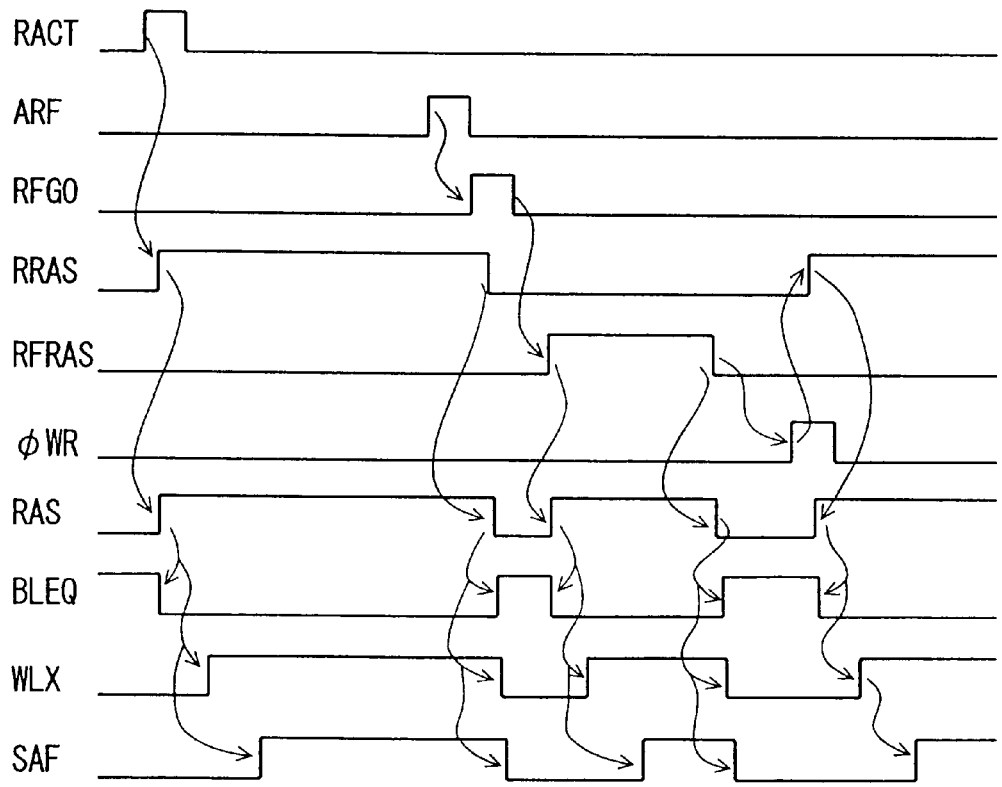
FIG. 26 is a signal waveform diagram representing the operations of the circuit shown in FIG. 25.

The pulse generating circuit 85 generates the pulse signal RFRAS of one shot having a time width necessary for refresh. After completion of the refreshing operation, that is, after completion of a so-called RAS precharge period, the one-shot pulse generating circuit 86 generates the write back instruction signal φWR in the form of one shot pulse. The operation of the bank control circuitry shown in FIG. 25 will be described with reference to the signal waveform diagram shown in FIG. 26.

First, the row active command RACT is supplied. When the active bank address signal ABAi is at the H level, the output signal of the AND circuit 80 becomes high, the set/reset flip flop 84 is set, and the output signal RRAS of the set/reset flip flop 84. Responsively, the array activating signal RAS from the OR circuit 87 goes high. Accordingly, first, the row control circuit 88 lowers the bit line precharging/equalizing instruction signal BLEQ to the L level, raises a word line driving timing signal WLX to the H level and then, activates the sense amplifier enable fast signal SAF to the H level. In such a manner, the word line corresponding to an addressed row in a selected memory block (bank) is driven to a selected state. Data of memory cells connected to the selected word line is sensed, amplified, and latched by a corresponding sense amplifier.

When the auto refresh command ARF instructing the refreshing operation is applied in a column access in this above state, first, by the refresh determining circuit shown in FIG. 24, the permission/inhibition of the refresh is determined. In the case where the refresh is performed, the refresh execution permission signal RFGO goes high, the set/reset flip flop 84 is reset, and the output signal RRAS of the set/reset flip flop 84 goes low. Accordingly, the array activating signal RAS from the OR circuit 87 goes low, and the row control circuit 88 sequentially drives the word line driving timing signal WLX and the sense amplifier enable fast signal SAF into an inactive state, to return the corresponding memory block (bank memory array) to a precharged state, and sets the bit line precharging/equalizing instruction signal BLEQ to the H level.

After the precharging operation by the row control circuit 88 is completed, the pulse signal RFRAS from the pulse generating circuit 85 is made active. According to the pulse signal RFRAS, the array activating signal RAS goes high again. By the row control circuit 88, the bit line precharging/ equalizing instruction signal BLEQ goes low again, and the word line driving timing signal WLX and the sense amplifier enable fast signal SAF are sequentially activated. When the pulse signal RFRAS goes low, the refreshing operation is completed. Accordingly, the array activating signal RAS goes low, and the memory block (bank memory array) goes back to the precharged state again. After elapse of predetermined time period since the pulse signal RFRAS goes low, the write back instruction signal φWR from the one-shot pulse generating circuit 86 goes high again, the set/reset flip flop 84 is set, the output signal RRAS of the set/reset flip flop 84 goes high, and the array activating signal RAS is activated. By the write back operation, the word line being accessed by the write back operation is driven again to the selected state, and data is rewritten to an original memory cell. In such a manner, the refresh can be executed internally without exerting an adverse influence on the column access operation. It is constructed such that even when the array activating signal is made inactive, the column selecting operation is performed at the time of the "hidden refresh" operation as described above. This is easily implemented by maintaining active the array activating signal applied to a circuit for controlling the column accessing operation when the refresh execution permission signal RFGO is active.

Figure 27:
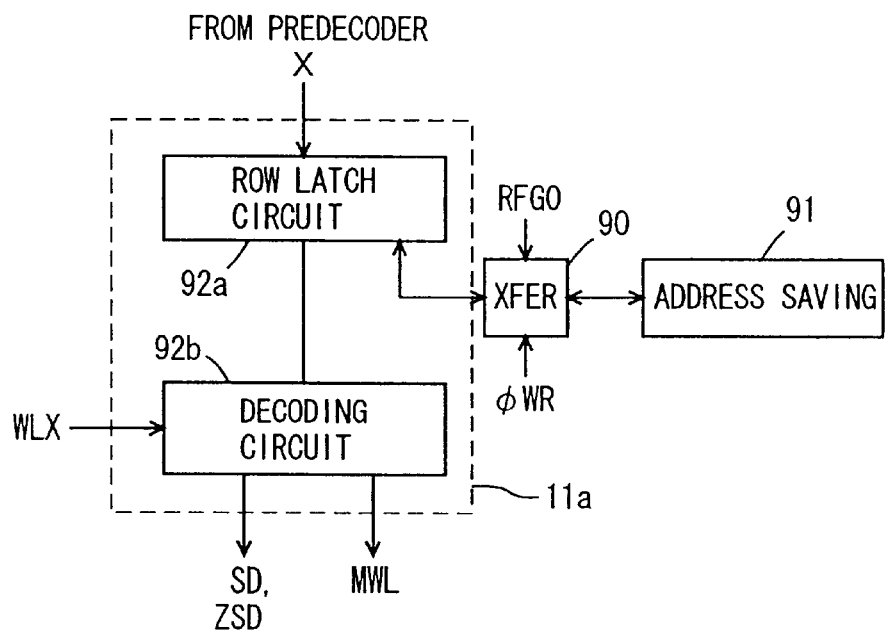
FIG. 27 is a diagram schematically showing the configuration of a portion related to a row decoding circuit in the third embodiment of the invention.

FIG. 27 is a diagram schematically showing the configuration of a portion of the row decoding circuit Ha in the third embodiment of the present invention. In FIG. 27, the row decoding circuit 11a includes: a row latch circuit 92a for latching the predecoded signal supplied from a predecoder; and a decoding circuit 92b for decoding an output signal from the row latch circuit 92a, driving the main word line MWL corresponding to an addressed row into the selected state at a timing determined by the word line driving timing signal WLX, and generating the sub decode signals SD and ZSD. The row latch circuit 92a enters a latch state in accordance with the array activating signal RAS.

The row decoding circuit 11a is provided with an address saving circuit 91 constructed by a latch circuit and a bidirectional transferring circuit (XFR) 90 for transferring an output signal of the row latch circuit 92a to the address saving circuit 91 when the refresh execution permission signal RFGO is made active, and transferring a signal stored in the address saving circuit 91 to the row latch circuit 92a when the write back instruction signal φWR is made active. The bidirectional transferring circuit 90 bidirectionally transfers a signal of the latching node in the row latch circuit 92a.

In the row decoding circuit 11a shown in FIG. 27, when the row active command is applied, the predecoded signal X from a not-shown predecoder is latched by the row latch circuit 92a, and the decoding circuit 92b performs the decoding operation. By providing the row latch circuit 92a, the predecoder can be shared by a plurality of banks. By the decoding circuit 92b, the word line (sub word line) corresponding to an addressed row is driven to the selected state synchronously with the word line driving timing signal WLX.

In the case of executing refresh in the background during an access, the predecoded signal latched by the row latch circuit 92a is transferred to the address saving circuit 91 via the transfer circuit 90. In such a state, the row latch circuit 92a and the decoding circuit 92b return back to the precharged state once, and a row to be refreshed is driven to the selected state in accordance with the refresh address. After completion of the refreshing operation, the write back instruction signal φWR is made active, the latched predecoded signal of the row latch circuit 92a is set according to the signal stored in the address saving circuit 91, and the word line (sub word line and main word line) corresponding to the row designated immediately before the refreshing by the row active command is driven again to the selected state.

Figure 28:
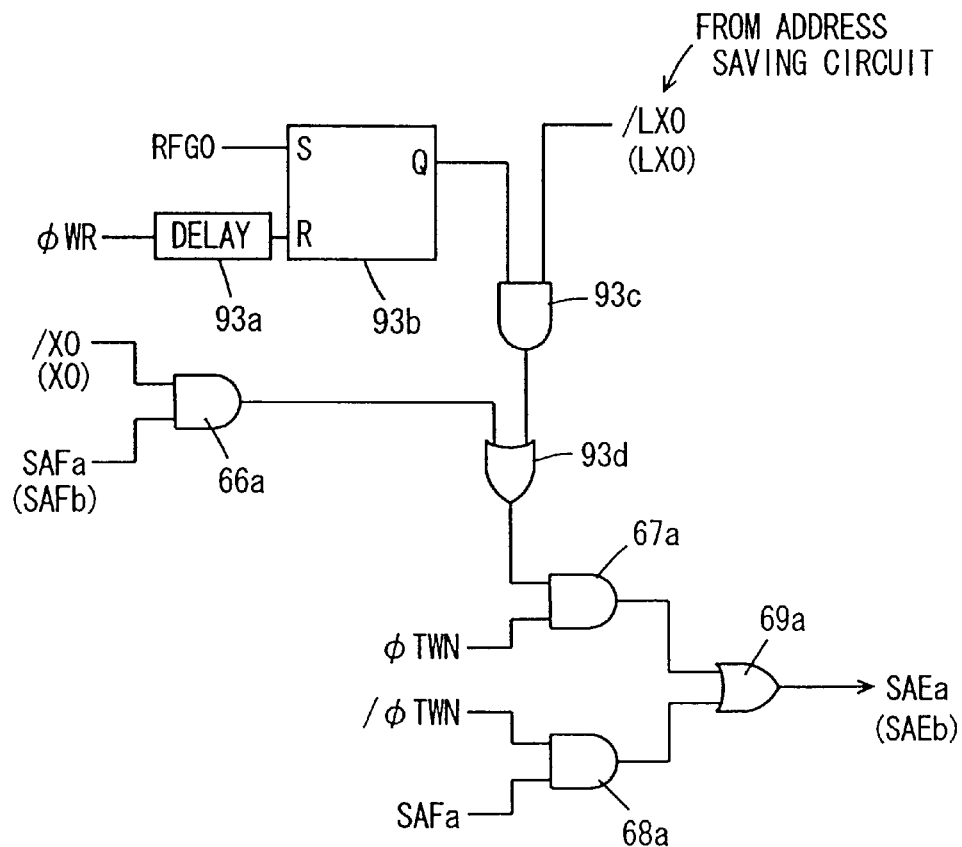
FIG. 28 is a diagram schematically showing the configuration of a sense amplifier control circuit in the third embodiment of the present invention.

FIG. 28 is a diagram showing the configuration of the sense amplifier control circuit. In FIG. 28, in addition to the configuration shown in FIG. 17A, the sense amplifier control circuit further includes: a delay circuit 93a for delaying the write back instruction signal φWR by a predetermined time; a set/reset flip flop 93b set in response to the rising edge of the refresh execution permission signal RFGO and reset in response to the rising edge of the delay circuit 93a; an AND circuit 93c for receiving an output signal of the set/reset flip flop 93b and the least significant predecoded signal /LX0 from the address saving circuit 91 shown in FIG. 27; and an OR circuit 93d for receiving output signals from the AND circuits 66a and 93c. An output signal of the OR circuit 93d is supplied to the AND circuit 67a receiving the twin cell mode instruction signal φTWN at its first input terminal.

The sense amplifier control circuit shown in FIG. 28 generates the sense amplifier activating signal SAEa to the sense amplifier SAa, which in turn corresponds to an odd-number word line designated when the predecoded signal /X0 is at the H level. Before the execution of the refresh in the background, when the sense amplifier activating signal SAEa is at the H level, the complementary predecoded signal /X0 is at the H level. When the predecoded signal /X0 is saved in the address saving circuit 91 in accordance with the refresh execution permission signal RFGO, the saved predecoded signal /LX0 goes high accordingly. Since the set/reset flip flop 93b is set in response to the refresh execution permission signal RFGO, the AND circuit 93c outputs a signal of the H level. By completing the saving operation before the sense amplifier enable fast signal SAFa becomes inactive, the sense amplifier activating signal SAEa can be automatically held active. In this case, even when the sense amplifier enable fast signal SAFa is made inactive, the sense amplifier activating signal SAEa is maintained active by the set/reset flip flop 93b.

In the case of executing the write back operation after completion of the refresh operation, the write back instruction signal φWR is made active. According to the write back instruction signal φWR, the word line selection is performed, and the sense amplifier enable fast signal SAFa is driven again to the active state. By this time, an operation of loading the address signal (predecoded signal) from the address saving circuit 91 to the row latch circuit 92a (refer to FIG. 27) is completed. Consequently, the output signal of the AND circuit 66a goes high in response to the rising edge of the sense amplifier enable fast signal SAFa. Subsequently, an output signal from the delay circuit 93a goes high, and the set/reset flip flop 93b is reset. After the write back operation, therefore, according to the sense amplifier enable fast signal SAFa, the sense amplifier activating signal SAEa is made active.

When the sense amplifier activating signal SAEa is inactive before the refreshing operation, the predecoded signal /X0 (X0) is at the L level. At the time of execution of the refresh, the predecoded signal /X0 goes high. In such a state, even when the latched predecoded signal /LX0 is at the L level, the sense amplifier activating signal SAEa can be activated according to the sense amplifier enable fast signal SAFa by the AND circuit 66a.

In the case of executing auto refresh in the not-selected state, the predecoded signal is at the L level in a non-selected bank, and the sense amplifier enable fast signal SAFa is activated in accordance with the array activating signal generated in response to the refresh instruction.

While maintaining the sense amplifier for latching access data in an active state, the refreshing operation can be executed with an unused sense amplifier, in the background of the data access.

The sense amplifier activating signal SAEb is generated by using the predecoded signal X0 and the sense amplifier enable fast signal SAFb in the configuration of FIG. 28.

Figure 29:
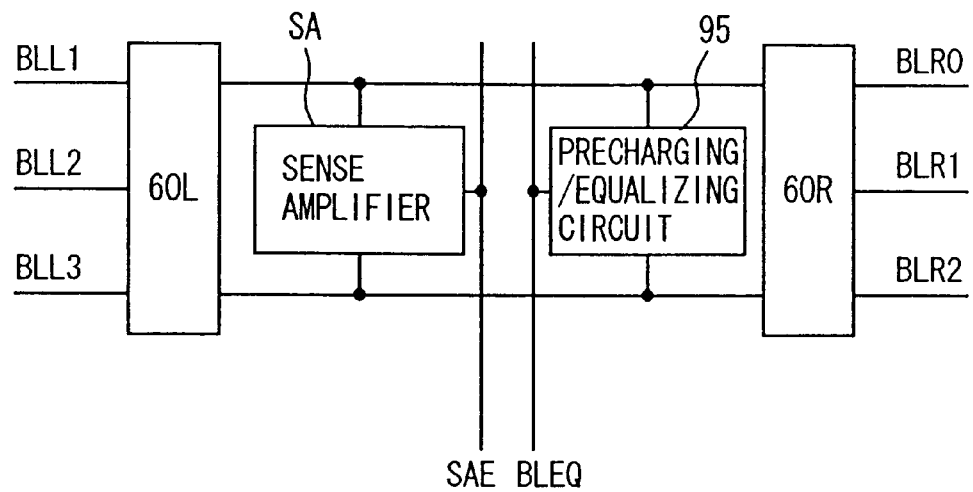
FIG. 29 is a diagram schematically showing the positions of a sense amplifier circuit and a bit line precharging/equalizing circuit in the third embodiment of the present invention.

FIG. 29 is a diagram schematically showing the configuration of a sense amplifier and its peripheral circuitry. The sense amplifier SA starts the sensing operation when the sense amplifier activating signal SAE is activated to the H level. A precharging/equalizing circuit 95 is provided adjacent to the sense amplifier SA. The sense amplifier SA and the bit line precharging/equalizing circuit 95 are selectively connected to two bit lines out of three bit lines BLR0, BLR1, and BLR2 and to two bit lines out of three bit lines BLL1, BLL2, and BLL3 via bit line connection switching circuits 60R and 60L, respectively.

The precharging/equalizing circuit 95 is shared by the bit lines BLR0 to BLR2 and BLL1 to BLL3 on both sides thereof in a manner similar to the sense amplifier SA. In this case, the bit line precharging/equalizing circuit 95 has to have the precharging operation at the time of the refreshing operation controlled in a manner reverse to the activation/inactivation control manner of the sense amplifier SA. That is, when the corresponding sense amplifier SA is active, the bit line precharging/equalizing circuit 95 has to be maintained inactive.

Figure 30:
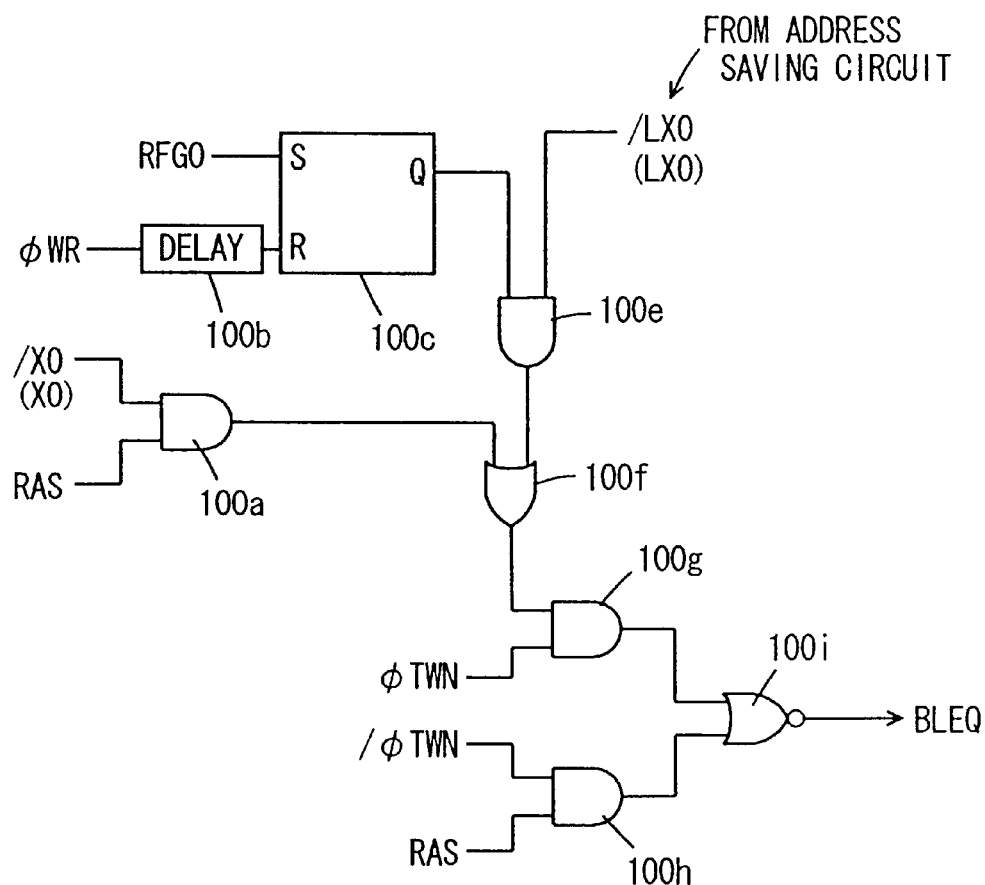
FIG. 30 is a diagram showing an example of the configuration of a bit line precharging/equalizing control circuit in the third embodiment of the present invention.

FIG. 30 is a diagram showing an example of the configuration of a precharging/equalizing control circuit for generating a bit line precharge/equalization instruction signal. In FIG. 30, the precharging/equalizing control circuit includes: an AND circuit 100a for receiving the predecoded signal /X0 (or X0) and the array activating signal RAS; a delay circuit 100b for delaying the write back instruction signal φWR by a predetermined time; a set/reset flip flop 100c set in response to the rising edge of the refresh execution permission signal RFGO and reset in response to an output signal of the delay circuit 100b; an AND circuit 100e for receiving an output signal of the set/reset flip flop 100c and the latched predecoded signal /LX0 (or LX0) from the address saving circuit; an OR circuit 100f for receiving output signals of the AND circuits 100a and 100e; an AND circuit 100g for receiving an output signal of the OR circuit 100f and the twin cell mode instruction signal φTWN; an AND circuit 100h for receiving the complementary twin cell mode instruction signal /φTWN and the array active signal RAS; and an NOR circuit 100i for receiving output signals of the AND circuits 100g and 100h and generating the bit line precharging/equalization instruction signal BLEQ.

In the single cell mode, an output signal of the AND circuit 100g is fixed at the L level. In this case, when the array activating signal RAS is made active, the bit line precharging/equalization instruction signal BLEQ is made inactive by the NOR circuit 100i, and the bit line precharging and equalizing operation is completed.

In the twin cell mode, an output signal of the AND circuit 100h is fixed at the L level. When the array activating signal RAS is made active, an output signal of the AND circuit 100a goes high according to the corresponding predecoded signal /X0 or X0, and the bit line precharge/equalization instruction signal BLEQ goes low responsively. When the predecoded signal /X0 is at the H level, the corresponding sense amplifier SA is made active. At this time, the corresponding bit line precharge/equalization instruction signal BLEQ is made inactive.

In the case of executing the refresh in the background during the data access, first, according to the refresh execution permission signal RFGO, an output signal of the set/reset flip flop 100c goes high. When the predecoded signal /LX0 from the address saving circuit is at the H level, an output signal of the AND circuit 100e goes high responsively, and an output signal of the OR circuit 100f goes high. In this case, therefore, when the refresh execution permission signal RFGO is made active, the bit line precharge/equalization instruction signal BLEQ is held in an inactive state of the L level, and the corresponding sense amplifier maintains the active state. In such a manner, the saved data can be held in the sense amplifier with reliability.

When the write back instruction signal φWL is made active, the output signal of the set/reset flip flop 100c goes low, and the output signal of the AND circuit 100e goes low. In this case, according to the array activate signal RAS again, in the write back operation, the corresponding predecoded signal /X0 or X0 goes high, an output signal of the AND circuit 100a goes high, and responsively, an output signal of the OR circuit 100f goes high. In this state as well, therefore, the bit line precharge/equalization instruction signal BLEQ maintains at the L level, and an adverse influence is not exerted on the data retaining operation of the sense amplifier.

In the case of performing the refreshing operation in the background when the bit line precharge/equalization instruction signal BLEQ is at the H level, even when the set/reset flip flop 100c is set, the latched predecoded signal LX0 from the address saving circuit is at the L level, and an output signal of the AND circuit 100e is at the L level. In such a state, therefore, the output signal of the AND circuit 100a goes high in accordance with the array activating signal RAS and the predecoded signal /X0 or X0 of the refresh address signal, the bit line precharge/equalization instruction signal BLEQ goes low, and the sensing operation and refresh can be performed.

Different from the configuration that the bit line precharging/equalizing circuit 95 is shared by the memory blocks (banks) on both sides thereof as shown in FIG. 29, when the bit line precharging/equalizing circuit 95 is provided in correspondence to each bit line pair of the memory block (bank memory array), it is sufficient to simply control the bit line precharging/equalization instruction signal BLEQ to be active or inactive in accordance with the array activating signal RAS. Although the bit line isolation instruction signal BIL has to be controlled, in this case, to be forcedly made inactive to render the bit line isolation gate nonconductive by an output signal of the AND circuit 100e shown in FIG. 30, the configuration for isolating the sense amplifier being in a data latching state from a bit line can be easily implemented.

As described above, according to the third embodiment of the present invention, the refresh and data access is performed simultaneously on memory blocks (bank memory arrays) which are apart from each other by one or more memory blocks (memory banks) or on word lines having different memory cell connection patterns. Without interruption of the data access, refresh can be performed. Thus, high speed access can be achieved.

When the background refresh could not be permitted, the refresh execution inhibition signal RFGON is supplied to a logic on the memory outside. The access is suspended and refresh is performed under the control of the logic on the outside, or the refresh is not performed until the next refresh cycle in such a case.

Fourth Embodiment

Figure 31A:
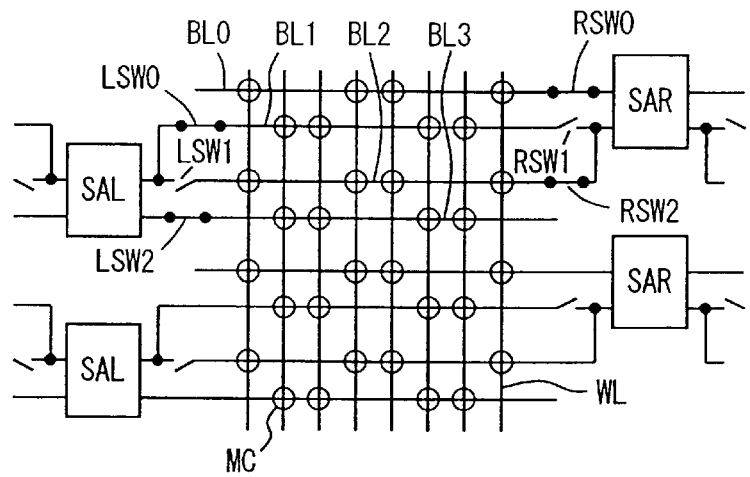
FIGS. 31A to 31C are diagrams illustrating data saving operation in a fourth embodiment of the present invention.

FIG. 31A is a diagram schematically showing the state of a memory sub array in the standby state of a semiconductor memory device according to a fourth embodiment of the present invention. In FIG. 31A, the twin cell mode is set, the bit lines BL0 and BL2 are coupled to the sense amplifier SAR via switch circuits RSW0 and RSW2, and the bit lines BL1 and BL3 are coupled to the sense amplifier SAL via switch circuits LSW0 and LSW2.

The word line WL is in a non-selected state, and accordingly the memory cell MC is in a non-selected state. Switch circuits LSW1 and RSW1 are in an OFF state. In a standby state, the bit lines BL0 to BL3 are precharged and equalized to an intermediate voltage level.

Figure 31B:
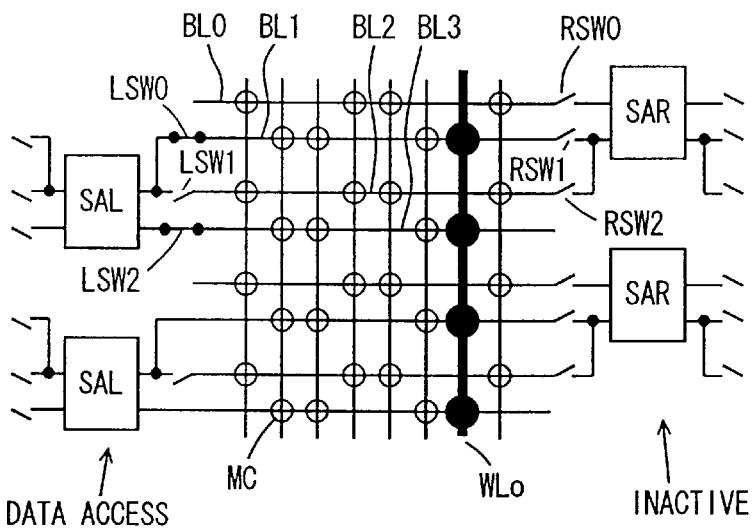

In FIG. 31B, when an active cycle starts and an odd-number word line WLo is selected, data in the memory cells MC connected to the odd-number word line WLo is transferred to the sense amplifier SAL via the switch circuits LSW0 and LSW2, and amplified and latched by the sense amplifier SAL. The data access is made on the sense amplifier SAL on the left side. On the other hand, the sense amplifier SAR on the right side maintains an inactive state, and all of the switch circuits RSW0 to RSW2 are in a nonconductive state.

Figure 31C:
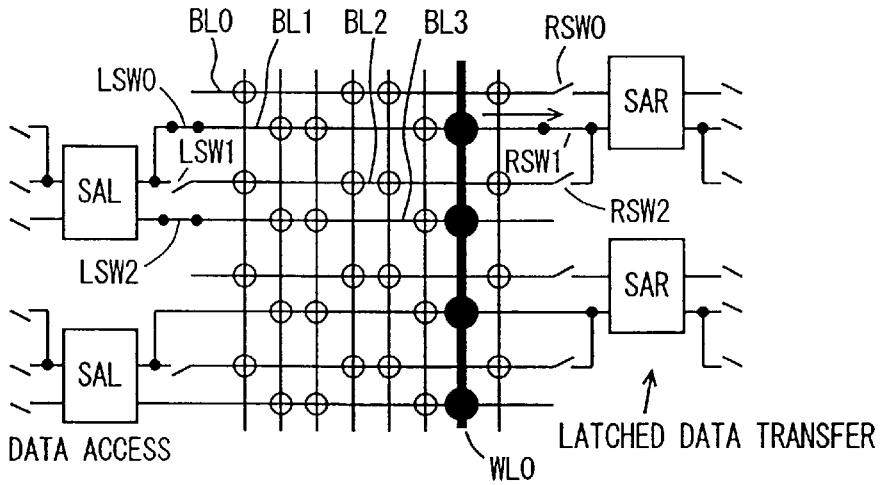

In FIG. 31C, when a refresh request to another odd-number word line is generated, the switch circuit RSW1 is made conductive, and data latched in the sense amplifier SAL is transferred to the sense amplifier SAR via the bit line BL1. Subsequently, the sense amplifier SAR is activated, and data in the memory cells of the odd-number word line WLo are latched by the sense amplifiers SAR. The data access during the transfer operation is executed to the sense amplifier SAL. After completion of transference of data, the data access is executed to the sense amplifier SAR.

Figure 32A:
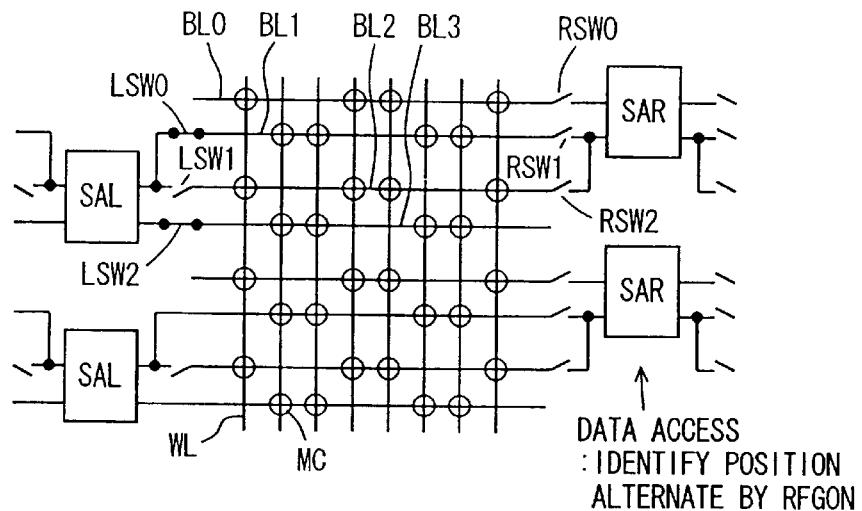
FIGS. 32A to 32C are diagrams illustrating refreshing operation in the fourth embodiment of the present invention.

As shown in FIG. 32A, after transferring data of the word line WLo to the sense amplifiers SAR, the sense amplifiers SAL are made inactive, and all of the switch circuits RSWL0 to RSWL2 are turned off, thereby isolating the sense amplifier SAR from the bit lines BL0 to BL2. Subsequently, the memory sub array is returned back to the precharged state, and the precharging and equalizing operation on the bit lines BL0 to BL3 is performed.

In the bit line precharging and equalizing operation, when the bit line precharging/equalizing circuit is provided adjacent to the sense amplifier in the sense amplifier band, although the precharging/equalizing operation on the bit lines BL0 and BL2 cannot be performed, the word line to be selected next is an odd-number word line. The bit line onto which memory cell data is read can be precharged and equalized to the intermediate voltage level by the precharging/equalizing circuit adjacent to the sense amplifier SAL, and a problem does not particularly occur. When the bit line precharging/equalizing circuit is provided for each bit line pair, all of the switch circuits RSW0 to RSW2 are in the OFF state. Without influencing the data latched by the sense amplifier SAR, all of the bit lines BL0 to BL3 can be precharged and equalized to the intermediate voltage level. Any of the previously described configurations can be used.

The data latched in the sense amplifiers SAR are accessed under the above state. Since the sense amplifier to be accessed is switched, the position of the column decoding circuit to be activated with respect to the upper and lower column decoding circuits is alternated. In this case, the refresh execution inhibition signal RFGON described in the third embodiment is used as a same row refresh identification flag in the fourth embodiment. By using the flag RFGON, the sense amplifier to be accessed is switched from the sense amplifier SAL to the sense amplifier SAR, or vice versa. The switching operation is performed internally. An external logic can access data irrespective of the position switching.

Figure 32B:
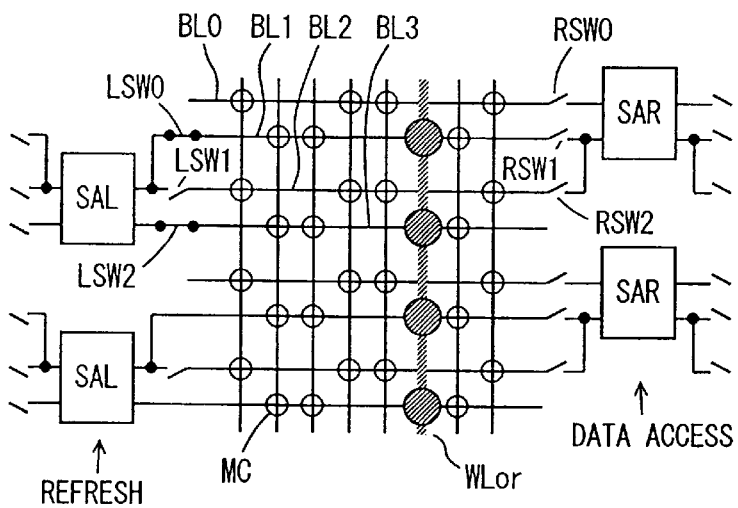

As shown in FIG. 32B, according to the refresh address, a word line WLor is driven to a selected state, a sensing operation is performed by the sense amplifier SAL, and data of memory cells connected to the word line WLor are refreshed. In the sense amplifiers SAR, the previous data of the accessed word line WLo are latched, and the data in the sense amplifiers SAR are accessed. In the refreshing operation as well, the switch circuits RSW0 to RSW2 are in the OFF state. Even when memory cell data of the word line WLor of a refresh row is read out onto the bit lines BL1 and BL3, no adverse influence is exerted on the data latched in the sense amplifiers SAR.

Figure 32C:
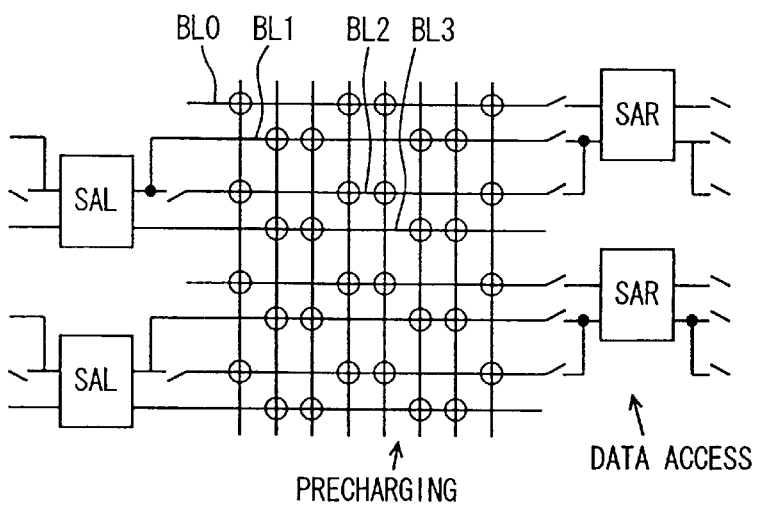

After completion of the refreshing operation, as shown in FIG. 32C, a precharging operation is performed to make the sense amplifier SAL inactive. At least, the bit lines BL1 and BL3 are precharged to an intermediate voltage level. The bit lines BL0 and BL2 are either precharged or maintained in the floating state depending on the arrangemnet of the bit line precharging/equalizing circuit. In the precharged state, the data in the sense amplifier SAR is accessed as well.

Figure 33A:
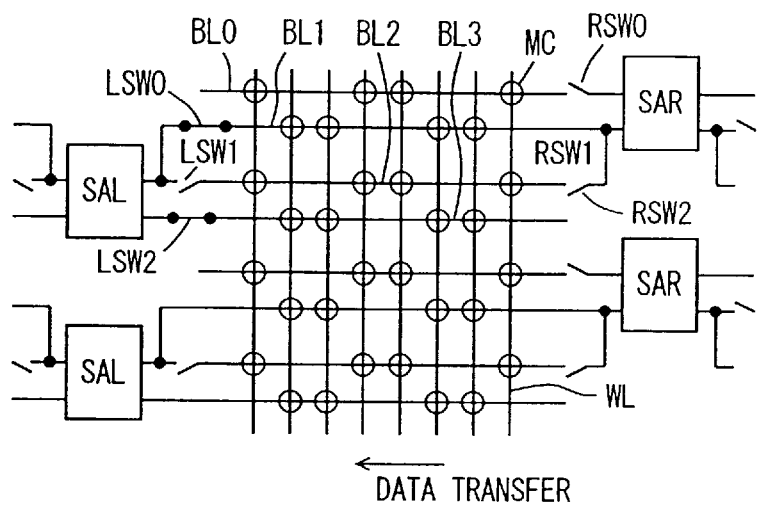
FIGS. 33A to 33C are diagrams illustrating write-back operation in the fourth embodiment of the present invention.

As shown in FIG. 33A, the switch circuit RSW1 is turned on again, and the data latched by the sense amplifier SAR is transferred to the sense amplifier SAL via the bit line BL1 and the switch circuit LSW0.

Figure 33B:
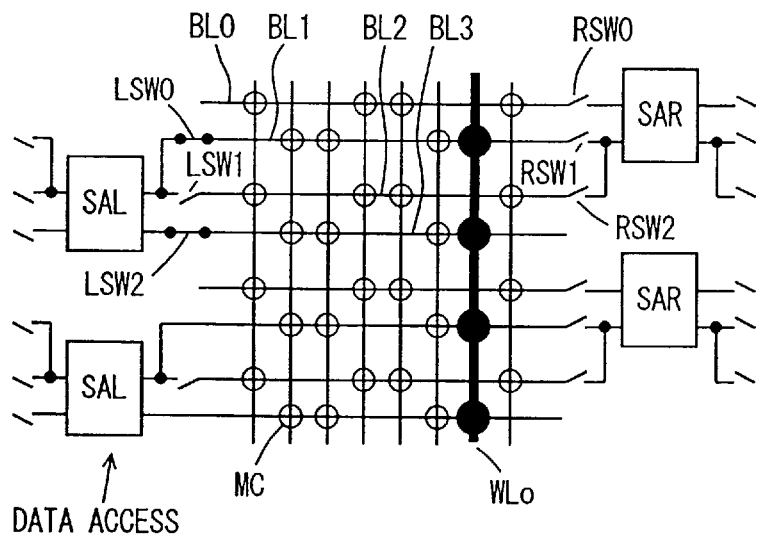

As shown in FIG. 33B, the original word line WLo to be accessed is driven to a selected state, and data are rewritten to the memory cells connected to the word line WLo (write back operation). At this time, the sense amplifier SAL is activated again, and after completion of the write back, data in the sense amplifier SAL is accessed. The sense amplifier SAR may be maintained in the active state or in the inactive state. When the sense amplifier SAR is maintained in the active state and an odd-number row has to be refreshed again, data transfer to the sense amplifier SAR is stopped to perform a data access. The sense amplifier SAR may be driven to an inactive state after completion of the write back operation.

The operation (write back operation) of transferring data from the sense amplifier SAR to the sense amplifier SAL may not be performed. When the original word line WLo is selected, the sense amplifier SAL is made active to amplify and latch the memory cell data according to the word line selecting operation sequence. After that, the data access to the sense amplifier SAL can be successively performed. By transferring data for the write back, a data definition timing of the sense amplifier can be set accurately. A timing of switching the sense amplifier of which data is accessed can be set accurately.

Figure 33C:
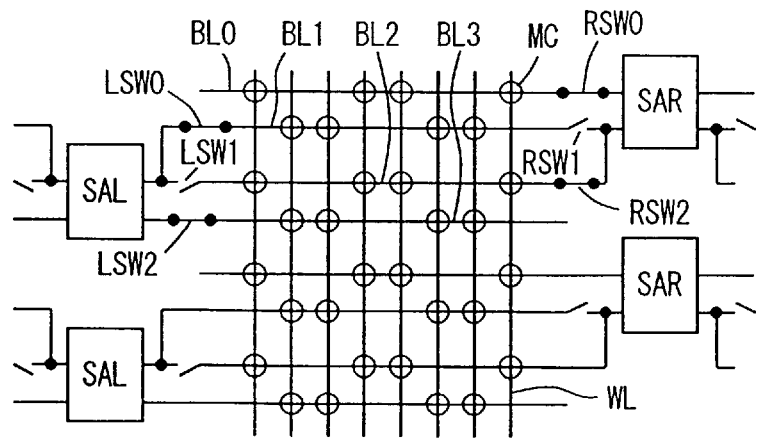

After completion of an access to the word line WLo, as shown in FIG. 33C, the sense amplifiers SAL and SAR are made inactive, and the bit lines BL0 to BL3 are returned back to a precharged state.

FIGS. 31A to 33C illustrate the refreshing operation performed when the odd-number word line WLo is active. In the case of refreshing an even-number word line when the even-number word line is selected, data is transferred from the sense amplifier SAR to the sense amplifier SAL to perform the data access.

In the adjacent block (bank), a word line having the same memory cell connection pattern as the selected word line under accessing can be refreshed. After saving data to the sense amplifier, refresh is executed. In the case of performing the refresh in an adjacent memory block (adjacent bank memory array), the sense amplifier to be used for the refreshing is isolated from the memory block (bank memory array) being accessed. Consequently, the refresh can be performed in the adjacent memory block (bank memory array) through a similar control.

In the fourth embodiment, in the configuration of the refresh determining circuit shown in FIG. 24, the refresh inhibition signal RFGON is used as a flag indicative of saving of access data to the sense amplifier.

Figure 34:
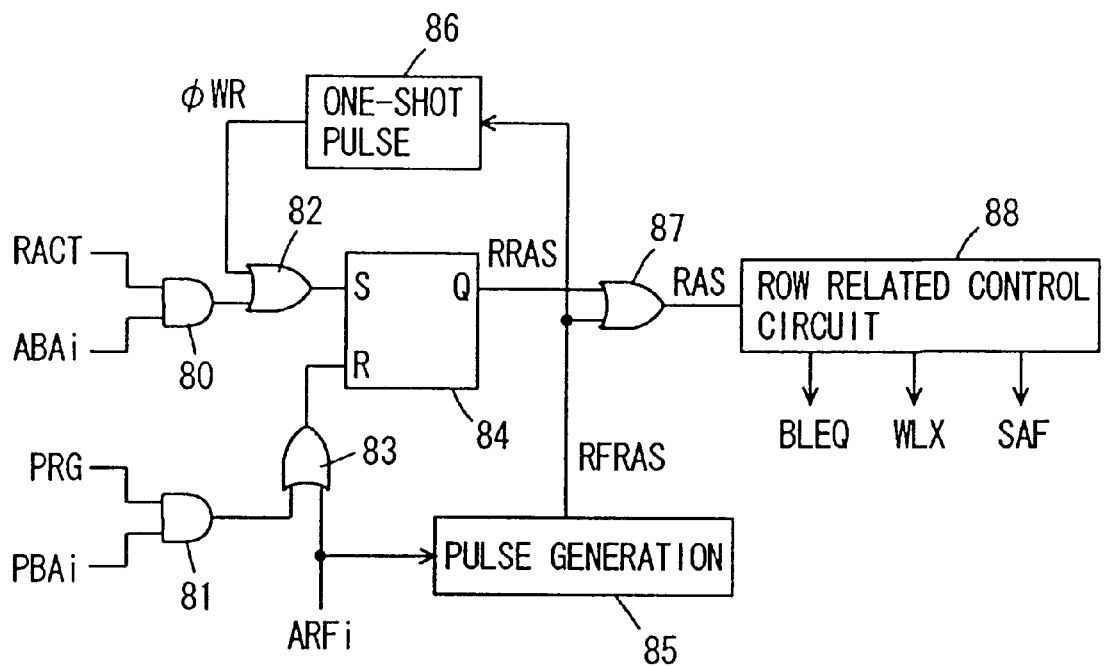
FIG. 34 is a diagram showing an example of the configuration of a control circuit related to selection of a row in the fourth embodiment of the present invention.

FIG. 34 is a diagram schematically showing the configuration of a row control unit in the bank control circuit in the fourth embodiment of the present invention. The configuration of the bank control circuit shown in FIG. 34 is the same as the bank control circuit shown in FIG. 25, except that a refresh instruction signal ARFi is used in place of the refresh execution permission signal RFGO. The other configuration is the same as that shown in FIG. 25 and the corresponding parts are designated by the same reference numerals. The refresh instruction signal ARFi is generated through ANDing of the auto refresh command ARF and the refresh bank address signal. When the auto refresh is instructed to a corresponding bank (memory block), the bank control circuit operates. When the refresh instruction signal ARFi is made active, the pulse generating circuit 85 generates a pulse signal RFRAS after elapse of a predetermined period (after elapse of the RAS precharge time and time required to save data). After completion of refresh, the write back instruction signal φWR is made active, and saved data is loaded in response to the write back instruction signal φWR.

In the configuration shown in FIG. 34, after data is saved according to the auto refresh instruction signal ARFi, an output signal of the OR circuit 83 is made active, and the operation of precharging the memory sub array (bank memory array) is executed.

Figure 35:
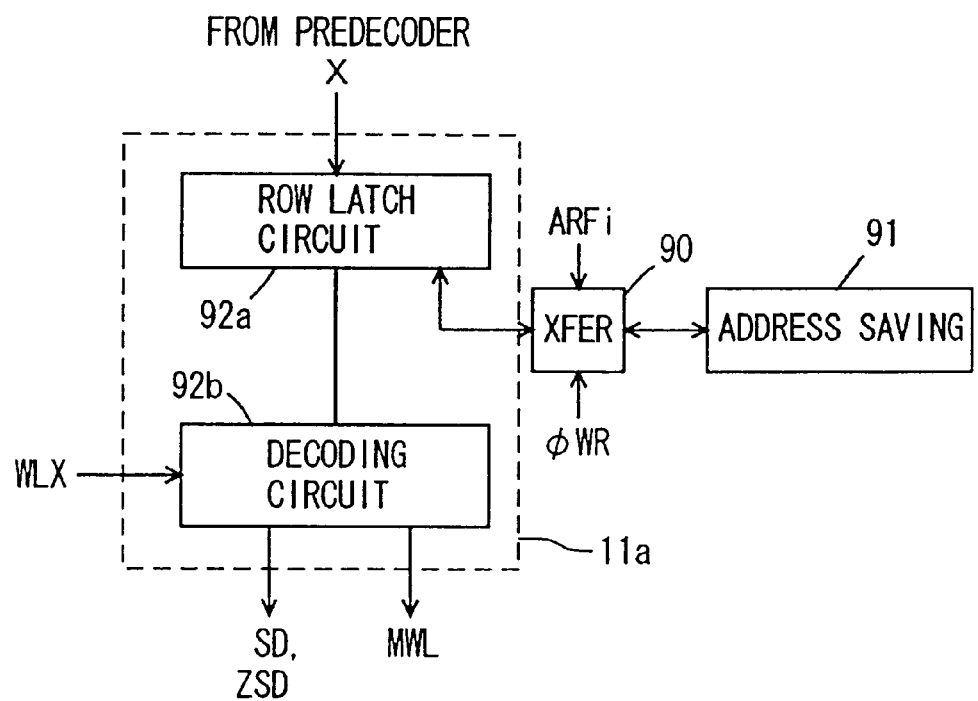
FIG. 35 is a diagram schematically showing the configuration of a portion related to a row decoding circuit in the fourth embodiment of the present invention.

FIG. 35 is a diagram schematically showing the configuration of a row selecting circuit in the fourth embodiment of the present invention. The configuration of the row selecting circuit shown in FIG. 35 is the same as that in FIG. 27, except that the auto refresh instruction signal ARFi is supplied in place of the refresh execution permission signal RFGO to the bidirectional transferring circuit (XFER) 90. The other configuration is the same, the corresponding parts are designated by the same reference numerals, and their detailed description will not be repeated.

In the fourth embodiment, when there is a possibility that refresh data and access data collides with each other on a bit line, the access data is saved in the sense amplifier. Consequently, irrespective of the address of a row to be refreshed, auto refresh is executed. When the auto refresh instruction signal ARFi is made active, therefore, the address of a word line being accessed is saved in the address saving circuit 91.

There is a case where refresh is executed in an adjacent block. As a transfer instruction signal (save instruction signal) to the bidirectional transferring circuit 90, an auto refresh command for the adjacent memory block is additionally supplied to the adjacent memory block (bank). When either of the transfer instruction signals is activated, an address is saved. When the refresh is not performed in a corresponding memory block (bank memory array), the row latch circuit 92a still latches the address of a word line to be activated. Particularly, even when the word line address is saved in the address saving circuit 91 in the operation of refreshing the adjacent block, no problem occurs.

Figure 36:
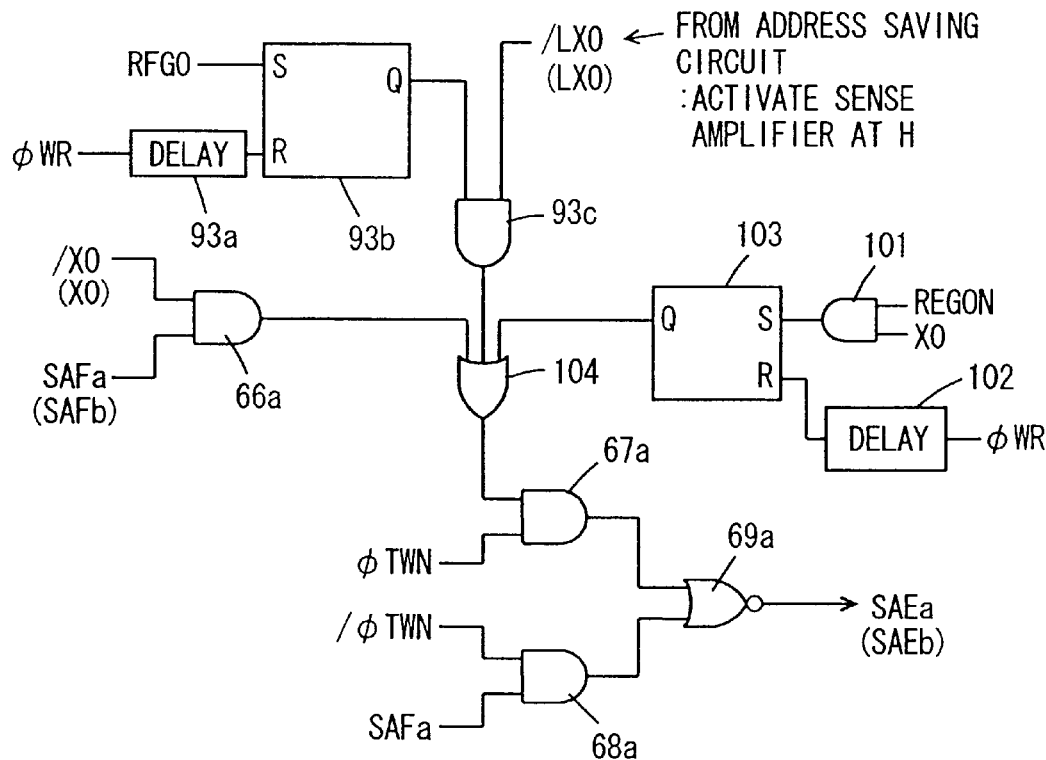
FIG. 36 is a diagram showing an example of the configuration of a sense amplifier control circuit in the fourth embodiment of the present invention.

FIG. 36 is a diagram showing the configuration of a sense amplifier control circuit in the fourth embodiment of the present invention. In FIG. 36, in addition to the configuration shown in FIG. 28, the following is provided; an AND circuit 101 for receiving the same row instruction signal RFGON and the predecoded signal X0; a delay circuit 102 for delaying the write back instruction signal φWR by a predetermined period; a set/reset flip flop 103 set in response to the rising edge of an output signal of the AND circuit 101 and reset in response to the rising edge of an output signal of the delay circuit 102; and an OR circuit 104 for receiving an output signal of the set/reset flip flop 103 and output signals of the AND circuits 93c and 66a. An output signal of the OR circuit 104 is supplied to the AND circuit 67a that receives the twin cell mode instruction signal φTWN at its first input node. The other configuration of the sense amplifier control circuit shown in FIG. 36 is the same as that shown in FIG. 28. The corresponding parts are designated by the same reference numerals and their detailed description will not be repeated.

In the configuration of the sense amplifier control circuit shown in FIG. 36, when the predecoded signal /X0 is at the H level, the corresponding sense amplifier activating signal SAEa is activated. In the case of the refreshing of the same row (having the same memory cell connection pattern), the same row instruction signal RFGON is activated. At this time, when the corresponding sense amplifier activating signal SAEa is inactive, the predecoded signal X0 is at the H level (since the complementary predecoded signal /X0 is at the L level), the output signal of the AND circuit 101 goes high, and the set/reset flip flop 103 is set. Accordingly, the sense amplifier activating signal SAEa in the inactive state is made active, and transfer data (saved data) is latched.

After completion of the write back operation, after elapse of the delay time of the delay circuit 102, the set/reset flip flop 103 is reset, and the sense amplifier activating signal SAEa is made inactive. The sense amplifier activate signal SAEa may be made inactive in response to a precharge command.

In the refreshing operation in the background, the sense amplifier activating signal SAEb is made active. Consequently, the least significant predecoded signal X0 of a refresh address is at the H level, the complementary predecoded signal /X0 and the latched predecoded signal /LX0 are at the L level, and the output signals of the AND circuits 93c and 66a are at the L level.

In the case where the corresponding sense amplifier activating signal SAEa latches the access data, the complementary predecoded signal /X0 is at the H level. In this case, even when the same row selection instruction signal RFGON is made active, an output signal of the AND circuit 101 is at the L level, and the set/reset flip flop 103 maintains the reset state. By using the configuration of the refresh control circuit in the third embodiment, according to the auto refresh instruction signal ARFi, the array activating signal (RAS) is made inactive, the sense amplifier enable fast signal SAFa is made inactive, and the sense amplifier activating signal SAEa is made inactive.

Subsequently, refresh is executed. In the refresh of the same row (having the same memory connection pattern), the signal RFGO is at the L level, and the set/reset flip flop 93b maintains the reset state. According to the refresh address signal, the predecoded signal /X0 goes high again, and the sense amplifier activating signal SAEa is made active according to the sense amplifier enable fast signal SAFa. As described above, after allowing the sense amplifier in an active state to return back to the precharged state once, the sense amplifier can be made active again for refresh.

Figure 37:
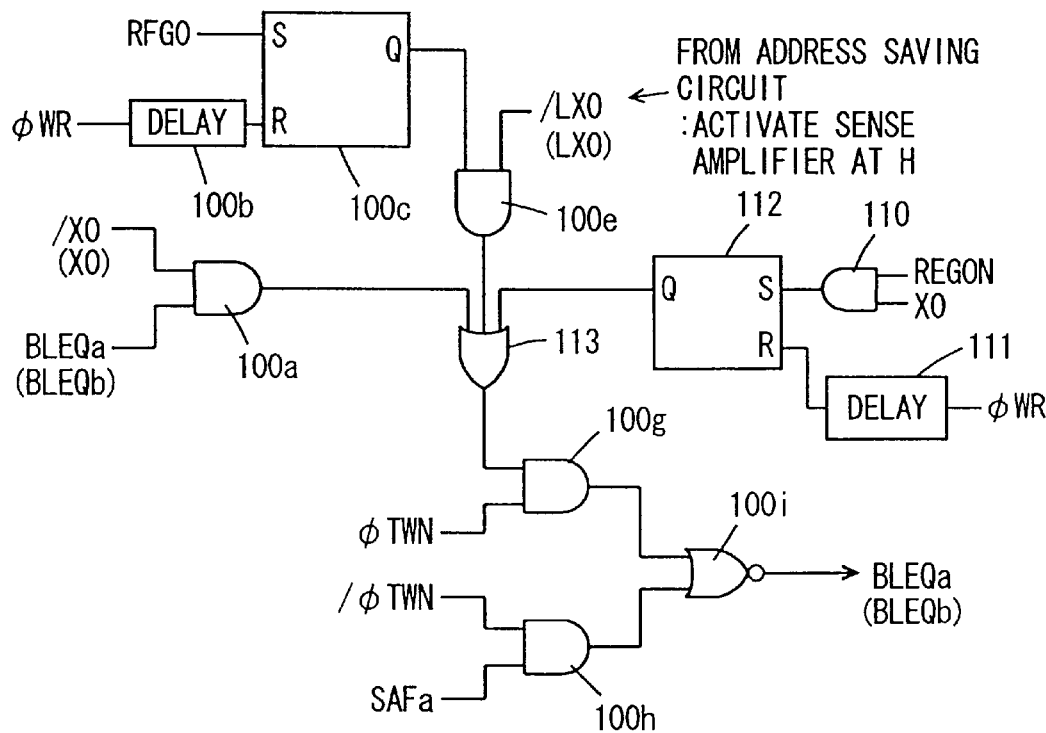
FIG. 37 is a diagram showing an example of the configuration of a bit line precharging/equalizing control circuit in the fourth embodiment of the present invention.

FIG. 37 is a diagram schematically showing the configuration of a bit line precharging/equalizing control circuit in the fourth embodiment of the present invention. The bit line precharging/equalizing control circuit shown in FIG. 37 includes, in addition to the configuration shown in FIG. 30; an AND circuit 110 for receiving the predecoded signal X0 and the same row instruction signal RFGON; a delay circuit 111 for delaying the write back instruction signal φWR; a set/reset flip flop 112 set in response to the rising edge of an output signal of the AND circuit 110 and reset in response to the activation of an output signal of the delay circuit 111; and an OR circuit 113 for receiving an output signal of the set/reset flip flop 112 and output signals of the AND circuits 100a and 100e. An output signal of the OR circuit 113 is supplied to a second input of the AND circuit 100g that receives the twin cell mode instruction signal φTWN at its first input. The other configuration is the same as that shown in FIG. 30, the corresponding parts are designated by the same reference numerals, and their detailed description will not be repeated.

The configuration of the bit line precharging/equalizing control circuit shown in FIG. 37 is equivalent to that of the sense amplifier control circuit shown in FIG. 36, except that the logic level of an output signal is inverted. When a corresponding sense amplifier is active, the bit line precharge/equalization instruction signal BLEQa is inactive. When the corresponding sense amplifier is inactive, the bit line precharge/equalization instruction signal BLEQa is active. Consequently, when the sense amplifier for latching saved data is made active, the bit line precharge/equalization instruction signal BLEQ (BLEQa, BLEQb) is accordingly made inactive and the precharging and equalizing operation of the sense nodes can be completed. The configuration shown in FIG. 37 can be applied when the bit line precharging/equalizing circuit is disposed in a sense amplifier band. When the bit line precharging/equalizing circuit is provided in each bit line pair, it is sufficient to precharge and equalize a bit line in accordance with the array activating signal RAS and the memory block designation signal (bank selection signal).

Figure 38:
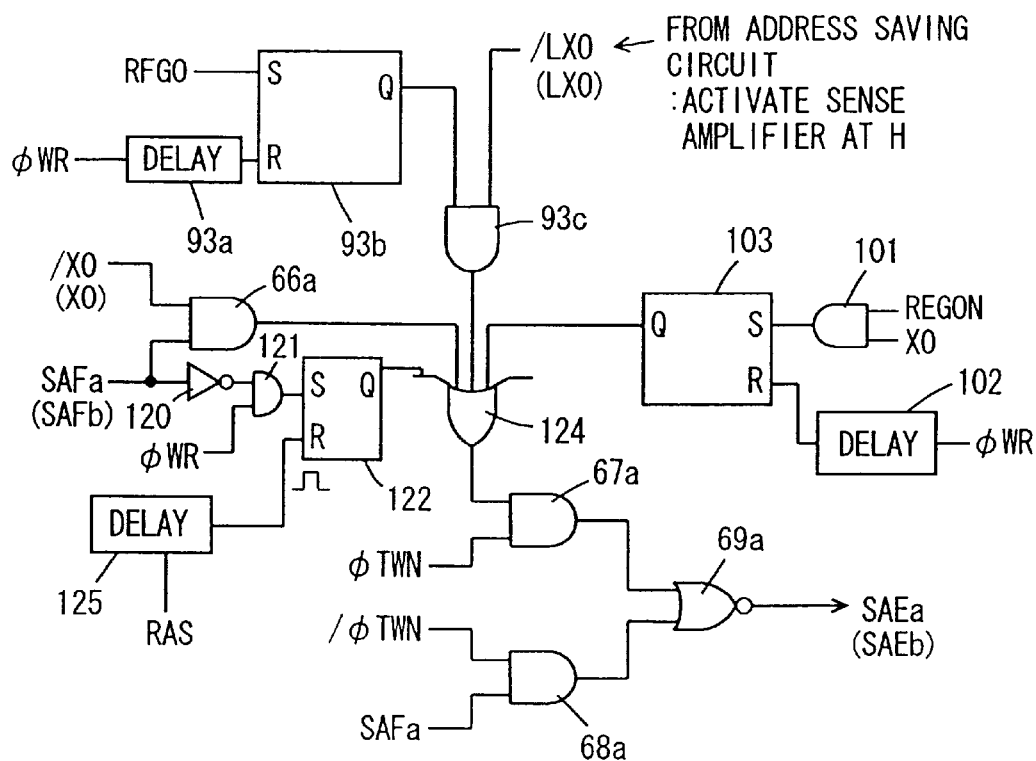
FIG. 38 is a diagram schematically showing the configuration of a sense amplifier control circuit in the fourth embodiment of the present invention.

FIG. 38 is a diagram showing a modification of the sense amplifier control circuit. In addition to the configuration shown in FIG. 36, a sense amplifier control circuit shown in FIG. 38 includes: an inverter 120 for receiving a sense amplifier enable fast signal SAFa; an AND circuit 121 for receiving the write back instruction signal φWR and an output signal of the inverter 120; a delay circuit 125 for delaying the array activating signal RAS by a predetermined time; a set/reset flip flop 122 set in response to a rising edge of an output signal of the AND circuit 121 and reset in response to the rising edge of an output signal of the delay circuit 125; and an OR circuit 124 for receiving an output signal of the set/reset flip flop 122, an output signal of the AND circuit 66a, an output signal of the AND circuit 93c, and an output signal of the set/reset flip flop 103.

An output signal of the OR circuit 124 is supplied to a second input of the AND circuit 67a that receives the twin cell mode instruction signal φTWN at its first input. The other configuration is the same as that shown in FIG. 36. The corresponding parts are designated by the same reference numerals and their detailed description will not be repeated.

In the configuration of the sense amplifier control circuit shown in FIG. 38, in the write back operation, the sense amplifier in the inactive state is made active in response to the write back instruction signal φWR. That is, when the sense amplifier used for refreshing becomes inactive, after elapse of a predetermined time, the write back instruction signal φWR is made active. Accordingly, the set/reset flip flop 122 is set, a signal of the output Q of the set/reset flip flop 122 goes high, and the sense amplifier activating signal SAEa (or SAEb) is made active.

Subsequently, when the array activating signal RAS goes high, an output signal of the delay circuit 125 goes high. The delay time of the delay circuit 125 is longer than time of a period since the array activating signal RAS is made active until the sense amplifier enable fast signal SAFa is made active. After the sense amplifier enable fast signal SAFa is made active and the output signal of the AND circuit 66a goes high, the set/reset flip flop 122 is reset. In the write back operation, therefore, after completion of the auto refresh operation, the sense amplifier used for refresh can be driven to an active state for latching transfer data before the original row under access is driven to a selected state.

In the case of the configuration using the sense amplifier control circuit shown in FIG. 38, the configuration of the bit line precharging/equalizing control circuit shown in FIG. 37 is accordingly changed. An output signal of the set/reset flip flop 122 is supplied to the OR circuit in FIG. 37. By appropriately adjusting the delay time of the delay circuit 125, the bit line precharge/equalization instruction signal BLEQ can be made inactive in transferring latched data (for write back).

Figure 39:
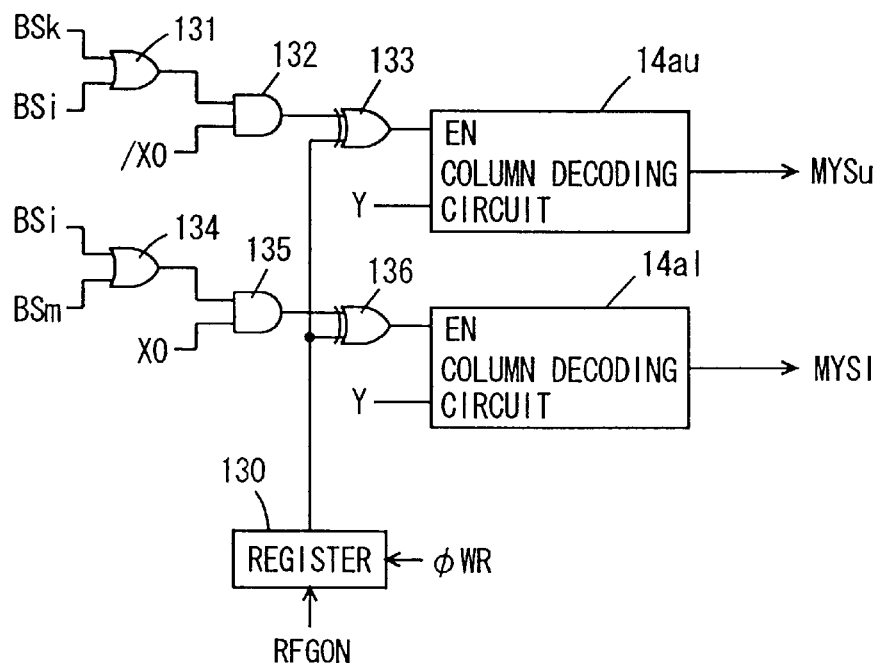
FIG. 39 is a diagram showing an example of the configuration of a control unit of a column decoding circuit in the fourth embodiment of the present invention.

FIG. 39 is a diagram showing an example of the configuration of a column selection control circuit. For each memory block (bank memory array), an upper column decoding circuit 14au and a lower column decoding circuit 14al are provided. In correspondence to the upper and lower sense amplifier bands, the column decoding circuit 14au generates an upper main column select signal MISu, and the column decode circuit 14*al* generates a lower main column select signal MISl. Each of the column decoding circuits 14*al* and 14*au* includes a read column decoder for selecting a column in data reading and a write column decoder for selecting a column in data writing. In FIG. 39, the decoders are shown as a decoding circuit.

The column decoding circuit 14*au* is provided with: an OR circuit 131 for receiving block selection signals BSk and BSi; an AND circuit 132 for receiving an output signal of the OR circuit 131 and the predecoded signal /X0; and an EXOR circuit 133 for receiving the same row instruction signal RFGON from a register 130. An output signal of the EXOR circuit 133 is supplied to an enable input EN of the column decoding circuit 14*au*. The block selection signal BSk designates an adjacent memory block (bank) on the upper side of the corresponding memory block (bank) designated by the block selection signal BSi. They are generated according to the read or write bank address signal. It is now assumed that when the predecoded signal X0 is at the H level, the upper sense amplifier band is made active to latch access data.

The column decoding circuit 14*al* is provided with: an OR circuit 134 for receiving block selection signals BSi and BSm; an AND circuit 135 for receiving an output signal of the OR circuit 134 and the predecoded signal X0; and an EXOR circuit 136 for receiving an output signal of the AND circuit 135 and an output signal of the register 130. An output signal of the EXOR circuit 136 is supplied to an enable input EN of the column decoding circuit 14*al*. The block selection signal BSm specifies an adjacent memory block (bank) on the lower side of the corresponding memory block (bank) designated by the block selection signal BSi. The block selection signal BSm is generated according to the read or write bank address signal.

In the case of refreshing a row having the same memory connection pattern, the same row instruction signal RFGON goes high, and the signal of the H level is stored in the register 130. When the signal stored in the register 130 goes high, the EXOR circuits 133 and 136 operate as an inverter, one of the column decoding circuits 14*au* and 14*al*, which is in an active state, becomes inactive, and the other inactive column decoding circuit is made active. The column decoding circuits 14*au* and 14*al* decode a supplied column address signal Y when made active. When the read/write column select gates in the upper sense amplifier band are selected and data access is performed, after data is saved, according to a signal (flag) stored in the register 130, column selection is performed in the lower sense amplifier band.

After completion of the write back, the signal (flag) stored in the register 130 is reset to the L level in response to the write back instruction signal φWR, and the EXOR circuits 133 and 136 operate as a buffer circuit. According to output signals of the AND circuits 132 and 135, the column decoding circuits 14*au* and 14*al* are made active or inactive, and column access is performed.

Figure 40:
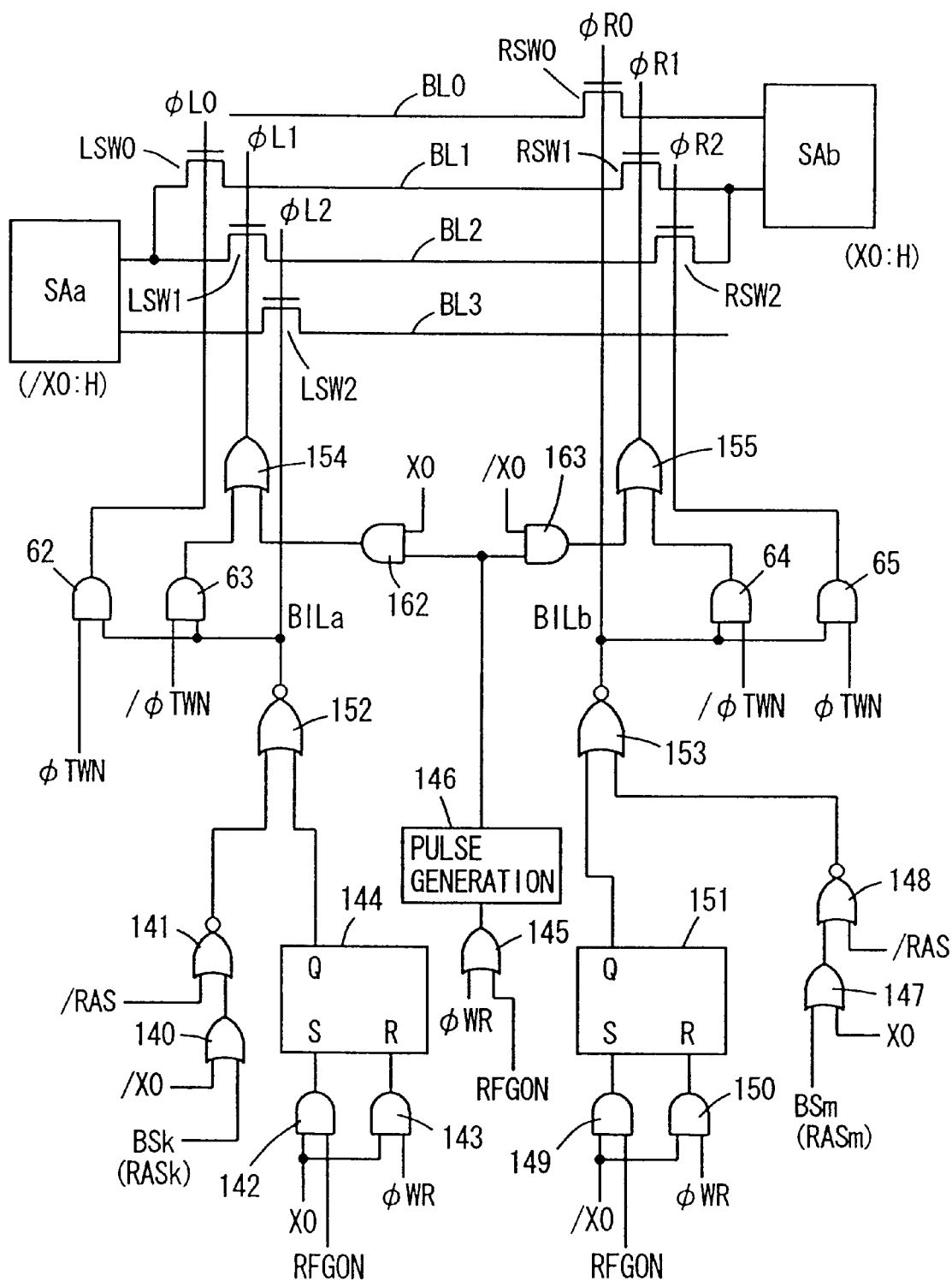
FIG. 40 is a diagram showing an example of the configuration of a bit line isolation control circuit in the fourth embodiment of the present invention.

FIG. 40 is a diagram schematically showing an example of the configuration of a switch control circuit for bit line connection. The switch control circuit shown in FIG. 40 corresponds to the mode setting circuit 27 shown in FIG. 1. In FIG. 40, the sense amplifier SAa is made active when the predecoded signal /X0 is at the H level, and the sense amplifier SAb is made active when the predecoded signal X0 is at the H level.

In FIG. 40, the switch control circuit includes: an NOR circuit 140 for receiving the predecoded signal X0 and the twin cell mode instruction signal /φTWN; an NOR circuit 141 for receiving an output signal of the NOR circuit 140 and the complementary array activating signal /RAS; an AND circuit 142 for receiving the predecoded signal X0 and the same row instruction signal RFGON; an AND circuit 143 for receiving the predecoded signal X0 and the write back instruction signal φWR; a set/reset flip flop 144 set in response to the rising edge of an output signal of the AND circuit 142 and reset in response to the rising edge of an output signal of the AND circuit 143; and an NOR circuit 152 for receiving an output signal of the NOR circuit 141, a signal from the output Q of the set/reset flip flop 144, and an adjacent block (bank) selection signal BSk. An output signal of the NOR circuit 152 is supplied as the bit line isolation control signal BILa to the first input of each of the AND circuits 65*a* and 65*b*, and is supplied as an isolation control signal φL2 to the switch circuit LSW2.

The switch control circuit further includes: an NOR circuit 147 for receiving the predecoded signal /X0 and the twin cell mode instruction signal /φTWN; an NOR circuit 148 for receiving an output signal of the NOR circuit 147 and the complementary array activate signal /RAS; an AND circuit 149 for receiving the predecoded signal /X0 and the same row instruction signal RFGON; an AND circuit 150 for receiving the predecoded signal /X0 and the write back instruction signal φWR; a set/reset flip flop 151 which is set in response to the leading edge of an output signal of the AND circuit 149 and is reset in response to the leading edge of an output signal of the AND circuit 150; and an NOR circuit 153 for receiving a neighboring block selection signal (bank selection signal) BSm (or array activate signal RASm), a signal from the output terminal Q of the set/reset flip flop 151, and an output signal of the NOR circuit 148. An output signal of the NOR circuit 153 is supplied as the bit line isolation control signal BILb to the first input terminal of each of the AND circuits 65*c* and 65*d*, and is supplied as an isolation control signal φR0 to the switch circuit RSW0.

The switch control circuit further includes: an OR circuit 145 for receiving the write back instruction signal φWR and the same row instruction signal RFGON; a pulse generating circuit 146 for generating a one-shot pulse signal in response to the rising edge of an output signal of the OR circuit 145; an AND circuit 162 for receiving an output signal of the pulse generating circuit 146 and the predecoded signal X0; an AND circuit 163 for receiving an output signal of the pulse generating circuit 146 and the predecoded signal /X0; an OR circuit 154 for receiving output signals of the AND circuits 65*b* and 162 and generating an isolation control signal φL1; and an OR circuit 155 for receiving output signals of the AND circuits 65*c* and 163 and generating an isolation control signal φR1.

An isolation control signal φL0 is generated from the AND circuit 65*a*, and an isolation control signal φR2 is generated from the AND circuit 65*d*. The isolation control signals φL0 to φL2 control the conduction (conductive or nonconductive state) of the switch circuits LSW0 to LSW2, respectively. The isolation control signals φR0 to φR2 control the conduction (conductive or nonconductive state) of the switch circuits RSW0 to RSW2, respectively. The operation of the control circuit shown in FIG. 40 will be briefly described below. In the following description, it is assumed, for better understanding, that both of the adjacent block selection signals BSk and BSm are at the L level in the non-selected state.

In a standby cycle, the array activating signal /RAS is at the H level, and output signals of the NOR circuits 141 and 148 are at the L level. The set/reset flip flop 144 is in the reset state, and its output signal is at the L level. Output signals of the NOR circuits 152 and 153 are therefore at the H level. According to the operation mode, one of the switch circuits LSW0 and LSW1 is turned on, one of the switch circuits RSW1 and RSW2 is turned on, and the switch circuits LSW2 and RSW0 are in the ON state.

In a normal data access operation in the twin cell mode, the twin cell mode instruction signal /φTWN is set to the L level. The NOR circuits 140 and 147 therefore operate as an inverter. When the predecoded signal X0 is at the H level, the complementary predecoded signal /X0 is at the L level, and the NOR circuits 140 and 147 output signals of the L level and the H level, respectively. When the array activating signal /RAS goes low from the H level to the L level, the status of each of the predecoded signal X0 and /X0 is decided, and an output signal of the NOR circuit 141 goes high. Since the adjacent block selection signal BSk is at the L level, the isolation control signal BILa from the NOR circuit 152 goes low. All of the isolation control signals φL0 to φL2 go low, so that the sense amplifier SAa is isolated from the bit lines BL1 to BL3.

On the other hand, the predecoded signal X0 is at the H level, and an output signal of the NOR circuit 147 is at the H level. Even when the array activating signal /RAS goes low, an output signal of the NOR circuit 148 maintains the L level. Since the adjacent block selection signal BSm is therefore at the L level in the inactive state and the set/reset flip flop 151 is in the reset state, the isolation control signal BILb from the NOR circuit 153 maintains the H level. According to the twin cell mode instruction signal φTWN and the complementary twin cell mode instruction signal /φTWN, the isolation control signal φR1 goes low and the isolation control signal φR2 goes high since the twin cell mode is set.

When the same row instruction signal RFGON goes high in such a state, since the predecoded signal X0 is at the H level, an output signal of the AND circuit 142 goes high, the set/reset flip flop 144 is set, an output signal of the set/reset flip flop 144 goes high, and the output signal BILa of the NOR circuit 152 accordingly maintains the L level.

At this time, an output signal of the OR circuit 145 goes high in response to the same row instruction signal RFGON, the pulse generating circuit 146 generates a one-shot pulse signal, and output signals of the AND circuit 162 and the OR circuit 154 accordingly go high. The isolation control signal φL2 goes high, the switch circuit LSW1 is made conductive, and latched data is transferred from the sense amplifier SAb to the sense amplifier SAa via the bit line BL2. As described above, the transferred data is latched by the sense amplifier SAa when the sense amplifier SAa is activated. After completion of the data transfer, an output signal of the pulse generating circuit 146 attains the L level, and the switch circuits LSW0 to LSW2 enter the off state in accordance with the isolation control signal BILa.

On the other hand, the set/reset flip flop 151 maintains the reset state, and the output signal of the NOR circuit 148 is at the L level, so that the isolation control signal BILb from the NOR circuit 153 maintains the H level.

Since the set/reset flip flop 144 returns to the reset state once for the refreshing operation, even when the array activating signal /RAS is kept at the H level, the set/reset flip flop 144 is in the set state, the output signal BILa of the NOR circuit 152 maintains the L level, all of the isolation control signals φL0 to φL2 maintain the L level, the switch circuits LSW0 to LSW2 maintain the off state, and the sense amplifier SAa maintains the latching state.

On the other hand, upon resetting, since the array activating signal /RAS goes high, the output signal of the NOR circuit 148 maintains the L level, the isolation control signal BILb maintains the H level, and the sense amplifier SAb is connected to the bit lines BL0 and BL2 in the twin cell mode. In such a state, the bit lines are precharged and equalized.

When the refreshing operation is performed, a word line having the same memory connection pattern is refreshed. Consequently, the predecoded signal X0 is at the H level, and the predecoded signal /X0 is at the L level. Even when the array activating signal /RAS goes low, due to the H level of the output signal of the NOR circuit 147, the isolation control signal BILb maintains the H level. On the other hand, the set/reset flip flop 144 is in the set state, so that the isolation control signal BILa maintains the L level.

After completion of the refreshing operation, the write back instruction signal φWR is activated, the pulse generating circuit 146 generates a one-shot pulse signal responsively, the transfer control signal φL1 is accordingly set to the H level for a predetermined period, and the sense amplifier SAa is connected to the bit line BL2. Since the predecoded signal /X0 is at the L level, an output signal of the AND circuit 163 maintains the L level, and the isolation control signal φR1 maintains the L level. The sense amplifier SAb receives the latched data from the sense amplifier SAa via the switch circuits LSW2 and RSW2.

Subsequently, the sense amplifier SAb is made active again, and the original word line is driven to the selected state. By the series of these operations, the write back control can be implemented. The data transfer from the sense amplifier SAa to the sense amplifier SAb is carried out as in the above description of the operations. That is, the predecoded signal X0 is set to the L level, the set/reset flip flop 144 is reset, and the set/reset flip flop 151 is set.

In refreshing a word line having a different memory cell connection pattern, an unused sense amplifier is isolated from the corresponding bit line in accordance with the array activating signal /RAS and the predecoded signal X0. In the state where the sense amplifier for data accessing is isolated from the corresponding bit line, the refresh is performed. After completion of the refresh, according to the array activating signal /RAS and the predecoded signals X0 and /X0, the sense amplifier for data accessing is connected to the bit line.

After completion of the refresh, in response to the write back instruction signal, a one-shot pulse signal is generated from the pulse generating circuit 146, so that there is a possibility that data collision occurs. In order to prevent this collision, it is sufficient to supply, to the OR circuit 145, an ANDed signal of the write back instruction signal φWR and the refresh execution permission signal RFGO, in place of the write back instruction signal φWR. In refreshing a row of a different memory cell connection pattern, by inhibiting the write back transfer, such data collision can be prevented.

When the adjacent block is refreshed in the twin cell mode, the connection between a sense amplifier and a bit line is controlled according to the block selection signals BSk and BSm. For example, when the adjacent memory block (bank memory array) is refreshed by using the sense amplifier SAb while the sense amplifier SAa is used for accessing data, the sense amplifier SAb is isolated from the bit lines BL0 to BL3. The isolation control signals BILa and BILb are selectively made inactive by the block selection signals BSk ad BSm applied to the NOR circuits 152 and 153.

In the case of refreshing a word line having the same memory cell connection pattern, after the operation of saving memory cell data, the adjacent memory block is refreshed. In the case of refreshing a word line having a different memory connection pattern, the sense amplifier for refresh in the inactive state is isolated from the bit lines, and the adjacent memory block is refreshed using the sense amplifier for refresh.

In the single cell mode, the twin cell mode instruction signal /φTWN is at the H level, and the output signals of the NOR circuits 140 and 147 are fixed at the L level. According to the array activating signal /RAS, therefore, the isolation control signals BILa and BILb are made active or inactive.

As described above, according to the fourth embodiment of the invention, in the case of refreshing a word line having the same memory connection pattern as that of a word line being accessed, data is once saved in the sense amplifier in an inactive state. Consequently, a column can be accessed without waiting due to auto refresh, and a high speed access processing system can be configured. In this case, the number of sense amplifiers simultaneously operate is the half of the total number. Thus, a peak current of the sense amplifiers can be reduced, and the current consumption can be reduced.

Modifications

In the above embodiments, a DRAM merged with a logic has been described. In a standard DRAM as well, similar effects can be obtained by providing one sense amplifier for each of two trios each consisting of three bit lines with respect to each quartet of bit lines (a set of four bit lines) and by selectively connecting two bit lines out of each of the trios of bit lines.

In addition, in applying an active command for instructing a data access to an adjacent bank in place of the auto refresh command, by performing a similar saving operation, a row can be accessed also in a bank sharing the sense amplifier band. By selectively driving two word lines in adjacent banks, columns can be sequentially accessed.

As described above, according to the present invention, the connection between a bit line and a first sense amplifier is switched according an operation mode instruction signal. The sense amplifiers can be efficiently used according to an operation mode, and the current consumption can be reduced without deteriorating access efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:

a plurality of memory cells arranged in rows and columns;

a plurality of sense amplifiers, arranged corresponding to the columns of the memory cells, each for sensing and amplifying data received from corresponding memory cells;

a plurality of bit lines, arranged corresponding to the respective columns of the memory cells, each connecting to the memory cells arranged on a corresponding column, the bit lines being arranged such that a pair of bit lines are coupled to each respective sense amplifier and a bit line of another pair of bit lines is arranged between the bit line of the pair; and a plurality of word lines arranged corresponding to the rows of the memory cells and each connecting to the memory cells on a corresponding row, the memory cells being arranged such that memory cells connecting to bit lines in a pair are connected to a common word line and data of memory cells are read out concurrently onto the bit lines in the pair when a word line is selected.

2. The semiconductor memory device according to claim 1, further comprising:

a plurality of switching elements arranged for the plurality of bit lines, each for coupling a corresponding sense amplifier with a corresponding bit line when made conductive; and connection control circuitry for making the switching elements conductive in response to an operation mode instruction signal.

* * * * *